(12) United States Patent
Hirakata

(10) Patent No.: US 10,978,489 B2
(45) Date of Patent: Apr. 13, 2021

(54) SEMICONDUCTOR DEVICE, DISPLAY PANEL, METHOD FOR MANUFACTURING SEMICONDUCTOR DEVICE, METHOD FOR MANUFACTURING DISPLAY PANEL, AND INFORMATION PROCESSING DEVICE

(71) Applicant: Semiconductor Energy Laboratory Co., Ltd., Atsugi (JP)

(72) Inventor: Yoshiharu Hirakata, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 36 days.

(21) Appl. No.: 15/211,068

(22) Filed: Jul. 15, 2016

(65) Prior Publication Data

US 2017/0025444 A1    Jan. 26, 2017

(30) Foreign Application Priority Data

Jul. 24, 2015  (JP) .............................. JP2015-146316
Jan. 26, 2016  (JP) .............................. JP2016-012007

(51) Int. Cl.
*H01L 27/12* (2006.01)
*H01L 27/32* (2006.01)
(Continued)

(52) U.S. Cl.
CPC ........ *H01L 27/1225* (2013.01); *G06F 1/1643* (2013.01); *H01L 27/1244* (2013.01);
(Continued)

(58) Field of Classification Search
CPC ......... G09G 3/2096; G02F 1/1345; H01J 1/62
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    001495523 A    5/2004
EP       1655633 A    5/2006
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — William Lu
(74) *Attorney, Agent, or Firm* — Fish & Richardson P.C.

(57) ABSTRACT

To provide a novel semiconductor device that is highly convenient or reliable, a novel display panel that is highly convenient or reliable, or a method for manufacturing a novel semiconductor device that is highly convenient or reliable. The semiconductor device includes an insulating film having an opening, a first connection portion penetrating the opening, a terminal that is in contact with one surface of the insulating film and is electrically connected to the first connection portion, and a circuit that is electrically connected to the first connection portion on the opposite surface of the insulating film. The terminal has a region embedded in the insulating film and a region not covered with the insulating film. The circuit includes a semiconductor element.

6 Claims, 29 Drawing Sheets

(51) Int. Cl.
  *H04B 1/3827* (2015.01)
  *G06F 1/16* (2006.01)
(52) U.S. Cl.
  CPC ...... *H01L 27/1255* (2013.01); *H01L 27/1262*
    (2013.01); *H01L 27/323* (2013.01); *H04B*
    *1/3833* (2013.01); *H01L 27/3262* (2013.01);
    *H01L 2227/323* (2013.01); *H01L 2251/5338*
    (2013.01)

(56) References Cited

U.S. PATENT DOCUMENTS

| | | | |
|---|---|---|---|
| 5,821,597 | A | 10/1998 | Nakajima et al. |
| 6,294,274 | B1 | 9/2001 | Kawazoe et al. |
| 6,331,722 | B1 | 12/2001 | Yamazaki et al. |
| 6,563,174 | B2 | 5/2003 | Kawasaki et al. |
| 6,714,268 | B2 | 3/2004 | Wang et al. |
| 6,727,522 | B1 | 4/2004 | Kawasaki et al. |
| 7,038,641 | B2 | 5/2006 | Hirota et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,084,936 | B2 | 8/2006 | Kato |
| 7,102,704 | B2 | 9/2006 | Mitsui et al. |
| 7,105,868 | B2 | 9/2006 | Nause et al. |
| 7,176,991 | B2 | 2/2007 | Mitsui et al. |
| 7,211,825 | B2 | 5/2007 | Shih et al. |
| 7,239,361 | B2 | 7/2007 | Kato |
| 7,248,235 | B2 | 7/2007 | Fujii et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,385,654 | B2 | 6/2008 | Mitsui et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,485,511 | B2 | 2/2009 | Yamada et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,814,786 | B2* | 10/2010 | Woodard ........... G01R 33/1223 73/291 |
| 7,863,188 | B2 | 1/2011 | Tsurume et al. |
| 7,915,098 | B2* | 3/2011 | Nishimura ........... H01L 51/5253 438/149 |
| 8,138,502 | B2 | 3/2012 | Nakamura et al. |
| 8,222,666 | B2 | 7/2012 | Hatano et al. |
| 8,264,144 | B2 | 9/2012 | Oikawa et al. |
| 8,450,769 | B2 | 5/2013 | Hatano et al. |
| 8,610,155 | B2 | 12/2013 | Hatano et al. |
| 8,766,314 | B2 | 7/2014 | Hatano et al. |
| 8,912,040 | B2* | 12/2014 | Suzawa ............ H01L 29/78696 438/104 |
| 8,970,520 | B2 | 3/2015 | Teraguchi et al. |
| 8,988,403 | B2* | 3/2015 | Choi ................ H01L 33/62 345/204 |
| 9,257,449 | B2 | 2/2016 | Yamazaki et al. |
| 9,337,244 | B2 | 5/2016 | Hatano et al. |
| 9,337,344 | B2 | 5/2016 | Hanaoka |
| 9,356,054 | B2 | 5/2016 | Miyairi et al. |
| 9,425,371 | B2 | 8/2016 | Hatano et al. |
| 9,690,150 | B2* | 6/2017 | Ueno ................ G02F 1/13452 |
| 9,799,716 | B2 | 10/2017 | Hatano et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0146893 | A1* | 10/2002 | Shimoda .......... G02F 1/13454 438/458 |
| 2003/0027369 | A1* | 2/2003 | Yamazaki ............. H01L 51/003 438/21 |
| 2003/0047280 | A1* | 3/2003 | Takayama ............ B32B 7/06 156/708 |
| 2003/0057422 | A1* | 3/2003 | Yamazaki ........... H01L 21/6835 257/79 |
| 2003/0062519 | A1* | 4/2003 | Yamazaki ........... H01L 51/5253 257/40 |
| 2003/0082859 | A1* | 5/2003 | Ichijo .............. H01L 21/0237 438/166 |
| 2003/0189401 | A1 | 10/2003 | Kido et al. |
| 2003/0201960 | A1 | 10/2003 | Fujieda |
| 2003/0218222 | A1 | 11/2003 | Wager, III et al. |
| 2004/0038446 | A1 | 2/2004 | Takeda et al. |
| 2004/0046909 | A1* | 3/2004 | Sekiguchi ........... G02F 1/1345 349/113 |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0072047 | A1 | 4/2006 | Sekiguchi |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0180618 | A1 | 7/2008 | Fujieda |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0115942 | A1* | 5/2009 | Watanabe ......... G02F 1/133305 349/96 |
| 2009/0134399 | A1 | 5/2009 | Sakakura et al. |
| 2009/0152506 | A1 | 6/2009 | Umeda et al. |

(56) References Cited

U.S. PATENT DOCUMENTS

| | | | |
|---|---|---|---|
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0171905 A1 | 7/2010 | Huang et al. | |
| 2011/0171764 A1* | 7/2011 | Toonen | B82Y 20/00 438/29 |
| 2011/0199564 A1* | 8/2011 | Moriwaki | G02F 1/136227 349/122 |
| 2011/0234964 A1* | 9/2011 | Moriwaki | G02F 1/13452 349/149 |
| 2012/0161125 A1* | 6/2012 | Yamazaki | H01L 29/78693 257/43 |
| 2012/0175608 A1* | 7/2012 | Yamazaki | H01L 27/1214 257/43 |
| 2013/0134422 A1* | 5/2013 | Tsubuku | H01L 29/42384 257/57 |
| 2013/0181268 A1* | 7/2013 | Hirota | H01L 31/1864 257/291 |
| 2013/0300456 A1* | 11/2013 | Lennon | H03K 19/094 326/102 |
| 2014/0065430 A1* | 3/2014 | Yamazaki | H01L 27/1214 428/426 |
| 2014/0132643 A1* | 5/2014 | Yamazaki | G09G 3/20 345/690 |
| 2014/0179110 A1* | 6/2014 | Park | H01L 21/02046 438/715 |
| 2014/0325249 A1 | 10/2014 | Toyotaka | |
| 2014/0326992 A1 | 11/2014 | Hondo et al. | |
| 2015/0021597 A1* | 1/2015 | Lu | C08G 65/48 257/43 |
| 2015/0103023 A1 | 4/2015 | Iwaki | |
| 2015/0137098 A1* | 5/2015 | Tanaka | H01L 27/3276 257/40 |
| 2015/0154730 A1* | 6/2015 | Hirakata | G06T 1/20 345/520 |
| 2015/0187814 A1 | 7/2015 | Miyairi et al. | |
| 2015/0214256 A1 | 7/2015 | Miyairi | |
| 2015/0270288 A1 | 9/2015 | Yamazaki et al. | |
| 2015/0303392 A1 | 10/2015 | Ohsawa et al. | |
| 2015/0309637 A1 | 10/2015 | Sakuishi et al. | |
| 2015/0317015 A1* | 11/2015 | Eguchi | G06F 3/044 345/174 |
| 2015/0348909 A1 | 12/2015 | Yamazaki et al. | |
| 2015/0355710 A1* | 12/2015 | Modarres | G09G 5/003 345/173 |
| 2016/0013442 A1* | 1/2016 | Akimoto | H01L 51/003 257/59 |
| 2016/0056410 A1* | 2/2016 | Yanagisawa | H01L 51/5246 257/43 |
| 2016/0070314 A1* | 3/2016 | Takahashi | G09G 5/003 361/679.21 |
| 2016/0109998 A1* | 4/2016 | Watanabe | G06F 3/0412 349/12 |
| 2016/0179229 A1* | 6/2016 | Ahn | G06F 3/041 345/173 |
| 2016/0179259 A1 | 6/2016 | Watanabe et al. | |
| 2016/0195983 A1 | 7/2016 | Miyake | |
| 2016/0240685 A1 | 8/2016 | Tanaka | |
| 2016/0299387 A1* | 10/2016 | Yamazaki | H01L 27/3232 |
| 2018/0138257 A1* | 5/2018 | Higano | H01L 51/0024 |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-125931 A | 5/1998 |
| JP | 11-505377 | 5/1999 |
| JP | 11-212116 A | 8/1999 |
| JP | 2000-044236 A | 2/2000 |
| JP | 2000-150900 A | 5/2000 |
| JP | 2001-066593 A | 3/2001 |
| JP | 2002-076356 A | 3/2002 |
| JP | 2002-196702 A | 7/2002 |
| JP | 2002-289859 A | 10/2002 |
| JP | 2002-328630 A | 11/2002 |
| JP | 2003-076302 A | 3/2003 |
| JP | 2003-086000 A | 3/2003 |
| JP | 2003-086808 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-103957 A | 4/2004 |
| JP | 2004-273614 A | 9/2004 |
| JP | 2004-273732 A | 9/2004 |
| JP | 2004-296162 A | 10/2004 |
| JP | 2007-232882 A | 9/2007 |
| JP | 4161574 B2 | 10/2008 |
| JP | 2010-165673 A | 7/2010 |
| JP | 2010-206040 A | 9/2010 |
| JP | 2012-190794 A | 10/2012 |
| JP | 2012-212076 A | 11/2012 |
| JP | 2013-221965 A | 10/2013 |
| JP | 2014-071734 A | 4/2014 |
| JP | 2015-082178 A | 4/2015 |
| JP | 2015-125563 A | 7/2015 |
| JP | 2015-129917 A | 7/2015 |
| KR | 2015-0063937 A | 6/2015 |
| TW | 201520873 | 6/2015 |
| WO | WO-2004-053819 A | 6/2004 |
| WO | WO-2004/114391 | 12/2004 |
| WO | WO-2010/071089 | 6/2010 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. ( Applied Physics Letters ) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. ( Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. ( Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. ( Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. ( Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m < 4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. ( Applied Physics Letters ) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. ( Applied Physics Letters ) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. ( Applied Physics Letters ) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Phys. Lett. ( Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2016/054276) dated Nov. 8, 2016.

Written Opinion (Application No. PCT/IB2016/054276) dated Nov. 8, 2016.

Taiwanese Office Action (Application No. 105123284) dated Sep. 17, 2020.

\* cited by examiner

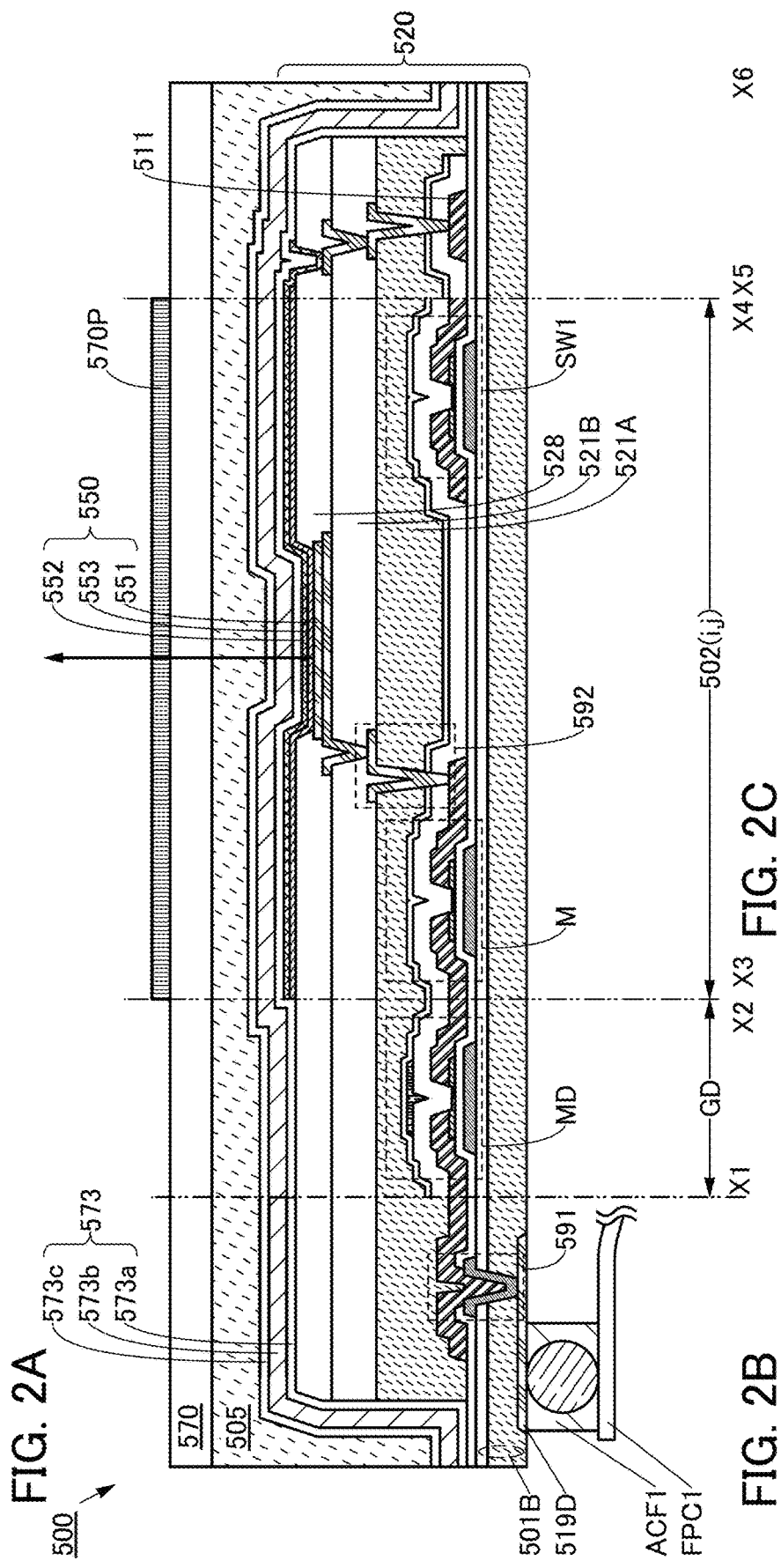

FIG. 6A1 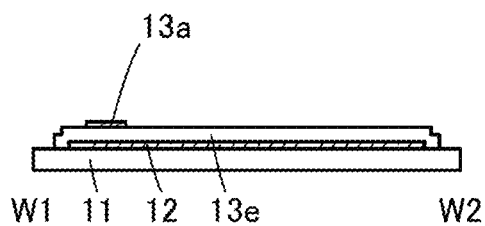
FIG. 6A2 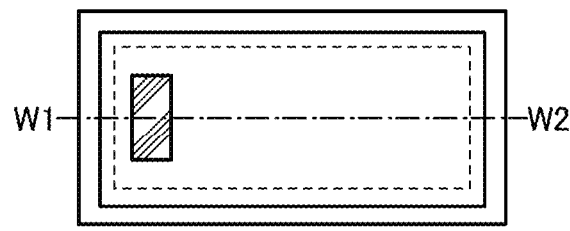
FIG. 6B1 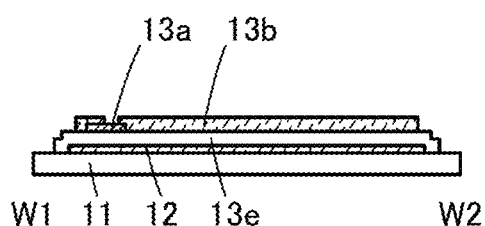
FIG. 6B2 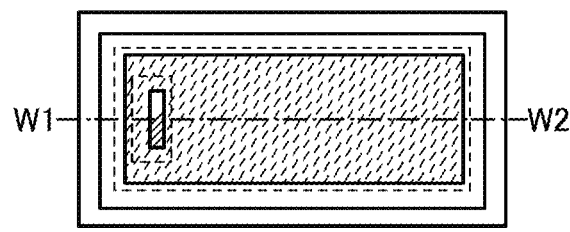
FIG. 6C1 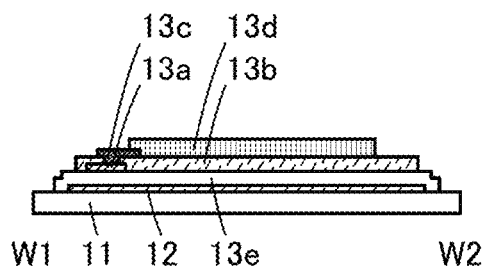
FIG. 6C2 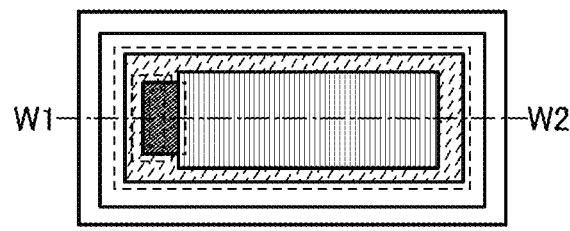
FIG. 6D1 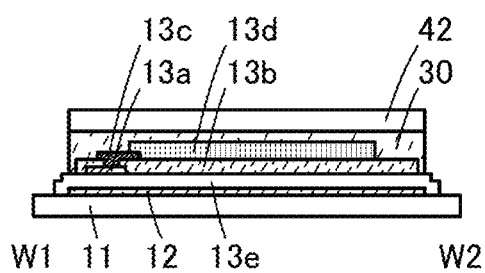
FIG. 6D2 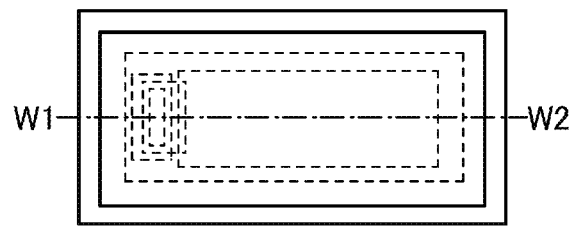

FIG. 7A1
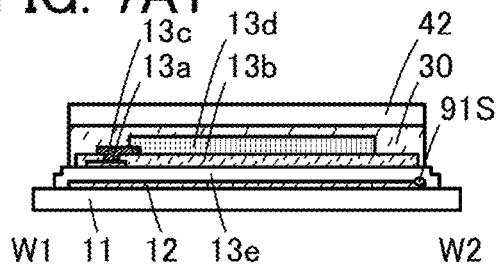
FIG. 7A2
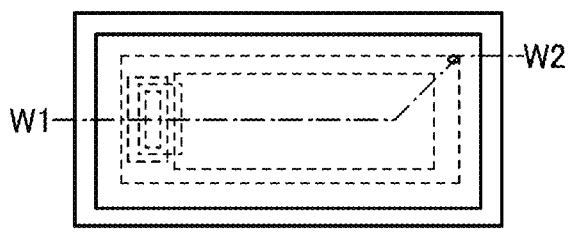
FIG. 7B
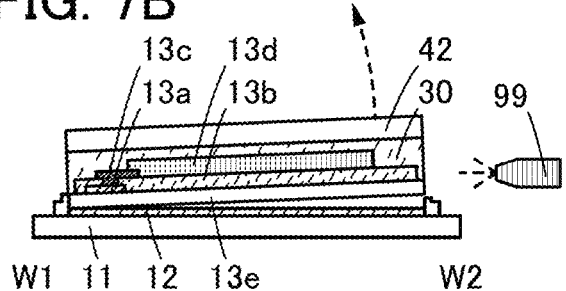
FIG. 7C1
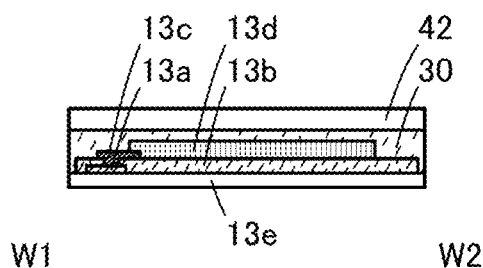
FIG. 7C2
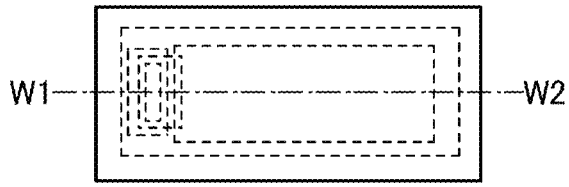
FIG. 7D1
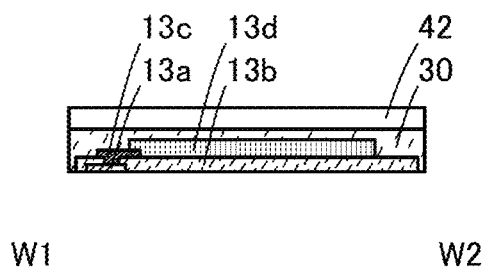
FIG. 7D2
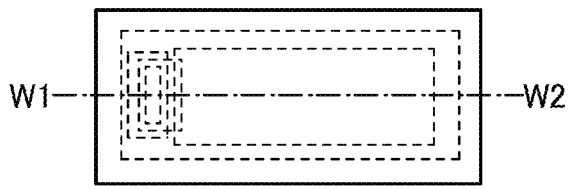

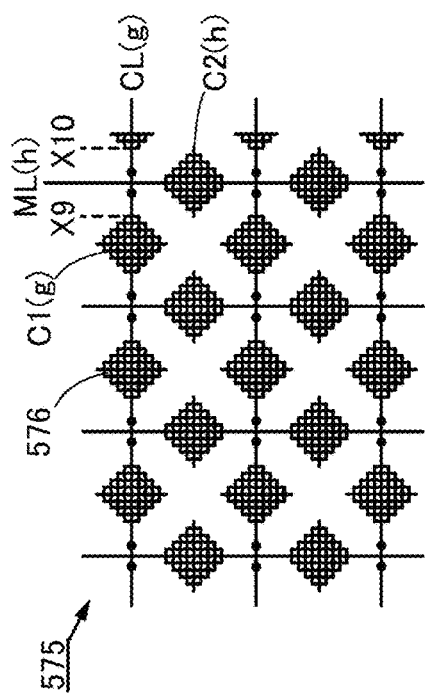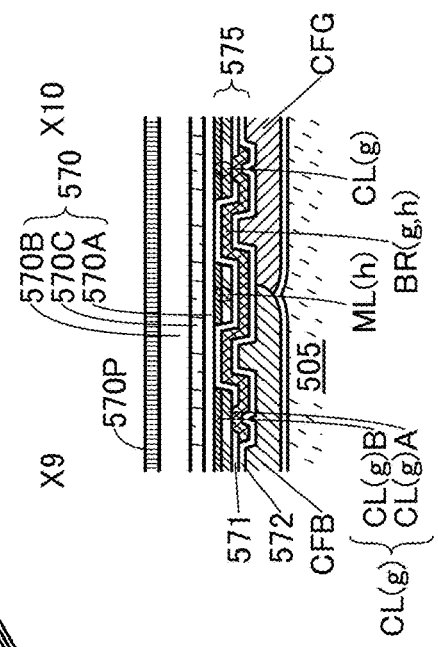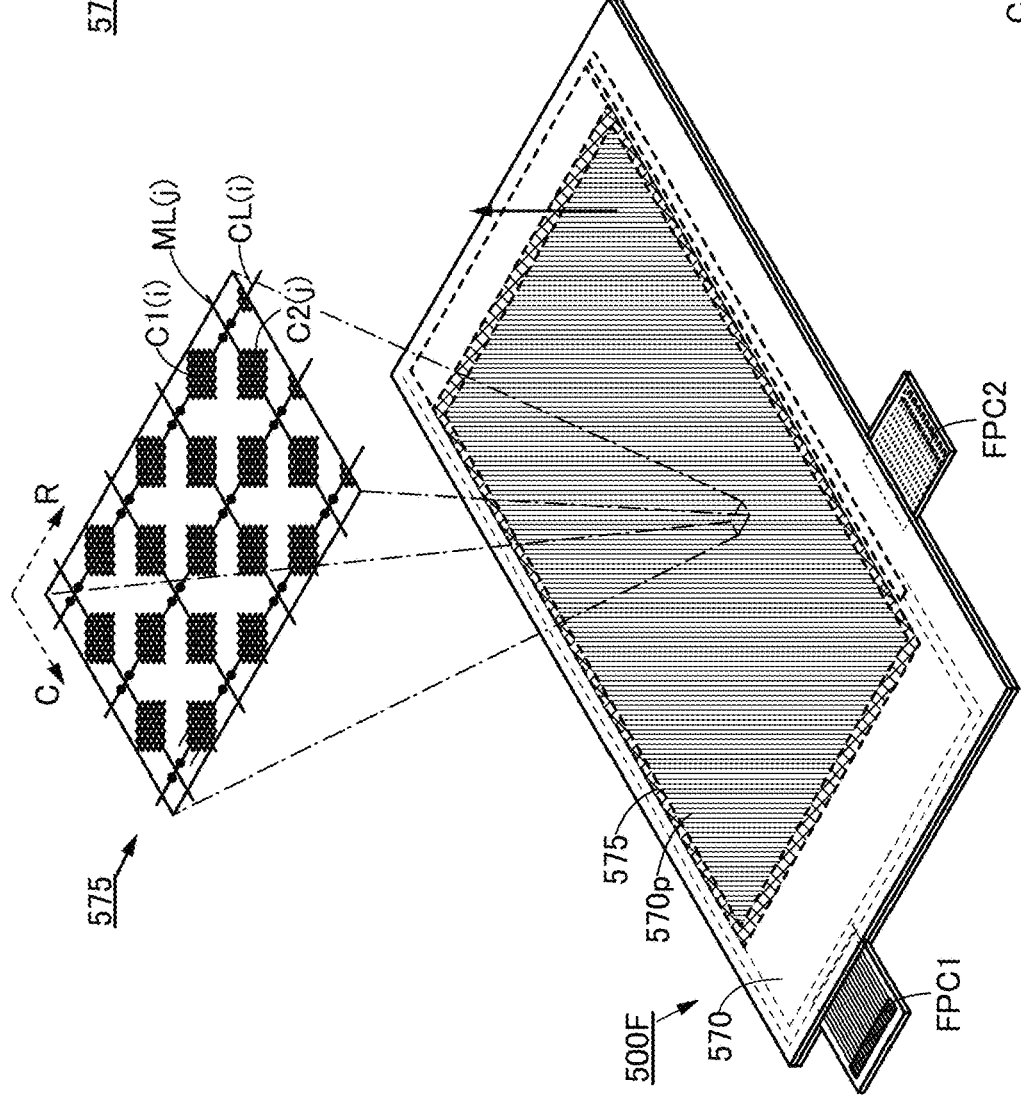
FIG. 29A
FIG. 29B
FIG. 29C

SEMICONDUCTOR DEVICE, DISPLAY PANEL, METHOD FOR MANUFACTURING SEMICONDUCTOR DEVICE, METHOD FOR MANUFACTURING DISPLAY PANEL, AND INFORMATION PROCESSING DEVICE

TECHNICAL FIELD

One embodiment of the present invention relates to a semiconductor device, a display panel, a method for manufacturing a semiconductor device, a method for manufacturing a display panel, or an information processing device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

The social infrastructures relating to means for transmitting information have advanced. This has made it possible to acquire, process, and send out many pieces and various kinds of information with the use of an information processing device not only at home or office but also at other visiting places.

With this being the situation, portable information processing devices are under active development.

For example, portable information processing devices are often used while being carried around by a user, and force might be accidentally applied, by dropping, to the information processing devices and display devices included in them. As an example of a display device that is not easily broken, a display device having high adhesiveness between a structure body by which a light-emitting layer is divided and a second electrode layer is known (Patent Document 1).

REFERENCE

Patent Document

[Patent Document 1] Japanese Published Patent Application No. 2012-190794

DISCLOSURE OF INVENTION

An object of one embodiment of the present invention is to provide a novel semiconductor device that is highly convenient or reliable. Another object of one embodiment of the present invention is to provide a novel display panel that is highly convenient or reliable. Another object of one embodiment of the present invention is to provide a method for manufacturing a novel semiconductor device that is highly convenient or reliable. Another object of one embodiment of the present invention is to provide a method for manufacturing a novel display panel that is highly convenient or reliable. Another object of one embodiment of the present invention is to provide a novel semiconductor device, a novel display panel, a method for manufacturing a novel semiconductor device, or a method for manufacturing a novel display panel.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

(1) One embodiment of the present invention is a semiconductor device including an insulating film, a first connection portion, a terminal, and a circuit.

The insulating film includes an opening. The first connection portion penetrates the opening. The terminal is in contact with one surface of the insulating film and is electrically connected to the first connection portion. The circuit is electrically connected to the first connection portion on an opposite surface of the insulating film.

The terminal includes a region embedded in the insulating film and a region not covered with the insulating film. The circuit includes a semiconductor element.

(2) One embodiment of the present invention is the semiconductor device in which the insulating film has a thickness of greater than or equal to 3 nm and less than or equal to 1500 nm.

(3) One embodiment of the present invention is the semiconductor device which includes a base including a region overlapping with the insulating film. The base includes a flexible region or a bent region. The circuit is positioned between the insulating film and the flexible region or between the insulating film and the bent region.

Owing to the structure, electric power, an electric signal, or the like can be supplied to the circuit including the semiconductor element positioned between the insulating film and the base including the flexible region or the bent region through the terminal so that the circuit operates. Thus, a novel semiconductor device that is highly convenient or reliable can be provided.

(4) One embodiment of the present invention is a display panel including the semiconductor device and a display element electrically connected to the circuit. The display element is positioned between the flexible region and the insulating film or between the bent region and the insulating film.

Owing to the structure, electric power, an electric signal, or the like can be supplied to the circuit including the semiconductor element positioned between the insulating film and the base including the flexible region or the bent region so that the display element operates. Thus, a novel display panel that is highly convenient or reliable can be provided.

(5) One embodiment of the present invention is the display panel including a sensing element.

The sensing element includes a conductive film and a dark-colored film. The dark-colored film includes a region overlapping with the conductive film, and the dark-colored film has lower reflectivity than the conductive film. The sensing element includes an opening in a region overlapping with the display element. The conductive film includes a region sandwiched between the display element and the dark-colored film.

Owing to the structure, the intensity of visible light reflected by the conductive film can be reduced. Thus, display of the display element can be easily observed, so that favorable display can be obtained. In addition, the thickness of the semiconductor device can be reduced. Moreover, stress caused in the base or the like when the semiconductor device is bent can be reduced.

(6) One embodiment of the present invention is an information processing device including an arithmetic device and an input/output device.

The arithmetic device is configured to receive positional information and external information and supply image information and control information.

The input/output device is configured to supply the positional information and the external information and receive the image information and the control information.

The arithmetic device is configured to generate the image information in accordance with the external information and to determine and supply the control information in accordance with the positional information.

The input/output device includes a display portion, an input portion, and a communication portion. The display portion is configured to display the image information.

The input portion is configured to supply the positional information. The communication portion is configured to receive the external information and send the control information. The display portion includes the above display panel.

(7) One embodiment of the present invention is the information processing device in which the input portion includes at least one of a keyboard, a hardware button, a pointing device, a touch sensor, an illuminance sensor, an imaging device, an audio input device, a viewpoint input device, and a pose detection device.

Owing to the structure, for example, image information is generated in accordance with external information received from an external device and can be displayed on the display portion. Control information is determined in accordance with positional information supplied using the input portion and can be sent. Thus, the novel information processing device can be highly convenient or reliable.

(8) One embodiment of the present invention is a method for manufacturing the above semiconductor device including a first step to an eighth step.

In the first step, a first insulating film is formed over a substrate for use in manufacturing processes.

Next, in the second step, a terminal is formed to include a region overlapping with the first insulating film.

Next, in the third step, a second insulating film including an opening is formed so that one surface of the second insulating film is in contact with the terminal and part of the terminal is embedded in the second insulating film.

Next, in the fourth step, a first connection portion penetrating the opening is formed to be electrically connected to the terminal.

Next, in the fifth step, the circuit is formed to be electrically connected to the first connection portion on an opposite surface of the second insulating film.

Next, in the sixth step, a base including a flexible region or a bent region is stacked so that the circuit is positioned between the second insulating film and the flexible region or between the second insulating film and the bent region.

Next, in the seventh step, the substrate for use in manufacturing processes is separated.

Then, in the eighth step, the first insulating film is removed so that the terminal is exposed.

Owing to the method, the circuit including the semiconductor element and the terminal electrically connected to the circuit can be formed using the substrate for use in manufacturing processes and the substrate for use in manufacturing processes can be separated from the circuit and the terminal so that the terminal is exposed. It is thus possible to provide a method for manufacturing a novel semiconductor device that is highly convenient or reliable.

(9) One embodiment of the present invention is a method for manufacturing the above display panel including a first step to a ninth step.

In the first step, a first insulating film is formed over a substrate for use in manufacturing processes.

Next, in the second step, a terminal is formed to include a region overlapping with the first insulating film.

Next, in the third step, a second insulating film including an opening is formed so that one surface of the second insulating film is in contact with the terminal and part of the terminal is embedded in the second insulating film.

Next, in the fourth step, a first connection portion penetrating the opening is formed to be electrically connected to the terminal.

Next, in the fifth step, the circuit is formed to be electrically connected to the first connection portion on an opposite surface of the second insulating film.

Next, in the sixth step, a display element is formed to be electrically connected to the circuit.

Next, in the seventh step, a base including a flexible region or a bent region is stacked so that the circuit is positioned between the second insulating film and the flexible region or between the second insulating film and the bent region.

Next, in the eighth step, the substrate for use in manufacturing processes is separated.

Then, in the ninth step, the first insulating film is removed so that the terminal is exposed.

Owing to the method, the circuit including the semiconductor element, the display element electrically connected to the circuit, and the terminal electrically connected to the circuit can be formed using the substrate for use in manufacturing processes, and the substrate for use in manufacturing processes can be separated from the circuit, the display element, and the terminal so that the terminal is exposed. It is thus possible to provide a method for manufacturing a novel display panel that is highly convenient or reliable.

According to one embodiment of the present invention, a novel semiconductor device that is highly convenient or reliable can be provided. Alternatively, a novel display panel that is highly convenient or reliable can be provided. Alternatively, a method for manufacturing a novel semiconductor device that is highly convenient or reliable can be provided. Alternatively, a method for manufacturing a novel display panel that is highly convenient or reliable can be provided. Alternatively, a novel semiconductor device, a novel display panel, a method for manufacturing a novel semiconductor device, or a method for manufacturing a novel display panel can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 2A to 2C are cross-sectional views illustrating the structure of a semiconductor device according to one embodiment of the present invention.

FIGS. 6A1, 6A2, 6B1, 6B2, 6C1, 6C2, 6D1, and 6D2 are top views and cross-sectional views illustrating a method for manufacturing a semiconductor device according to one embodiment of the present invention.

FIGS. 7A1, 7A2, 7B, 7C1, 7C2, 7D1, and 7D2 are top views and cross-sectional views illustrating a method for manufacturing a semiconductor device according to one embodiment of the present invention.

FIGS. 29A to 29C illustrate the structure of a semiconductor device according to one embodiment of the present invention.

BEST MODE FOR CARRYING OUT THE INVENTION

Figure 1A:
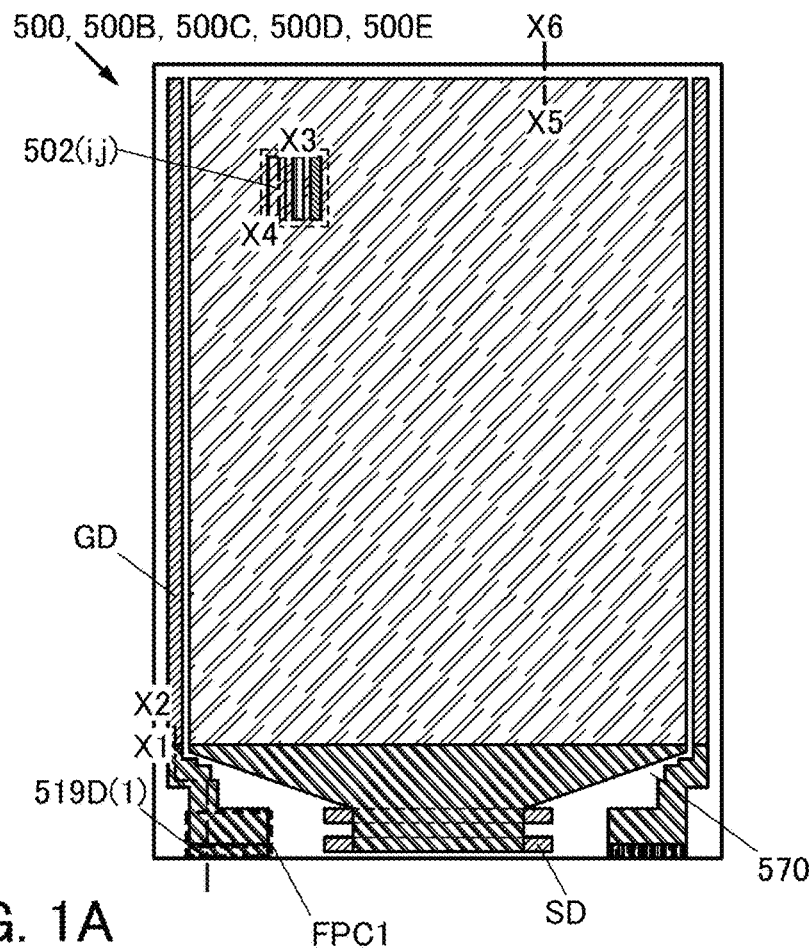
FIGS. 1A and 1B are a top view and a circuit diagram illustrating the structure of a semiconductor device according to one embodiment of the present invention.

A semiconductor device of one embodiment of the present invention includes an insulating film including an opening, a first connection portion penetrating the opening, a terminal which is in contact with one surface of the insulating film and is electrically connected to the first connection portion, and a circuit electrically connected to the first connection portion on an opposite surface of the insulating film.

The terminal includes a region embedded in the insulating film and a region not covered with the insulating film, and the circuit includes a semiconductor element.

The insulating film has a thickness of greater than or equal to 3 nm and less than or equal to 1500 nm. The semiconductor device of one embodiment of the present invention includes a base having a region overlapping with the insulating film, the base has a flexible region or a bent region, and the circuit is positioned between the insulating film and the flexible region or between the insulating film and the bent region.

Owing to the structure, electric power, an electric signal, or the like can be supplied to the circuit including the semiconductor element positioned between the insulating film and the base including the flexible region or the bent region so that the circuit operates. Thus, a novel semiconductor device that is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, the structure of a semiconductor device of one embodiment of the present invention will be described with reference to FIGS. 1A and 1B and FIGS. 2A to 2C.

Figure 1B:
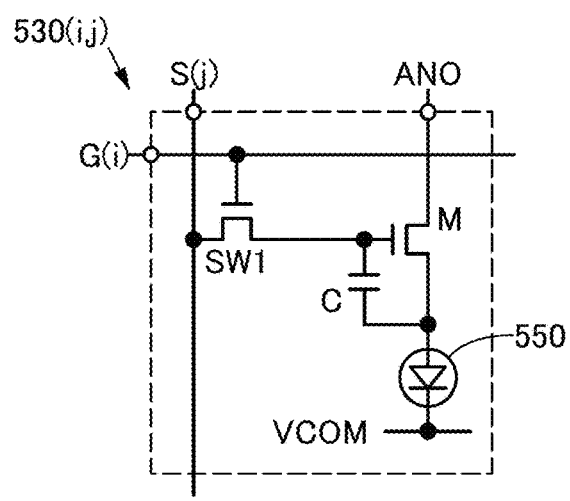

FIGS. 1A and 1B illustrate the structure of a semiconductor device of one embodiment of the present invention. FIG. 1A is a top view of a semiconductor device 500 of one embodiment of the present invention, and FIG. 1B is a circuit diagram of a circuit which can be used for the semiconductor device 500.

FIGS. 2A to 2C illustrate the structure of the semiconductor device 500 of one embodiment of the present invention. FIG. 2A is a cross-sectional view of the semiconductor device 500 taken along the section lines X1-X2, X3-X4, and X5-X6 in FIG. 1A. FIG. 2B is a cross-sectional view illustrating the details of a transistor M in FIG. 2A, and FIG. 2C is a cross-sectional view illustrating the details of a transistor MD in FIG. 2A. Note that in this specification, an integral variable of 1 or more may be used for reference numerals. For example, "(p)" where p is an integral value of 1 or more may be used for part of a reference numeral that specifies any one of components (p components in maximum). For another example, "(m, n)" where m and n are each an integral value of 1 or more may be used for part of a reference numeral that specifies any one of components (m×n components in maximum).

<Structure Example of Semiconductor Device>

The semiconductor device 500 illustrated in this embodiment, includes a second insulating film 501B, a first connection portion 591, a terminal 519D, and a circuit 530(i, j) (see FIG. 1B and FIG. 2A). The semiconductor device 500 further includes a base 570.

The second insulating film 501B includes an opening. The thickness of the second insulating film 501B is greater than or equal to 3 nm and less than or equal to 1500 nm, preferably greater than or equal to 10 nm and less than or equal to 1200 nm, more preferably greater than or equal to 100 nm and less than or equal to 1000 nm, still more preferably greater than or equal to 300 nm and less than or equal to 800 nm.

The first connection portion 591 is provided in the opening. Note that the first connection portion 591 can also be referred to as a through electrode.

The terminal 519D includes a region in contact with one surface of the second insulating film 501B. The terminal 519D is electrically connected to the first connection portion 591. The terminal 519D further includes a region embedded in the second insulating film 501B and a region not covered with the second insulating film 501B.

The circuit 530(i, j) is electrically connected to the first connection portion 591 on an opposite surface of the second insulating film 501B. Furthermore, the circuit 530(i,j) includes a semiconductor element. The surface opposite to the one surface of the second insulating film 501B can be referred to as a rear surface of the second insulating film 501B. Note that the opposite surface of the second insulating film 501B faces the one surface.

The base 570 includes a region overlapping with the second insulating film 501B. Furthermore, the base 570 includes a flexible region or a bent region.

The circuit 530(i, j) is provided between the second insulating film 501B and the flexible region or between the second insulating film 501B and the bent region.

Accordingly, electric power, an electric signal, or the like can be supplied to a circuit including a semiconductor element positioned between the base including the flexible region or the bent region and the insulating films through the terminal to operate the circuit. Thus, a novel semiconductor device that is highly convenient or reliable can be provided.

The semiconductor device 500 includes a display element 550 electrically connected to the circuit 530(i, j). The display element 550 is provided between the second insulating film 501B and the flexible region or between the second insulating film 501B and the bent region.

Accordingly, electric power, an electric signal, or the like can be supplied to a circuit including a semiconductor element positioned between the base including the flexible region or the bent region and the insulating films through the terminal to operate the display element. Thus, the novel display panel can be highly convenient or reliable.

The semiconductor device 500 described in this embodiment includes a pixel 502(i, j) provided with the circuit 530(i, j) and the display element 550 electrically connected to the circuit 530(i, j) (see FIGS. 1A and 1B). The semiconductor device 500 including the display element 550 can also be referred to as a display panel.

The semiconductor device 500 includes one or more pixels 502(i, j) (see FIG. 1A). For example, n pixels 502(i,j) can be arranged in a row direction and m pixels 502(i,j) can be arranged in a column direction which intersects with the row direction. Note that i is an integer greater than or equal to 1 and less than or equal to m, j is an integer greater than or equal to 1 and less than or equal to n, and each of m and n is an integer greater than or equal to 1.

In addition, the semiconductor device 500 can include a scan line G(i) electrically connected to pixels 502(i, 1) to 502(i, n) arranged in the row direction (see FIG. 1B).

In addition, the semiconductor device 500 can include a signal line S(j) electrically connected to pixels 502(i,j) to 502(m, j) arranged in the column direction.

The semiconductor device 500 includes a functional film 570P having a region overlapping with the pixel 502(i,j). In the semiconductor device 500, the base 570 is provided between the functional film 570P and the second insulating film 501B (see FIG. 2A).

In addition, the semiconductor device 500 includes a functional layer 520. The functional layer 520 includes the second insulating film 501B, an insulating film 521A, an insulating film 521B, and an insulating film 528.

The second insulating film 501B includes an opening where the first connection portion 591 is provided. Although a stack of films is used as the second insulating film 501B in this embodiment, a single film may be used as the second insulating film 501B.

The insulating film 521B has a region overlapping with the second insulating film 501B.

The insulating film 521A lies between the second insulating film 501B and the insulating film 521B.

The insulating film 521A has an opening where the second connection portion 592 is provided.

The insulating film 528 has an opening where the display element 550 is provided.

The semiconductor device 500 includes the base 570 having a region overlapping with the functional layer 520, and a bonding layer 505 bonding the functional layer 520 and the base 570.

The semiconductor device 500 includes a driver circuit GD. The driver circuit GD includes the transistor MD, for example (see FIG. 1A and FIGS. 2A to 2C). The driver circuit GD has a function of supplying a selection signal to the scan line G(i), for example.

The semiconductor device 500 includes a wiring 511 electrically connected to the circuit 530(i, j). Furthermore, the semiconductor device 500 includes the terminal 519D electrically connected to the circuit 530(i, j) (see FIG. 1B and FIGS. 2A to 2C).

The semiconductor device 500 includes a wiring ANO electrically connected to the circuit 530(i, j) and a wiring VCOM electrically connected to the circuit 530(i, j).

A flexible printed circuit FPC1 can be electrically connected to the terminal 519D with a conductive material ACF1, for example.

The semiconductor device 500 includes a protective film 573 so that the functional layer 520 is sandwiched between the protective film 573 and the second insulating film 501B. For example, a region where the protective film 573 is in contact with the insulating film 506 is provided to surround the circuit 530(i, j) or the display element 550. Thus, impurities can be prevented from being diffused into the circuit 530(i,j) or the display element 550 (see FIG. 2A).

Specifically, a composite material where the protective film 573b is stacked between the protective film 573a and the protective film 573c can be used for the protective film 573.

A driver circuit SD having a function of supplying an image signal in accordance with image information can be electrically connected to the semiconductor device 500 with a conductive material, for example (see FIG. 1A).

Components of the semiconductor device 500 are described below. Note that these components cannot be clearly distinguished and one component also serves as another component or includes part of another component in some cases.

<Structure>

The semiconductor device 500 includes the functional layer 520, the bonding layer 505, or the base 570. The semiconductor device 500 includes the functional film 570P. The semiconductor device 500 has the flexible region or the bent region.

The semiconductor device 500 includes the pixel 502(i, j), the circuit 530(i, j), or the display element 550.

The semiconductor device 500 includes a semiconductor element. The semiconductor device 500 includes a switch SW1, the transistor M, the transistor MD, or a capacitor C.

The semiconductor device 500 includes the terminal 519D, the wiring 511, the scan line G(i), the signal line S(j), the wiring ANO, or the wiring VCOM. The semiconductor device 500 includes the first connection portion 591 or the second connection portion 592.

The semiconductor device 500 includes the second insulating film 501B, the insulating film 521A, the insulating film 521B, or the insulating film 528.

The semiconductor device 500 includes the driver circuit GD.

The semiconductor device 500 includes the protective film 573.

<<Base 570>>

For example, a large-sized glass substrate having any of the following sizes can be used as the base 570: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized semiconductor device can be manufactured.

For the base 570, an organic material, an inorganic material, a composite material of an organic material and an inorganic material, or the like can be used. For example, an inorganic material such as glass, ceramics, or a metal can be used for the base 570.

Specifically, non-alkali glass, soda-lime glass, potash glass, crystal glass, quartz, sapphire, or the like can be used for the base 570. Specifically, an inorganic oxide film, an inorganic nitride film, an inorganic oxynitride film, or the like can be used for the base 570. For example, silicon oxide, silicon nitride, silicon oxynitride, an alumina film, or the like can be used for the base 570. SUS, aluminum, or the like can be used for the base 570.

For example, a single crystal semiconductor substrate or a polycrystalline semiconductor substrate of silicon or silicon carbide, a compound semiconductor substrate of silicon germanium, or an SOI substrate can be used as the base 570. Thus, a semiconductor element can be formed over the base 570.

For example, an organic material such as a resin, a resin film, or plastic can be used for the base 570. Specifically, a resin film or a resin plate of polyester, polyolefin, polyamide, polyimide, polycarbonate, an acrylic resin, or the like can be used for the base 570.

For example, a composite material, such as a resin film to which a metal plate, a thin glass plate, or an inorganic film is bonded can be used for the base 570. For example, a composite material formed by dispersing a fibrous or particulate metal, glass, an inorganic material, or the like into a resin film can be used for the base 570. For example, a composite material formed by dispersing a fibrous or particulate resin, organic material, or the like into an inorganic material can be used for the base 570.

A single-layer material or a stacked-layer material in which a plurality of layers are stacked can be used for the base 570. For example, a stacked-layer material in which a base, an insulating film that prevents diffusion of impurities contained in the base, and the like are stacked can be used for the base 570. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the base 570. Alternatively, a stacked-layer material in which a resin and a film for preventing diffusion of impurities that penetrate the resin, such as a silicon oxide film, a silicon nitride film, or a silicon oxynitride film, are stacked can be used for the base 570.

Specifically, a resin film, a resin plate, or a stack of polyester, polyolefin, polyamide, polyimide, polycarbonate, an acrylic resin, or the like can be used as the base 570.

Specifically, a material including polyester, polyolefin, polyamide (e.g., nylon or aramid), polyimide, polycarbonate, an acrylic resin, a urethane resin, an epoxy resin, a resin having a siloxane bond, such as silicone, or the like can be used for the base 570. Alternatively, a film, a plate, a stack, or the like which contains any one or more of the resins can be used for the base 570.

Specifically, polyethylene terephthalate (PET), polyethylene naphthalate (PEN), polyethersulfone (PES), acrylic, or the like can be used for the base 570.

Alternatively, paper, wood, or the like can be used for the base 570.

For example, a flexible base can be used as the base 570. Alternatively, a bent base can be used as the base 570, for example.

Note that a transistor, a capacitor, or the like can be directly formed on the base. Alternatively, a transistor, a capacitor, or the like can be formed over a substrate for use in manufacturing processes having heat resistance and can be transferred to a base. Thus, a transistor, a capacitor, or the like can be formed over a flexible base, for example.

Note that in the case where display of the display element 550 is recognized through the base 570, a light-transmitting material is used for the base 570.

<<Terminal 519D, Wiring 511, Scan Line G(i), Signal Line S(j), Wiring ANO, and Wiring VCOM>>

A conductive material can be used for the terminal 519D, the wiring 511, the scan line G(i), the signal line S(j), the wiring ANO, the wiring VCOM, or the like.

For example, an inorganic conductive material, an organic conductive material, a metal material, or a conductive ceramic material can be used for the terminal 519D, the wiring 511, the scan line G(i), the signal line S(j), the wiring ANO, or the wiring VCOM.

Specifically, a metal element selected from aluminum, gold, platinum, silver, copper, chromium, tantalum, titanium, molybdenum, tungsten, nickel, iron, cobalt, palladium, and manganese, or the like can be used for the terminal 519D, the wiring 511, the scan line G(i), the signal line S(j), the wiring ANO, the wiring VCOM, or the like. Alternatively, an alloy including any of the above-described metal elements, or the like can be used for the terminal 519D, the wiring 511, the scan line G(i), the signal line S(j), the wiring ANO, the wiring VCOM, or the like. In particular, an alloy of copper and manganese is preferably used in microfabrication using a wet etching method.

Specifically, the following structures can be used for the terminal 519D, the wiring 511, the scan line G(i), the signal line S(j), the wiring ANO, the wiring VCOM, or the like: a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order, and the like.

Specifically, a conductive oxide such as indium oxide, indium tin oxide, indium zinc oxide, zinc oxide, or zinc oxide to which gallium is added can be used for the terminal 519D, the wiring 511, the scan line G(i), the signal line S(j), the wiring ANO, the wiring VCOM, or the like.

For example, a film containing graphene or graphite can be used as the terminal 519D, the wiring 511, the scan line G(i), the signal line S(j), the wiring ANO, or the wiring VCOM.

Specifically, a film containing graphene oxide is formed and is reduced, so that a film containing graphene can be formed. As a reducing method, a method using heat, a method using a reducing agent, or the like can be employed.

For example, a conductive high molecule can be used for the terminal 519D, the wiring 511, the scan line G(i), the signal line S(j), the wiring ANO, or the wiring VCOM.

<<First Connection Portion 591 and Second Connection Portion 592>>

A conductive material can be used for the first connection portion 591 and the second connection portion 592. For example, the material which can be used for the terminal 519D, the wiring 511, the scan line G(i), the signal line S(j), the wiring ANO, or the wiring VCOM can be used.

<<Bonding Layer 505>>

An inorganic material, an organic material, a composite material of an inorganic material and an organic material, or the like can be used for the bonding layer 505.

For example, an organic material such as a resin having thermal fusibility or a curable resin can be used for the bonding layer 505.

For example, an organic material such as a reactive curable adhesive, a light curable adhesive, a thermosetting adhesive, and/or an anaerobic adhesive can be used for the bonding layer 505.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the bonding layer 505.

<<Functional Layer 520>>

For example, a functional circuit, a functional element, an optical element, or a functional film can be used as the functional layer 520.

Specifically, a display element, a circuit driving the display element, a driver circuit driving the circuit, a color film, a moisture-proof film, or the like can be used as the functional layer 520.

For example, the display element 550, the circuit 530(i, j), the first connection portion 591, or the second connection portion 592 can be used as the functional layer 520. Alternatively, the second insulating film 501B, the insulating film 521A, the insulating film 521B, or the insulating film 528 can be used as the functional layer 520.

<<Display Element 550>>

A light-emitting element, for example, can be used as the display element 550. Specifically, an organic electroluminescence element, an inorganic electroluminescence element, a light-emitting diode, or the like can be used as the display element 550.

For example, the display element 550 includes a first conductive film 551, a second conductive film 552 having a region overlapping with the first conductive film 551, and a layer 553 containing a luminescent organic compound between the first conductive film 551 and the second conductive film 552.

For example, a stack formed to emit blue light, green light, or red light can be used as the layer 553 containing a luminescent organic compound.

For example, a stack formed to emit white light can be used as the layer 553 containing a luminescent organic compound. Specifically, a stack of a layer containing a luminescent organic compound containing a fluorescent material that emits blue light, a layer containing a material that is other than a fluorescent material and that emits green light and/or red light, or a layer containing a material that is other than a fluorescent material and that emits yellow light can be used as the layer 553 containing a luminescent organic compound.

For example, a material used for the wiring 511 or the like can be used for the first conductive film 551 or the second conductive film 552.

For example, a conductive material can be used for the first conductive film 551. A conductive material reflecting visible light can be used for the first conductive film 551. A material in which a material reflecting visible light and a conductive material are stacked can be used for the first conductive film 551.

For example, the second conductive film 552 can be formed using a conductive material transmitting visible light.

Specifically, conductive oxide, indium-containing conductive oxide, indium oxide, indium tin oxide, indium zinc oxide, zinc oxide, zinc oxide to which gallium is added, or the like can be used for the second conductive film 552.

Alternatively, a metal film that is thin enough to transmit light can be used as the second conductive film 552.

<<Circuit 530(i,j)>>

For example, the circuit 530(i, j) can include the switch SW1, the capacitor C, or the transistor M (see FIG. 1B). The scan line G(i), the signal line S(j), the wiring ANO, and the wiring VCOM can be electrically connected to the circuit 530(i,j).

The switch SW1 includes a control electrode and a first electrode which are electrically connected to the scan line G(i) and the signal line S(j), respectively. Note that the switch SW1 may be a transistor.

The transistor M includes a gate electrode and a first electrode which are electrically connected to a second electrode of the switch SW1 and the wiring ANO, respectively.

The capacitor C includes a first electrode and a second electrode which are electrically connected to the second electrode of the switch SW1 and a second electrode of the transistor M, respectively.

Note that the first conductive film 551 and the second conductive film 552 of the display element 550 can be electrically connected to the second electrode of the transistor M and the wiring VCOM, respectively.

<<Transistor M>>

The transistor M includes the semiconductor film 508 and the conductive film 504 which includes a region overlapping with the semiconductor film 508 (see FIG. 2B). The transistor M further includes a conductive film 512A, a conductive film 512B, and the insulating film 506 between the semiconductor film 508 and the conductive film 504.

Note that the conductive film 504 serves as a gate electrode, and the insulating film 506 serves as a gate insulating film. The conductive film 512A has one of a function as a source electrode and a function as a drain electrode, and the conductive film 512B has the other.

Note that the functional layer 520 can include the insulating film 516 or the insulating film 518 which covers the transistor M. Thus, impurity diffusion to the transistor M can be suppressed.

The transistor M can have a bottom-gate structure or a top-gate structure.

For example, a transistor including a semiconductor containing an element of Group 4 can be used. Specifically, a semiconductor containing silicon can be used for a semiconductor film. For example, single crystal silicon, polysilicon, microcrystalline silicon, or amorphous silicon can be used for the semiconductor film of the transistor.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A circuit using the transistor that uses an oxide semiconductor for the semiconductor film can hold an image signal for a longer time than a circuit using a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the semiconductor device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used.

Specifically, an organic semiconductor containing any of polyacenes and graphene can be used for the semiconductor film.

<<Switch SW1>>

A transistor can serve as the switch SW1.

For example, a transistor including a semiconductor film which can be fabricated in the same process as the semiconductor film of the transistor M can be used as the switch SW1.

<<Second Insulating Film 501B>>

Although a stack of films is used as the second insulating film 501B in this embodiment, a single film may be used as the second insulating film 501B.

For example, an insulating inorganic material, an insulating organic material, or an insulating composite material containing an inorganic material and an organic material can be used for the second insulating film 501B.

Specifically, an inorganic oxide film, an inorganic nitride film, an inorganic oxynitride film, or a material obtained by stacking any of these films can be used for the second insulating film 501B. For example, a film including any of a silicon oxide film, a silicon nitride film, a silicon oxynitride film, and an aluminum oxide film, or a film including a material stacking any of these films can be used for the second insulating film 501B.

Specifically, for the second insulating film 501B, polyester, polyolefin, polyamide, polyimide, polycarbonate, polysiloxane, an acrylic resin, and the like, or a stacked material of or a composite material of a plurality of kinds of resins selected from these can be used. Alternatively, a photosensitive material may be used.

Specifically, a film containing a stacked-layer material of a 600-nm-thick silicon oxynitride film and a 200-nm-thick silicon nitride film can be used as the second insulating film 501B.

Specifically, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the second insulating film 501B.

Thus, the water vapor transmittance of the second insulating film 501B can be lower than or equal to $1 \times 10^{-5}$ g/(m$^2$·day), preferably lower than or equal to $1 \times 10^{-6}$ g/(m$^2$·day), further preferably lower than or equal to $1 \times 10^{-7}$ g/(m$^2$·day), still further preferably lower than or equal to $1 \times 10^{-8}$ g/(m$^2$·day).

<<Insulating Films 521A, 521B, and 528>>

The material which can be used for the second insulating film 501B can be used for the insulating film 521A, 521B, or 528.

Thus, steps due to components overlapping with the insulating film 521A, for example, can be covered so that a flat surface can be formed. The insulating film 521B provided between a plurality of wirings can prevent short circuit of the plurality of wirings. The insulating film 528 having an opening which overlaps with the first conductive film 551 can prevent short circuit between the first conductive film 551 and the second conductive film 552 which can occur at the edges of the first conductive film 551.

<<Protective Film 573>>

For example, an insulating inorganic material, an insulating organic material, or an insulating composite material containing an inorganic material and an organic material can be used for the protective film 573.

Specifically, an insulating inorganic material can be used for the protective films 573a and 573c, and an insulating organic material can be used for the protective film 573b. Thus, the protective film 573 having less defects such as pinholes and pores can be formed.

Thus, the water vapor transmittance of the protective film 573 can be lower than or equal to $1 \times 10^{-5}$ g/(m$^2$·day), preferably lower than or equal to $1\times10^{-6}$ g/(m²·day), further preferably lower than or equal to $1\times10^{-7}$ g/(m²·day), still further preferably lower than or equal to $1\times10^{-8}$ g/(m²·day).

<<Functional Film 570P>>

For example, a circularly polarizing plate, an anti-reflective film, or the like can be used as the functional film 570P.

Alternatively, an antistatic film preventing the attachment of a foreign substance, a water repellent film suppressing the attachment of stain, a hard coat film suppressing a scratch in use, or the like can be used as the functional film 570P.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed in the same process as the semiconductor film of the transistor M can be used.

Alternatively, as the transistor MD, a transistor different from the transistor M can be used. Specifically, as the transistor MD, a transistor including the conductive film 524 can be used (see FIG. 2C). The semiconductor film 508 is provided between the conductive films 524 and 504. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that the transistor MD can have the same structure as the transistor M.

<<Driver Circuit SD>>

For example, an integrated circuit can be used in the driver circuit SD. Specifically, an integrated circuit formed over a silicon substrate can be used.

For example, a chip on glass (COG) method can be used to mount the driver circuit SD on a pad provided over the second insulating film 501B. Specifically, an anisotropic conductive film can be used to mount the integrated circuit on the pad. Note that the pad is electrically connected to the circuit 530($i, j$).

<Method for Controlling Resistivity of Oxide Semiconductor>

The method for controlling the resistivity of an oxide semiconductor film will be described.

An oxide semiconductor film with a certain resistivity can be used as the semiconductor film 508 or the conductive film 524.

For example, a method for controlling the concentration of impurities such as hydrogen and water contained in the oxide semiconductor film and/or the oxygen vacancies in the film can be used as the method for controlling the resistivity of an oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm²² is formed in contact with the oxide semiconductor film, in that case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8\times10^{19}$ atoms/cm³, preferably greater than or equal to $1\times10^{20}$ atoms/cm³, more preferably greater than or equal to $5\times10^{20}$ atoms/cm³ can be suitably used for the conductive film 524.

On the other hand, an oxide semiconductor with a high resistivity can be used for a semiconductor film where a channel of a transistor is formed.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8\times10^{11}$/cm³, preferably lower than $1\times10^{11}$/cm³, further preferably lower than $1\times10^{10}$/cm³. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 508 is used as the conductive film 524.

The hydrogen concentration in the conductive film 524 is twice or more, preferably ten times or more that in the semiconductor film 508.

The resistivity of the conductive film 524 is greater than or equal to $1\times10^{-8}$ times and less than $1\times10^{-1}$ times that of the semiconductor film 508.

Specifically, the resistivity of the conductive film 524 is higher than or equal to $1\times10^{-3}$ Ωcm and lower than $1\times10^4$ Ωcm, preferably higher than or equal to $1\times10^{-3}$ Ωcm and lower than $1\times10^{-1}$ Ωcm.

<Structure Example 2 of Semiconductor Device>

Another structure of the semiconductor device of one embodiment of the present invention will be described with reference to FIG. 3.

Figure 3:
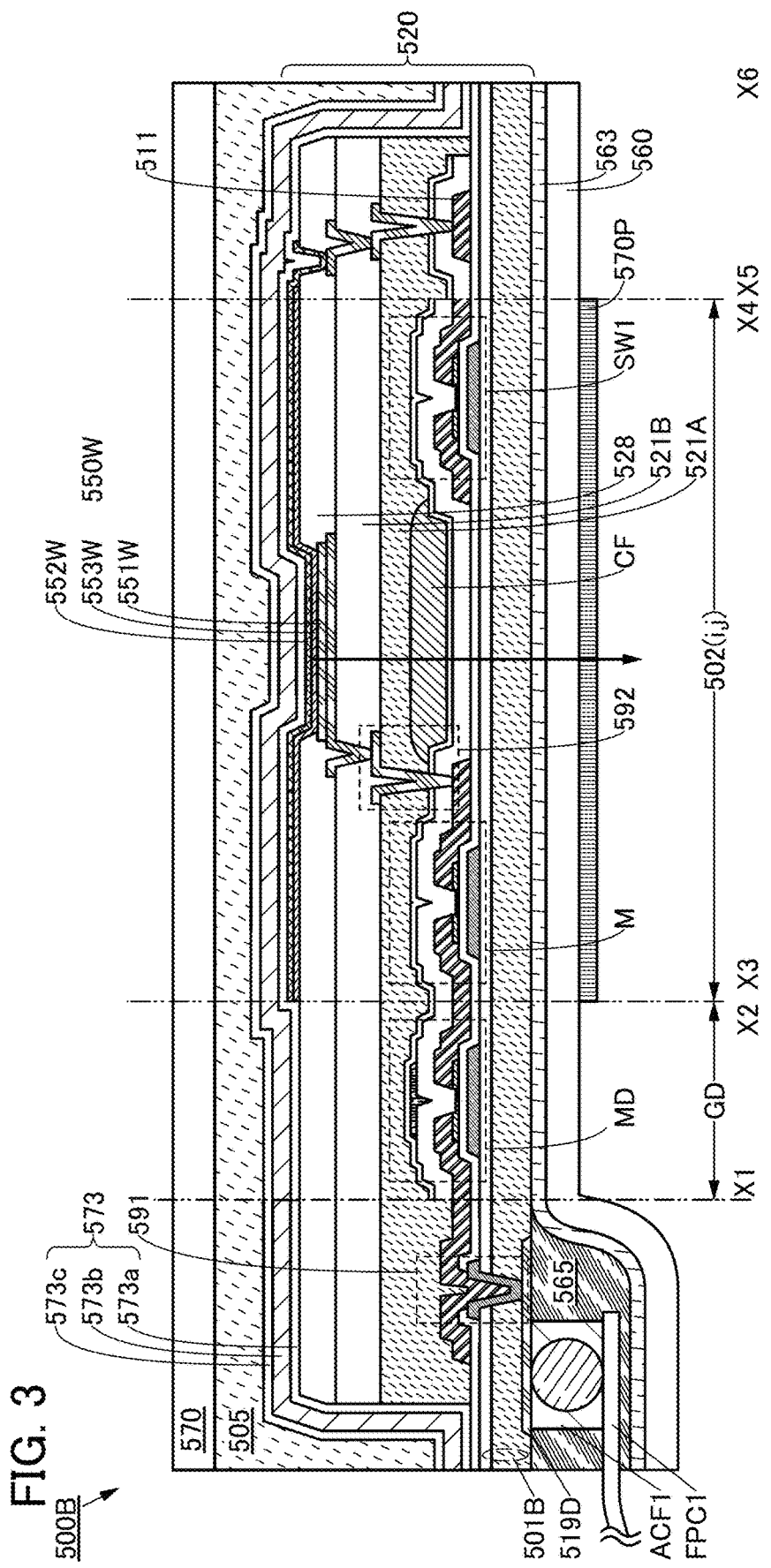
FIG. 3 is a cross-sectional view illustrating the structure of a semiconductor device according to one embodiment of the present invention.

FIG. 3 illustrates the structure of a semiconductor device 500B of one embodiment of the present invention. FIG. 3 is a cross-sectional view of the semiconductor device 500B, which is one embodiment of the present invention, taken along the section lines X1-X2, X3-X4, and X5-X6 in FIG. 1A.

Note that the semiconductor device 500B is different from the semiconductor device 500 described with reference to FIGS. 2A to 2C in that the display element 550 is replaced with a display element 550W with which display can be recognized on the second insulating film 501B side (see FIG. 3), a coloring film CF is provided between the display element 550W and the second insulating film 501B, a base 560 having a region overlapping with the second insulating film 501B is provided, a bonding layer 563 bonding the second insulating film 501B and the base 560 is provided, and the functional film 570P provided so that the second insulating film 501B is sandwiched between the functional film 570P and the display element 550W is provided. Different structures will be described in detail below, and the above description is referred to for the other similar structures.

<<Display Element 550W>>

A light-emitting element, for example, can be used as the display element 550W. Specifically, an organic electroluminescence element, an inorganic electroluminescence element, a light-emitting diode, or the like can be used for the display element 550W.

Specifically, a stack formed to emit white light can be used as the layer 553W containing a luminescent organic compound.

For example, a conductive material reflecting visible light can be used for the second conductive film 552W. A conductive material transmitting visible light can be used for the first conductive film 551W. Thus, the display element 550W can emit white light toward the second insulating film 501B.

<<Color Film CF>>

The coloring film CF can be formed using a material transmitting light of a predetermined color and can thus be used as a color filter or the like.

For example, the coloring film CF can be formed using a material transmitting light of blue, green, red, yellow, or white.

<<Base 560>>

The material which can be used for the base 570 can be used for the base 560. For example, a flexible base can be used as the base 560. Alternatively, a bent base can be used as the base 560, for example.

Note that in the case where display of the display element 550W is recognized through the base 560, a light-transmitting material is used for the base 560.

<<Bonding Layer 563>>

The material which can be used for the bonding layer 505 can be used for the bonding layer 563.

<<Terminal 519D>>

The flexible printed circuit FPC1 can be electrically connected to the terminal 519D with the conductive material ACF1, for example.

For example, a resin layer 565 fixing the flexible printed circuit FPC1 may be formed on the periphery of the terminal 519D. Thus, the flexible printed circuit FPC1 can be prevented from being detached from the terminal 519D (see FIG. 3).

<Structure Example 3 of Semiconductor Device>

Another structure of the semiconductor device of one embodiment of the present invention will be described with reference to FIGS. 4A to 4C.

Figure 4:
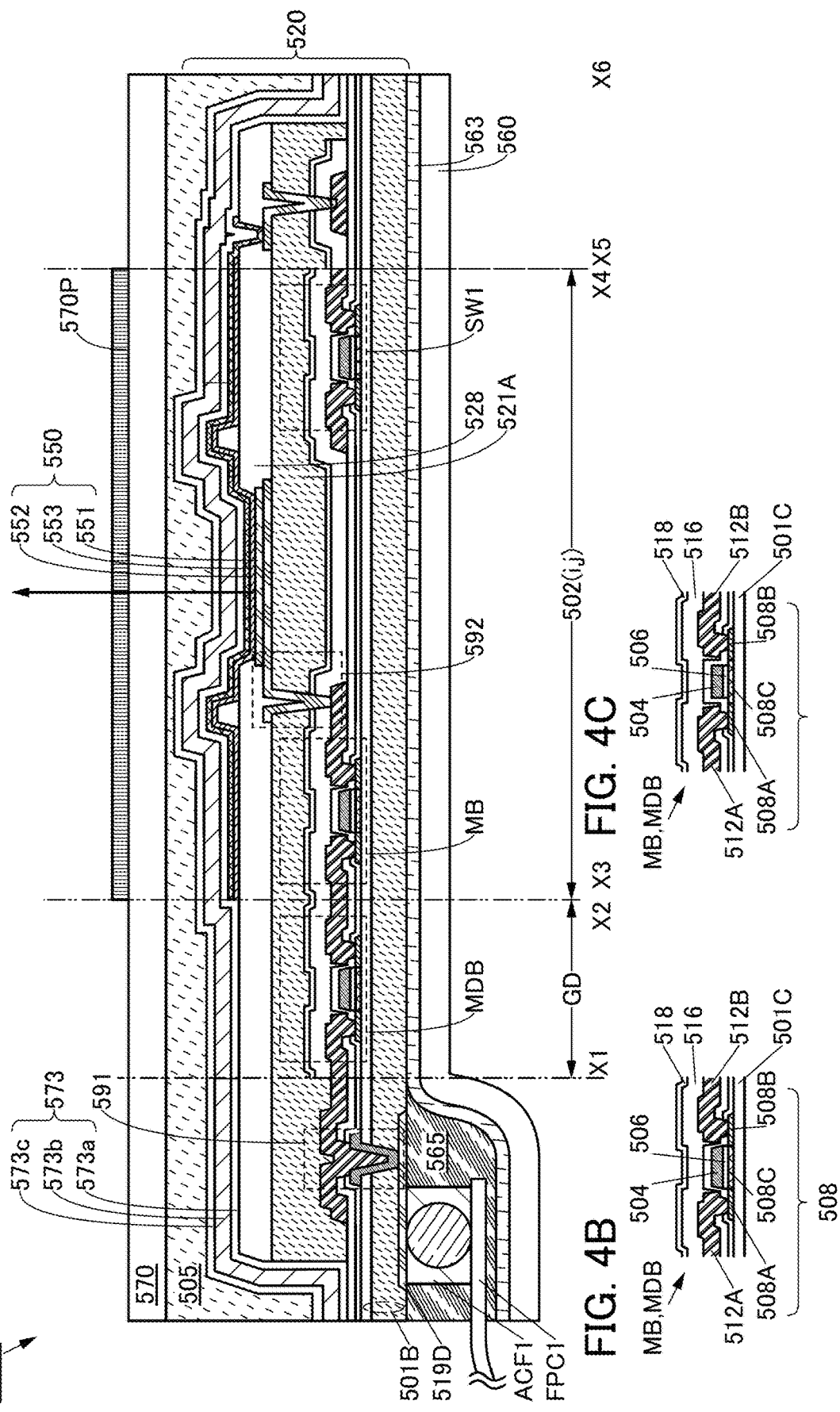
FIGS. 4A to 4C are cross-sectional views illustrating the structure of a semiconductor device according to one embodiment of the present invention.

FIGS. 4A to 4C illustrate the structure of a semiconductor device 500C of one embodiment of the present invention. FIG. 4A is a cross-sectional view of the semiconductor device 500C of one embodiment of the present invention taken along the section lines X1-X2, X3-X4, and X5-X6 in FIG. 1A. FIG. 4B is a cross-sectional view illustrating the details of a transistor MB or a transistor MDB in FIG. 4A, and FIG. 4C is a cross-sectional view illustrating a modification example of the transistor MB or the transistor MDB in FIG. 4A.

Note that the semiconductor device 500C is different from the semiconductor device 500 in FIGS. 2A to 2C in that the bottom-gate transistor M is provided instead of the top-gate transistor MB, the base 560 having a region overlapping with the second insulating film 501B is provided, the bonding layer 563 bonding the second insulating film 501B and the base 560 is provided, and the insulating film 521B is not provided.

<<Transistor MB>>

The transistor MB includes the conductive film 504 having a region overlapping with an insulating film 501C and the semiconductor film 508 having a region provided between the insulating film 501C and the conductive film 504. Note that the conductive film 504 functions as a gate electrode (see FIG. 4B). Here, the angle of a side surface of the conductive film 504 with respect to the base is greater than or equal to 80° and less than or equal to 100°, preferably greater than or equal to 85° and less than or equal to 95° (see FIG. 4C).

The semiconductor film 508 is consisted of a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MB includes the insulating film 506 between the third region 508C and the conductive film 504. Note that the insulating film 506 functions as a gate insulating film.

The first region 508A and the second region 508B have a lower resistance than the third region 508C, and function as a source region and a drain region.

Note that, for example, a method for controlling the resistivity of the oxide semiconductor film can be used as a method for forming the first region 508A and the second region 508B in the semiconductor film 508. Specifically, plasma treatment using a gas containing a rare gas can be used. For example, when the conductive film 504 is used as a mask, the shape of part of the third region 508C can be the same as the shape of an end portion of the conductive film 504.

The transistor MB includes the conductive films 512A and 512B which are in contact with the first region 508A and the second region 508B, respectively. The conductive film 512A and the conductive film 512B function as a source electrode and a drain electrode.

The transistor which can be formed in the same process as the transistor MB can be used as the transistor MDB. Alternatively, the transistor can be used as the switch SW1.

<<Base 560>>

The material which can be used for the base 570 can be used for the base 560. For example, a flexible base can be used as the base 560. Alternatively, a bent base can be used as the base 560, for example.

<<Bonding Layer 563>>

The material which can be used for the bonding layer 505 can be used for the bonding layer 563.

<Structure Example 4 of Semiconductor Device>

Another structure of the semiconductor device of one embodiment of the present invention will be described with reference to FIG. 24 and FIGS. 25A to 25C.

FIG. 24 and FIGS. 25A to 25C illustrate the structure of a semiconductor device 500D of one embodiment of the present invention, specifically, the structure of a display panel provided with a proximity sensor.

Figure 24:
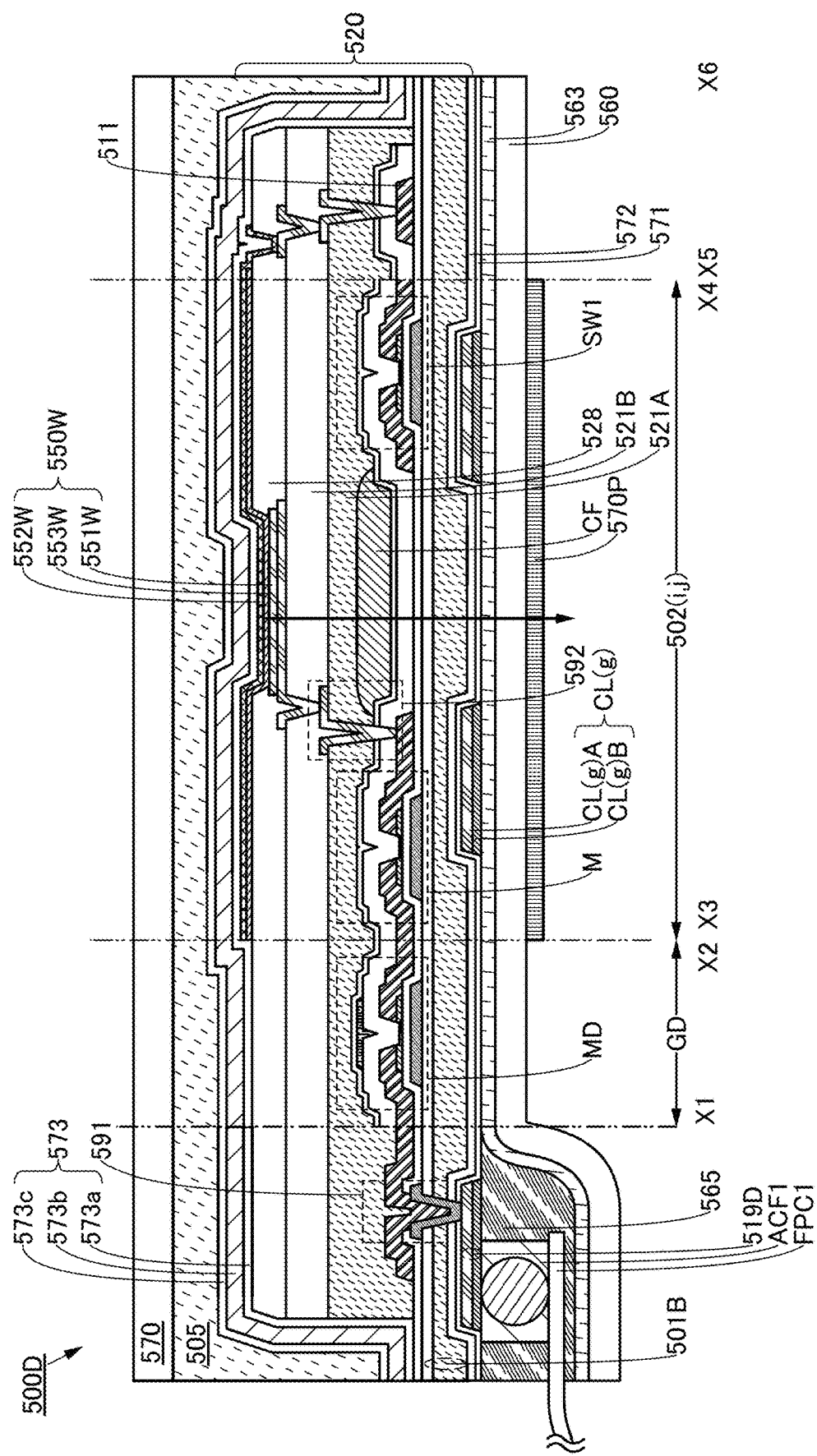
FIG. 24 is a cross-sectional view illustrating the structure of a semiconductor device according to one embodiment of the present invention.

FIG. 24 is a cross-sectional view of the semiconductor device 500D, which is one embodiment of the present invention, taken along the section lines X1-X2, X3-X4, and X5-X6 in FIG. 1A.

Figure 25B:
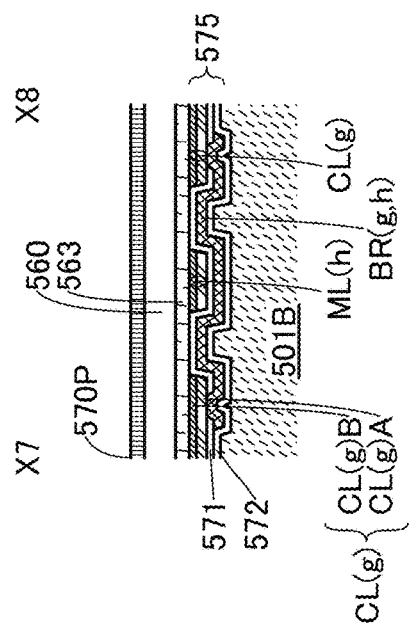
FIGS. 25A to 25C illustrate the structure of a semiconductor device according to one embodiment of the present invention.
Figure 25C:
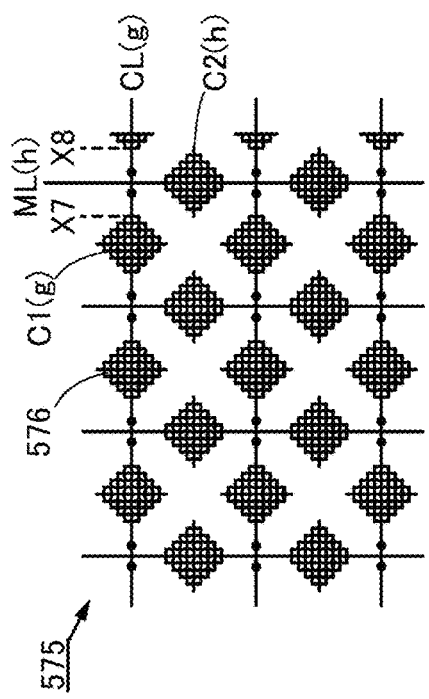
Figure 25A:
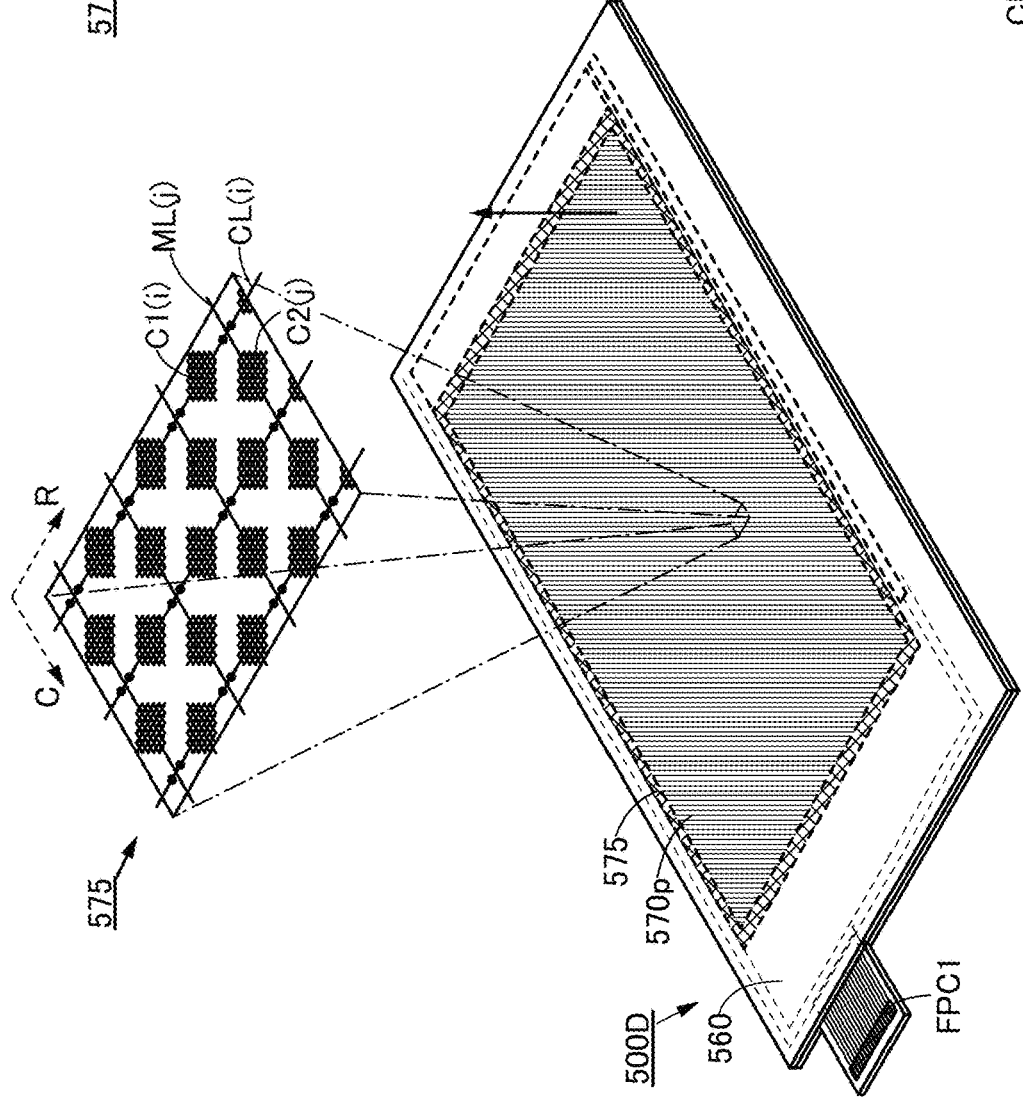

FIG. 25A is a projection view of a positional information input panel of one embodiment of the present invention. Note that for convenience of description, part of the positional information input panel is enlarged. FIG. 25B is a top view of a proximity sensor of the positional information input panel. FIG. 25C is a cross-sectional view taken along the section line X7-X8 in FIG. 25B.

The semiconductor device 500D is different from the semiconductor device 500B described with reference to FIG. 3 in that a proximity sensor 575 is provided and an insulating film 572 is provided. Different structures will be described in detail below, and the above description is referred to for the other similar structures.

Note that the second insulating film 501B includes a region sandwiched between the proximity sensor 575 and the circuit 530(i, j).

The insulating film 572 includes a region sandwiched between the second insulating film 501B and the proximity sensor 575.

<<Proximity Sensor 575>>

A sensing element for sensing a change in capacitance, illuminance, magnetic force, a radio wave, pressure, or the like caused by an approach of an object and supplying a signal based on the sensed physical quantity can be used for the proximity sensor 575.

For example, a conductive film, a photoelectric conversion element, a magnetic sensing element, a piezoelectric element, a resonator, or the like can be used as the sensing element.

For example, a sensing circuit having a function of supplying a signal which varies according to the parasitic capacitance of a conductive film can be used for the proximity sensor 575. A control signal is supplied to a first electrode, and the potential, current, or the like of a second electrode which changes according to the supplied control signal and the capacitance is obtained and can be supplied as a sensing signal. Thus, a finger or the like which approaches the conductive film in the air can be sensed with change in capacitance.

For example, a first electrode C1(g) and a second electrode C2(h) can be used for the proximity sensor 575 (see FIGS. 25A and 25B). The second electrode C2(h) has a portion not overlapping with the first electrode C1 (g). Note that each of g and h is a natural number of 1 or more.

Specifically, the proximity sensor 575 includes the first electrode C1(g) electrically connected to a control line CL(g) extended in a row direction (a direction indicated by the arrow R in FIG. 25A) and the second electrode C2(h) electrically connected to a signal line ML(h) extended in a column direction intersecting with the row direction (a direction indicated by the arrow C in FIG. 25A).

For the first electrode C1(g) or the second electrode C2(h), a conductive film whose light-transmitting regions overlap with the pixel 502(i,j) can be used, for example.

For the first electrode C1(g) or the second electrode C2(h), a net-like conductive film whose openings 576 overlap with the pixel 502(i,j) can be used, for example.

The control line CL(g) is provided with the wiring BR(g, h). In the wiring BR(g, h), the control line CL(g) intersects with the signal line ML(h) (see FIG. 25C).

A stacked-layer film can be used for the first electrode C1(g), the second electrode C2(h), the control line CL(g), or the signal line ML(h), for example. Specifically, a film in which the conductive film CL(g)A and a dark-colored film CL(g)B are stacked so that the conductive film CL(g)A is sandwiched between the dark-colored film CL(g)B and the circuit 530(i, j) can be used.

A film having a lower reflectivity with respect to visible light than the conductive film CL(g)A can be used as the dark-colored film CL(g)B, for example. Thus, reflection of visible light due to the first electrode C1(g), the second electrode C2(h), the control line CL(g), or the signal line ML(h) can be reduced. Consequently, display of the display element 550 is easily observed, so that favorable display can be obtained. In addition, the thickness of the semiconductor device can be reduced. Moreover, stress caused in the base 570 or the like when the semiconductor device is bent can be reduced.

For example, the material which can be used for the terminal 519D, the wiring 511, the scan line G(i), the signal line S(j), the wiring ANO, the wiring VCOM, or the like can be used for the conductive film CL(g)A.

A film containing cupric oxide or a film containing copper chloride or tellurium chloride can be used as the dark-colored film CL(g)B, for example.

The proximity sensor 575 includes an insulating film 571 between the wiring BR(g, h) and the signal line ML(h). Thus, a short circuit between the wiring BR(g, h) and the signal line ML(h) can be prevented.

<<Insulating Film 572>>

The material which can be used for the second insulating film 501B can be used for the insulating film 572, for example.

Note that the semiconductor device 500D includes a terminal which can be formed in the same step as the terminal 519D. The control line CL(g) or the signal line ML(h) is electrically connected to the terminal. Thus, for example, the control line CL(g) can receive a control signal and the signal line ML(h) can supply a sensing signal.

<Structure Example 5 of Semiconductor Device>

Another structure of the semiconductor device of one embodiment of the present invention will be described with reference to FIG. 26 and FIGS. 27A to 27C.

FIG. 26 and FIGS. 27A to 27C illustrate the structure of a semiconductor device 500E of one embodiment of the present invention, specifically, the structure of a display panel provided with a proximity sensor.

Figure 26:
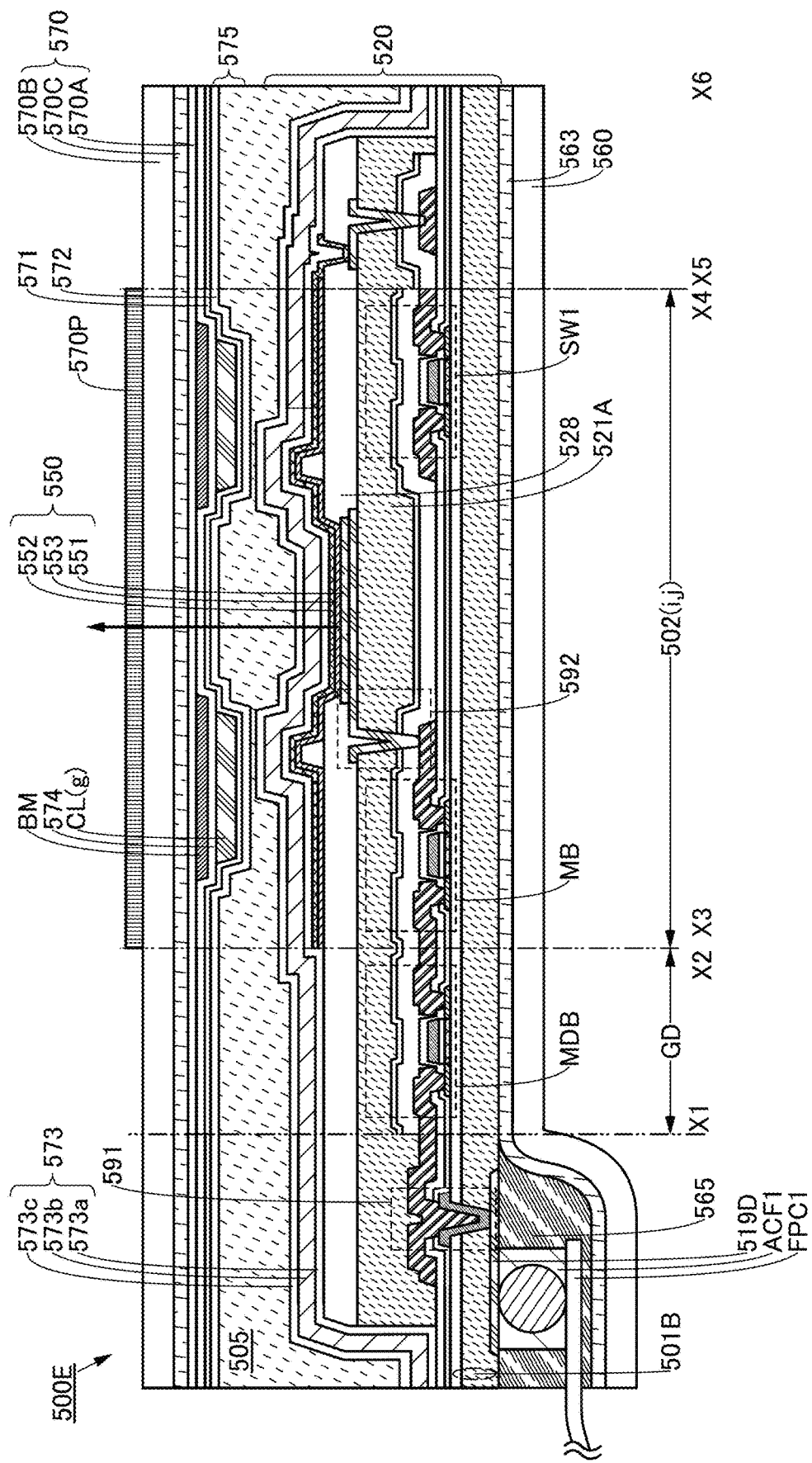
FIG. 26 is a cross-sectional view illustrating the structure of a semiconductor device according to one embodiment of the present invention.

FIG. 26 is a cross-sectional view of the semiconductor device 500E, which is one embodiment of the present invention, taken along the section lines X1-X2, X3-X4, and X5-X6 in FIG. 1A.

Figure 27B:
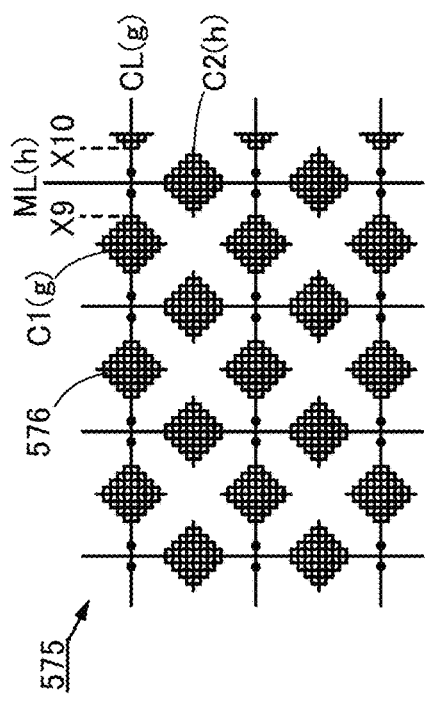
FIGS. 27A to 27C illustrate the structure of a semiconductor device according to one embodiment of the present invention.
Figure 27C:
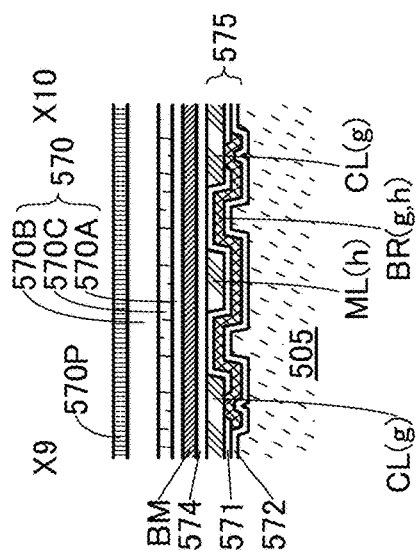
Figure 27A:
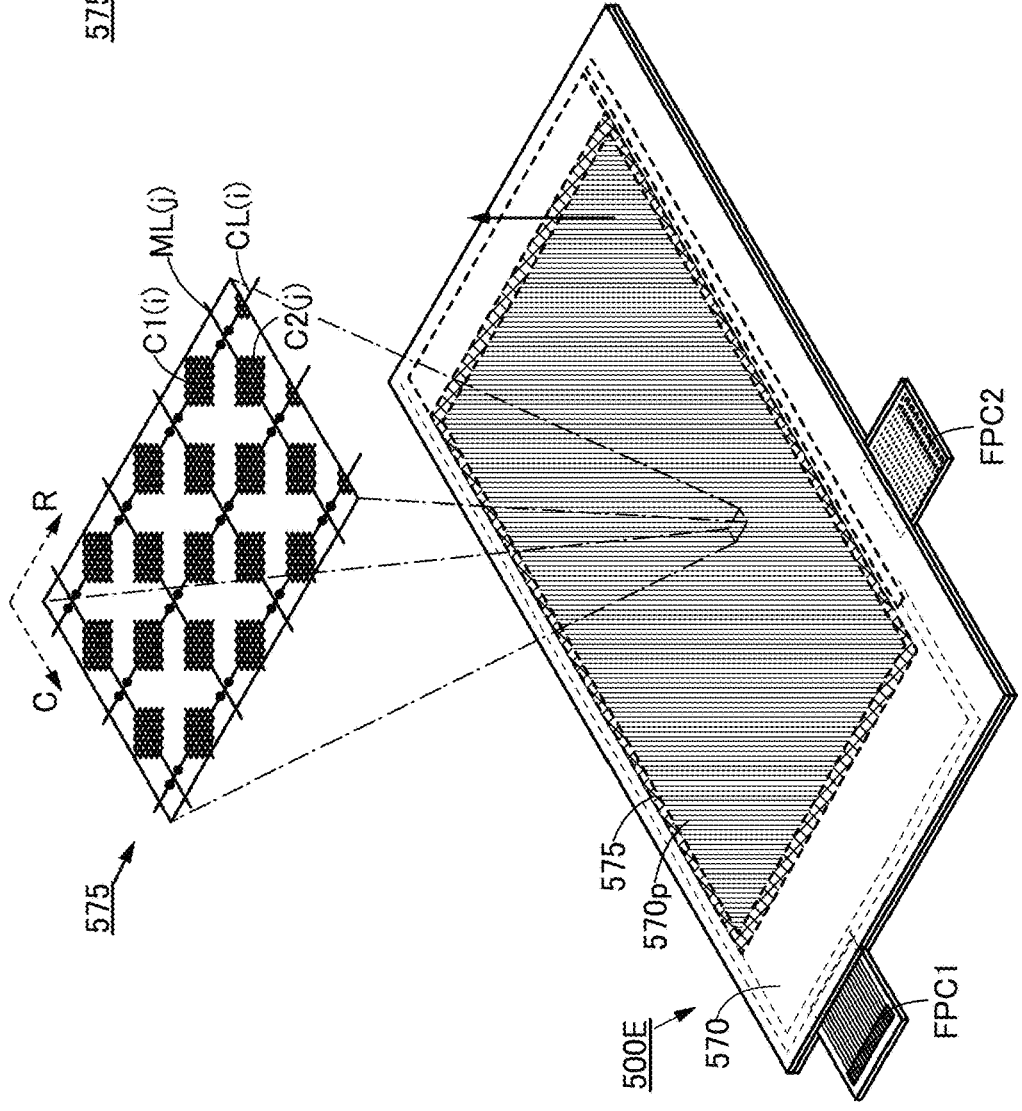

FIG. 27A is a projection view of a positional information input panel of one embodiment of the present invention. Note that for convenience of description, part of the positional information input panel is enlarged. FIG. 27B is a top view of a proximity sensor of the positional information input panel. FIG. 27C is a cross-sectional view taken along the section line X9-X10 in FIG. 27B.

The semiconductor device 500E is different from the semiconductor device 500B described with reference to FIGS. 4A to 4C in that the proximity sensor 575, the insulating film 572, a light-blocking film BM, and an insulating film 574 are provided. Different structures will be described in detail below, and the above description is referred to for the other similar structures.

The proximity sensor 575 includes a region sandwiched between the base 570 and the functional layer 520.

The light-blocking film BM includes a region sandwiched between the base 570 and the proximity sensor 575.

The insulating film 574 includes a region sandwiched between the proximity sensor 575 and the light-blocking film BM.

<<Proximity Sensor 575>>

For example, the first electrode C1(g) and the second electrode C2(h) can be used for the proximity sensor 575 (see FIGS. 27A and 27B). The second electrode C2(h) has a portion not overlapping with the first electrode C1(g). Note that each of g and h is a natural number of 1 or more.

Specifically, the proximity sensor 575 includes the first electrode C1(g) electrically connected to the control line CL(g) extended in a row direction (a direction indicated by the arrow R in FIG. 27A) and the second electrode C2(h) electrically connected to the signal line ML(h) extended in a column direction intersecting with the row direction (a direction indicated by the arrow C in FIG. 27A).

For the first electrode C1(g) or the second electrode C2(h), a conductive film whose light-transmitting regions overlap with the pixel 502(i,j) can be used, for example.

For the first electrode C1(g) or the second electrode C2(h), a net-like conductive film whose openings 576 overlap with the pixel 502(i,j) can be used, for example.

The control line CL(g) is provided with the wiring BR(g, h). In the wiring BR(g, h), the control line CL(g) intersects with the signal line ML(h) (see FIG. 27C).

The material which can be used for the terminal 519D, the wiring 511, the scan line G(i), the signal line S(j), the wiring ANO, the wiring VCOM, or the like can be used for the first electrode C1(g), the second electrode C2(h), the control line CL(g), or the signal line ML(h), for example.

The proximity sensor 575 includes the insulating film 571 between the wiring BR(g, h) and the signal line ML(h). Thus, a short circuit between the wiring BR(g, h) and the signal line ML(h) can be prevented.

<<Insulating Film 572 and Insulating Film 574>>

The material which can be used for the second insulating film 501B can be used for the insulating film 572 or the insulating film 574, for example.

<<Light-Blocking Film BM>>

A film having a lower reflectivity with respect to visible light than the proximity sensor 575 can be used as the light-blocking film BM, for example. Thus, reflection of visible light due to the first electrode C1(g), the second electrode C2(h), the control line CL(g), the signal line ML(h), or the like can be reduced.

For example, a light-blocking material can be used for the light-blocking layer BM.

Specifically, a resin in which a pigment is dispersed, a resin containing a dye, or the like can be used for the light-blocking film BM. For example, a resin in which carbon black is dispersed can be used.

Specifically, an inorganic compound, an inorganic oxide, a composite oxide containing a solid solution of a plurality of inorganic oxides, or the like can be used. A black chromium film, a film containing cupric oxide, or a film containing copper chloride or tellurium chloride can be used, for example.

The semiconductor device 500E includes the insulating film 572 between the bonding layer 505 and the proximity sensor 575. The material which can be used for the second insulating film 501B can be used for the insulating film 572, for example.

<<Base 570>>

A stacked-layer material in which a plurality of layers are stacked can be used for the base 570. For example, a stacked-layer material in which a base, an insulating film that prevents diffusion of impurities contained in the base, and the like are stacked can be used for the base 570.

Specifically, an insulating film 570A, a base 570B, or a resin 570C can be used for the base 570. The base 570B includes a region overlapping with the insulating film 570A, and the resin 570C has a function of bonding the insulating film 570A and the base 570B.

A stacked-layer material in which one or a plurality of films that are selected from a silicon oxide layer, a silicon nitride layer, a silicon oxynitride layer, and the like are stacked can be used for the insulating film 570A.

For example, a glass substrate; a resin film or resin plate of polyester, polyolefin, polyamide, polyimide, polycarbonate, an acrylic resin, or the like; a stack thereof; or the like can be used as the base 570B.

The material which can be used for the bonding layer 505 can be used for the resin 570C, for example.

Note that the semiconductor device 500E includes a terminal which can be formed in the same step as the control line CL(g), the signal line ML(h), or the like between the base 570 and the bonding layer 505. The control line CL(g) or the signal line ML(h) is electrically connected to the terminal. Thus, for example, the control line CL(g) can receive a control signal and the signal line ML(h) can supply a sensing signal.

<Structure Example 6 of Semiconductor Device>

Another structure of the semiconductor device of one embodiment of the present invention will be described with reference to FIG. 28 and FIGS. 29A to 29C.

FIG. 28 and FIGS. 29A to 29C illustrate the structure of a semiconductor device 500F of one embodiment of the present invention, specifically, the structure of a display panel provided with a proximity sensor.

Figure 28:
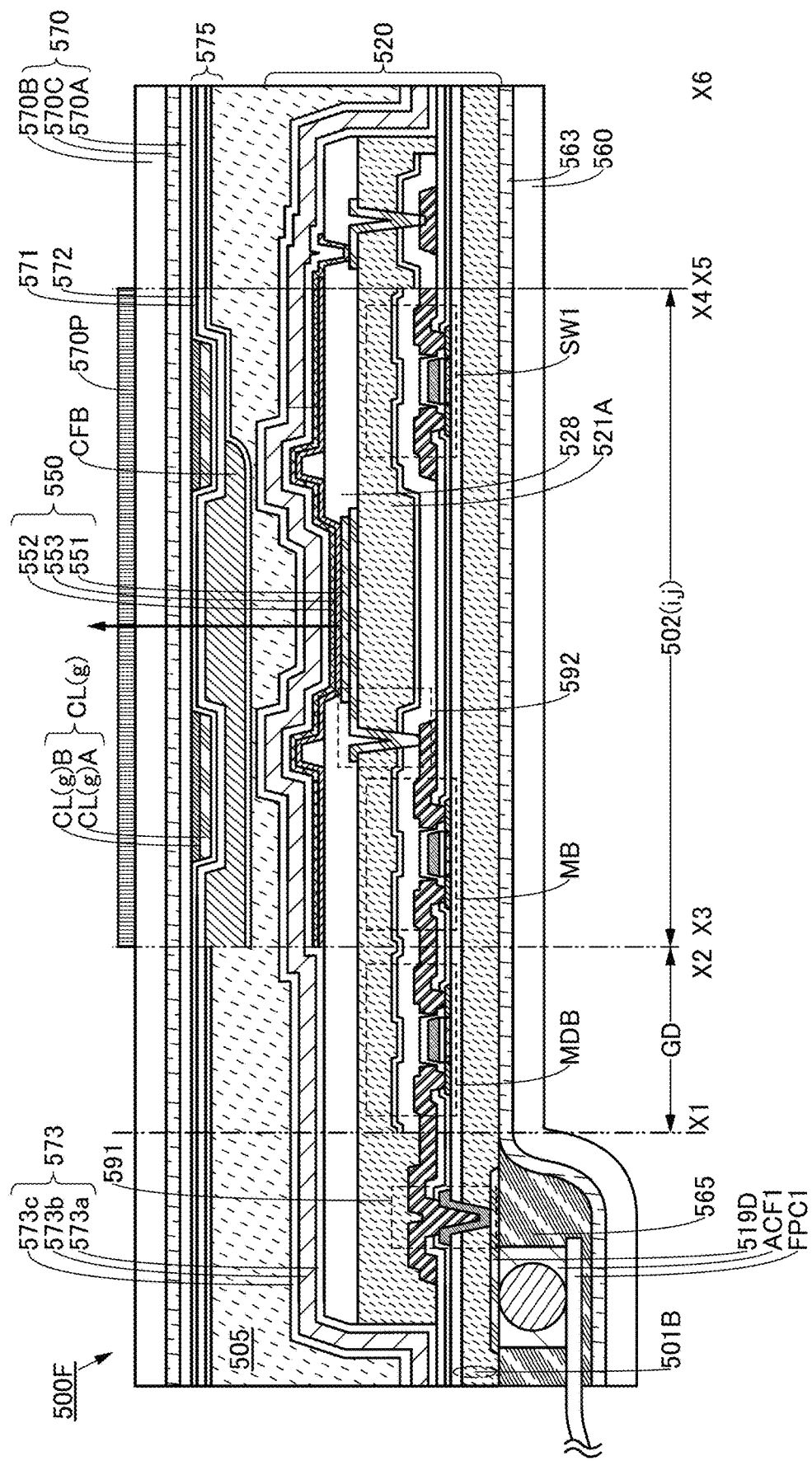
FIG. 28 is a cross-sectional view illustrating the structure of a semiconductor device according to one embodiment of the present invention.

FIG. 28 is a cross-sectional view of the semiconductor device 500F, which is one embodiment of the present invention, taken along the section lines X1-X2, X3-X4, and X5-X6 in FIG. 1A.

FIG. 29A is a projection view of a positional information input panel of one embodiment of the present invention. Note that for convenience of description, part of the positional information input panel is enlarged. FIG. 29B is a top view of a proximity sensor of the positional information input panel. FIG. 29C is a cross-sectional view taken along the section line X9-X10 in FIG. 29B.

The semiconductor device 500F is different from the semiconductor device 500E with reference to FIG. 26 in that a stacked-layer film in which the conductive film CL(g)A and the dark-colored film CL(g)B are stacked is provided. Different structures will be described in detail below, and the above description is referred to for the other similar structures.

The proximity sensor 575 includes a region sandwiched between the base 570 and the functional layer 520.

The conductive film CL(g)A includes a region sandwiched between the dark-colored film CL(g)B and the circuit 530(i, j). The dark-colored film CL(g)B has a lower reflectivity with respect to visible light than the conductive film CL(g)A. Thus, the intensity of visible light reflected by the first electrode C1(g), the second electrode C2(h), the control line CL(g), or the signal line ML(h) can be decreased without the light-blocking film BM. Consequently, the number of materials to be used can be reduced. Display of the display element 550 is easily observed, so that favorable display can be obtained. The thickness of the semiconductor device 500F can be reduced. Stress caused in the insulating film 570A or the like when the semiconductor device 500F is bent can be reduced.

The semiconductor device 500F includes a coloring layer CFB and a coloring layer CFG. The coloring layer CFB and the coloring layer CFG each include a region sandwiched between the base 570 and the functional layer 520.

The material which can be used for the coloring film CF can be used for the coloring layer CFB and the coloring layer CFG, for example.

This embodiment can be combined with any of the other embodiments in this specification as appropriate.

Embodiment 2

In this embodiment, a method for manufacturing a semiconductor device of one embodiment of the present invention will be described with reference to FIG. 5, FIGS. 6A1 to 6D2, and FIGS. 7A1 to 7D2.

Figure 5:
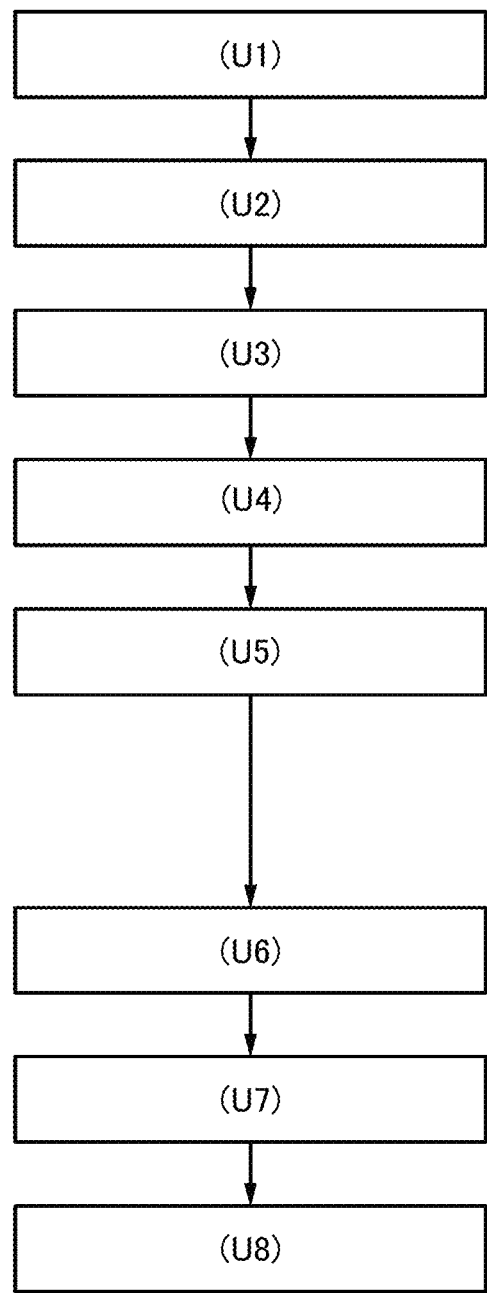
FIG. 5 is a flow chart showing a method for manufacturing a semiconductor device according to one embodiment of the present invention.

FIG. 5 is a flow chart showing the method for manufacturing a semiconductor device of one embodiment of the present invention. FIGS. 6A1 to 6D2 and FIGS. 7A1 to 7D2 illustrate the method for manufacturing a semiconductor device of one embodiment of the present invention.

FIGS. 6A2, 6B2, 6C2, and 6D2 are each a top view of members during the manufacturing process of the semiconductor device. FIG. 6A1 is a cross-sectional view taken along the section line W1-W2 in FIG. 6A2. FIG. 6B1 is a cross-sectional view taken along the section line W1-W2 in FIG. 6B2. FIG. 6C1 is a cross-sectional view taken along the section line W1-W2 in FIG. 6C2. FIG. 6D1 is a cross-sectional view taken along the section line W1-W2 in FIG. 6D2.

FIGS. 7A2, 7C2, and 7D2 are each a top view of members during the manufacturing process of the semiconductor device. FIGS. 7A1 and 7B are cross-sectional views taken along the section line W1-W2 in FIG. 7A2. FIG. 7C1 is a cross-sectional view taken along the section line W1-W2 in FIG. 7C2. FIG. 7D1 is a cross-sectional view taken along the section line W1-W2 in FIG. 7D2.

<Example of Manufacturing Method>

The method for manufacturing a semiconductor device described in this embodiment includes the following eight steps (see FIG. 5).

The semiconductor device described in this embodiment includes a second insulating film 13b having an opening, a first connection portion 13c penetrating the opening, a terminal 13a which is in contact with one surface of the second insulating film 13b and is electrically connected to the first connection portion 13c, and a circuit 13d which is electrically connected to the first connection portion 13c on the opposite surface of the second insulating film 13b (see FIGS. 7D1 and 7D2). The terminal 13a includes a region embedded in the second insulating film 13b and a region not covered with the second insulating film 13b. The circuit 13d includes a semiconductor element.

<<First Step>>

In the first step, a first insulating film 13e is formed over a substrate 11 for use in manufacturing processes (see U1 in FIG. 5).

For example, the first insulating film 13e is formed so that a separation film 12 formed over the substrate 11 is sandwiched between the first insulating film 13e and the substrate 11.

A material with which the first insulating film 13e can be separated from the separation film 12 in a later step can be used for the separation film 12. Alternatively, a material with which the substrate 11 can be separated from the separation film 12 can be used for the separation film 12.

Specifically, a film containing tungsten oxide can be used as the separation film 12, and a film containing silicon oxide can be used as the first insulating film 13e. Alternatively, a material containing polyimide can be used for the separation film 12.

A non-alkali glass substrate can be used as the substrate 11 for use in manufacturing processes, for example.

For example, a film containing tungsten oxide can be formed on a surface of a film containing tungsten by thermal oxidation treatment, oxygen plasma treatment, plasma treatment with a nitrous oxide ($N_2O$) gas, or treatment with a solution having strong oxidizing power such as ozone water. Furthermore, a film containing silicon oxide used as the first insulating film 13e is heated while being in contact with the film containing tungsten oxide which is used as the separation film 12.

For example, a film containing monomer is formed and heated to form a film containing polyimide.

<<Second Step>>

In the second step, the terminal 13a is formed to include a region overlapping with the first insulating film 13e (see U2 in FIG. 5 and FIGS. 6A1 and 6A2).

<<Third Step>>

In the third step, the second insulating film 13b having the opening is formed to have one surface in contact with the terminal 13a and embedded part of the terminal 13a therein (see U3 in FIG. 5 and FIGS. 6B1 and 6B2).

<<Fourth Step>>

In the fourth step, the first connection portion 13c penetrating the opening is formed to be electrically connected to the terminal 13a (see U4 in FIG. 5).

<<Fifth Step>>

In the fifth step, the circuit 13d is formed to be electrically connected to the first connection portion 13c on the opposite surface of the second insulating film 13b (see U5 in FIG. 5 and FIGS. 6C1 and 6C2).

<<Sixth Step>>

In the sixth step, a base 42 including a flexible region is stacked so that the circuit 13d is provided between the second insulating film 13b and the flexible region (see U6 in FIG. 5 and FIGS. 6D1 and 6D2).

Specifically, the base 42 including a flexible region and the circuit 13d are bonded together with a bonding layer 30.

<<Seventh Step>>

In the seventh step, the substrate 11 for use in manufacturing processes is separated (see U7 in FIG. 5 and FIGS. 7C1 and 7C2).

For example, part of the first insulating film 13e is separated from the substrate 11 by a method for cutting or piercing the first insulating film 13e from the substrate 11 side with a blade which has a sharp tip or the like or by a method using laser (specifically, a laser ablation method). Thus, a separation starting point 91S can be formed (see FIGS. 7A1 and 7A2).

Separation of the substrate 11 from the first insulating film 13e is gradually performed from the separation starting point 91S, so that the substrate 11 is separated from the first insulating film 13e (see FIG. 7B).

Note that the separation may be performed while the vicinity of the interface between the separation film 12 and the first insulating film 13e is irradiated with ions to remove static electricity. Specifically, the ions may be generated by an ionizer.

Furthermore, the first insulating film 13e may be separated from the separation film 12 by injecting a liquid into the interface between them. Alternatively, a liquid may be ejected and sprayed by a nozzle 99. For example, as the liquid to be injected or the liquid to be sprayed, water, a polar solvent, or the like can be used. Alternatively, a liquid which dissolves the separation film 12 may be used.

By injecting the liquid, an influence of static electricity and the like generated with the separation can be reduced.

In particular, when the first insulating film 13e is separated from the separation film 12 containing tungsten oxide, a liquid containing water is injected or sprayed. Thus, stress applied to the first insulating film 13e during the separation can be relieved.

<<Eighth Step>>

In the eighth step, the first insulating film 13e is removed so that the terminal 13a is exposed (see U8 in FIG. 5 and FIGS. 7D1 and 7D2).

For example, the first insulating film 13e can be removed by etching or chemical mechanical polishing. Specifically, wet etching, dry etching, or the like can be employed.

Through the first to eighth steps, the semiconductor device of one embodiment of the present invention can be manufactured (see FIGS. 7D1 and 7D2). Thus, the circuit 13d including a semiconductor element and the terminal 13a electrically connected to the circuit 13d are formed with the substrate 11 for use in manufacturing processes, and the substrate 11 can be separated from the circuit 13d and the terminal 13a so that the terminal 13a is exposed. It is thus possible to provide a method for manufacturing a novel semiconductor device that is highly convenient or reliable.

This embodiment can be combined with any of the other embodiments in this specification as appropriate.

Embodiment 3

In this embodiment, a method for manufacturing a semiconductor device of one embodiment of the present invention will be described with reference to FIG. 8, FIG. 9, FIG. 10, FIG. 11, FIG. 12, FIG. 13, and FIG. 14.

Figure 8:
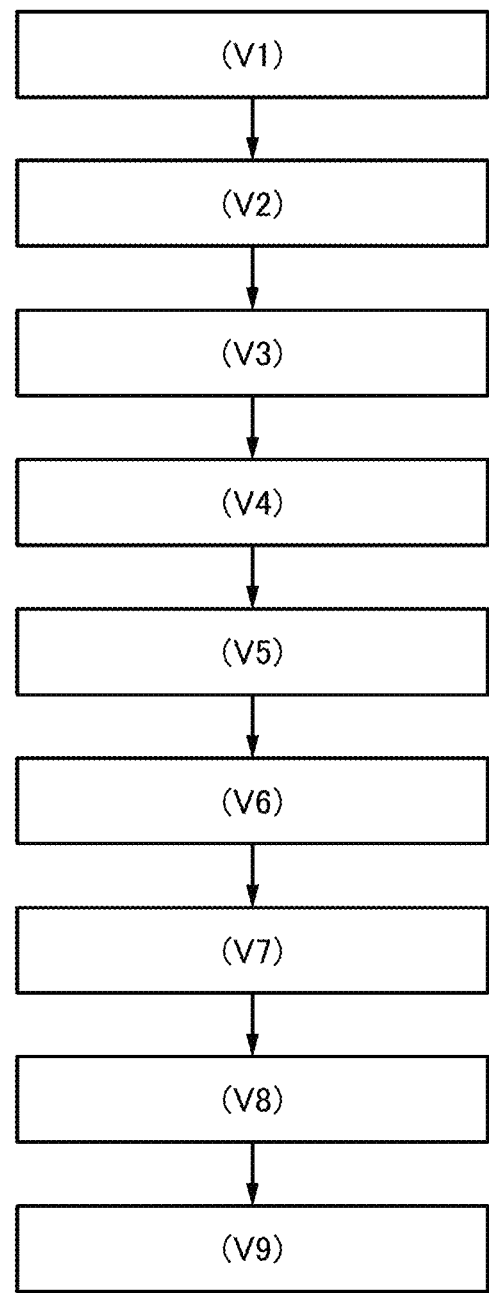
FIG. 8 is a flow chart showing a method for manufacturing a semiconductor device according to one embodiment of the present invention.

FIG. 8 is a flow chart showing the method for manufacturing a semiconductor device of one embodiment of the present invention. FIG. 9, FIG. 10, FIG. 11, FIG. 12, FIG. 13, and FIG. 14 illustrate the method for manufacturing a semiconductor device of one embodiment of the present invention.

FIG. 9, FIG. 10, FIG. 11, FIG. 12, FIG. 13, and FIG. 14 are cross-sectional views of members during the manufacturing process of the semiconductor device 500 taken along the section lines X1-X2, X3-X4, and X5-X6 in FIG. 1A.

<Example of Manufacturing Method>

A method for manufacturing a semiconductor device described in this embodiment includes the following nine steps (see FIG. 8).

Figure 14:
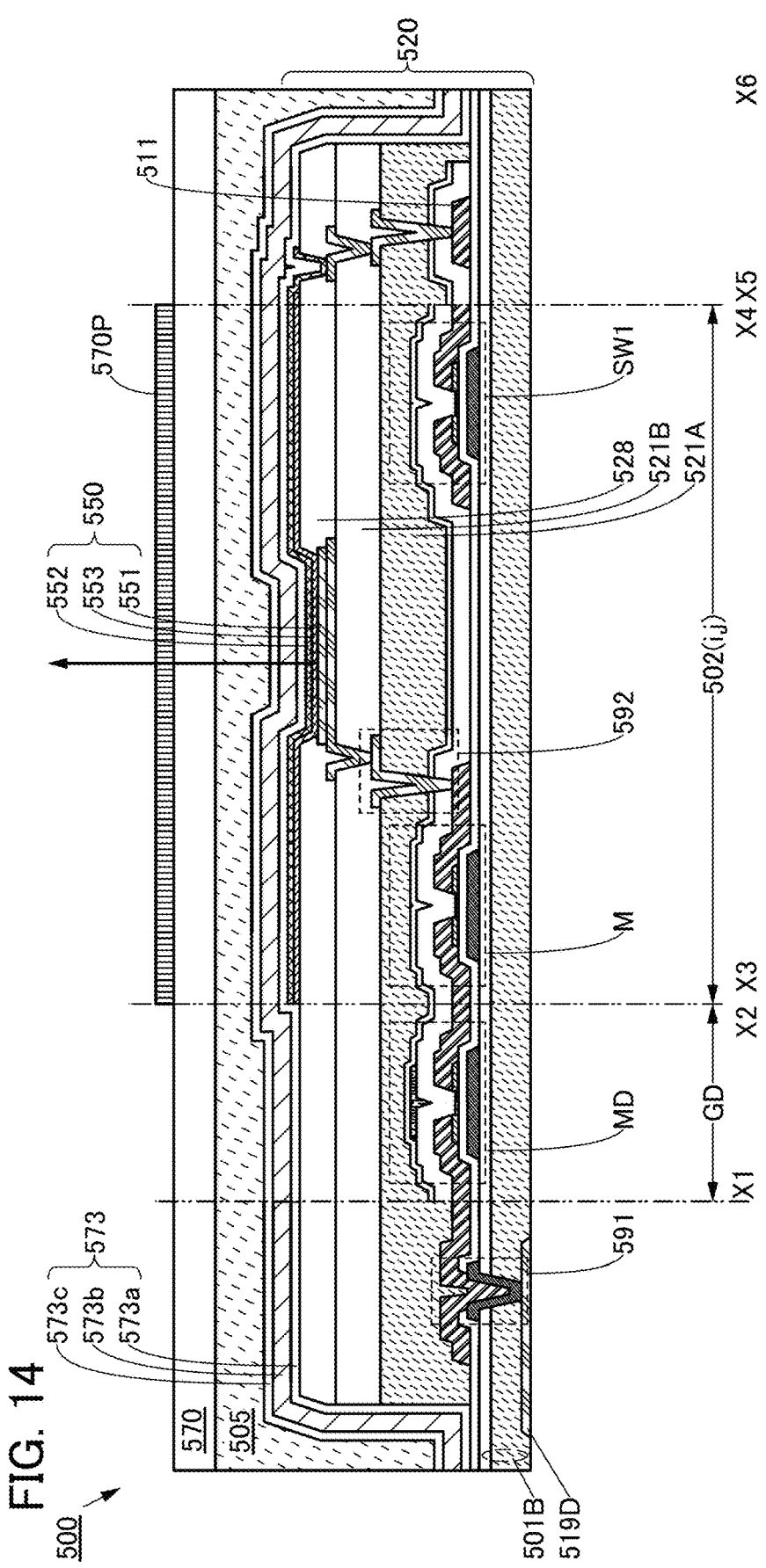
FIG. 14 is a cross-sectional view illustrating a method for manufacturing a semiconductor device according to one embodiment of the present invention.

The semiconductor device 500 described in this embodiment includes the second insulating film 501B having an opening, the first connection portion 591 penetrating the opening, the terminal 519D which is in contact with one surface of the second insulating film 501B and is electrically connected to the first connection portion 591, and the circuit 530($i, j$) which is electrically connected to the first connection portion 591 on the opposite surface of the second insulating film 501B (see FIG. 14). The circuit 530($i, j$) includes the transistor M, for example. The base 570 including a region overlapping with the second insulating film 501B is provided. The display element 550 electrically connected to the circuit 530($i, j$) is provided.

The terminal 519D includes a region embedded in the second insulating film 501B and a region not covered with the second insulating film 501B.

The thickness of the second insulating film 501B is greater than or equal to 3 nm and less than or equal to 1500 nm, preferably greater than or equal to 10 nm and less than or equal to 1200 nm, more preferably greater than or equal to 100 nm and less than or equal to 1000 nm, still more preferably greater than or equal to 300 nm and less than or equal to 800 nm.

The base 570 includes a flexible region or a bent region.

The circuit 530($i, j$) includes a semiconductor element and is provided between the second insulating film 501B and the flexible region or between the second insulating film 501B and the bent region.

The display element 550 is provided between the second insulating film 501B and the flexible region or between the second insulating film 501B and the bent region.

The semiconductor device 500 described in this embodiment includes the pixel 502($i,j$) provided with the circuit 530($i, j$) and the display element 550 electrically connected to the circuit 530($i, j$) (see FIGS. 1A and 1B). The semiconductor device 500 including the display element 550 can also be referred to as a display panel.

<<First Step>>

In the first step, a first insulating film 501A is formed over a substrate 510 for use in manufacturing processes (see V1 in FIG. 8).

A non-alkali glass substrate can be used as the substrate 510 for use in manufacturing processes, for example.

A film in which a surface of a tungsten film formed over the substrate 510 for use in manufacturing processes is subjected to plasma treatment with a nitrous oxide ($N_2O$) gas can be used as a separation film 510W.

A film containing a stacked-layer material of a 600-nm-thick silicon oxynitride film and a 200-nm-thick silicon nitride film can be used as the first insulating film 501A.

A film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the first insulating film 501A.

<<Second Step>>

In the second step, the terminal 519D is formed to have a region overlapping with the first insulating film 501A (see V2 in FIG. 8).

<<Third Step>>

In the third step, the second insulating film 501B having an opening is formed to have one surface in contact with the terminal 519D and embedded part of the terminal 519D therein (see V3 in FIG. 8).

A material with which the first insulating film 501A can be selectively removed in a later step is used for the second insulating film 501B.

The second insulating film 501B is in contact with a side surface and a rear surface of the terminal 519D because the second insulating film 501B is formed after the terminal 519D is formed. Thus, the terminal 519D partly has a region embedded in the second insulating film 501B.

Although a stack of films is used as the second insulating film 501B in this embodiment, a single film may be used as the second insulating film 501B.

<<Fourth Step>>

Figure 9:
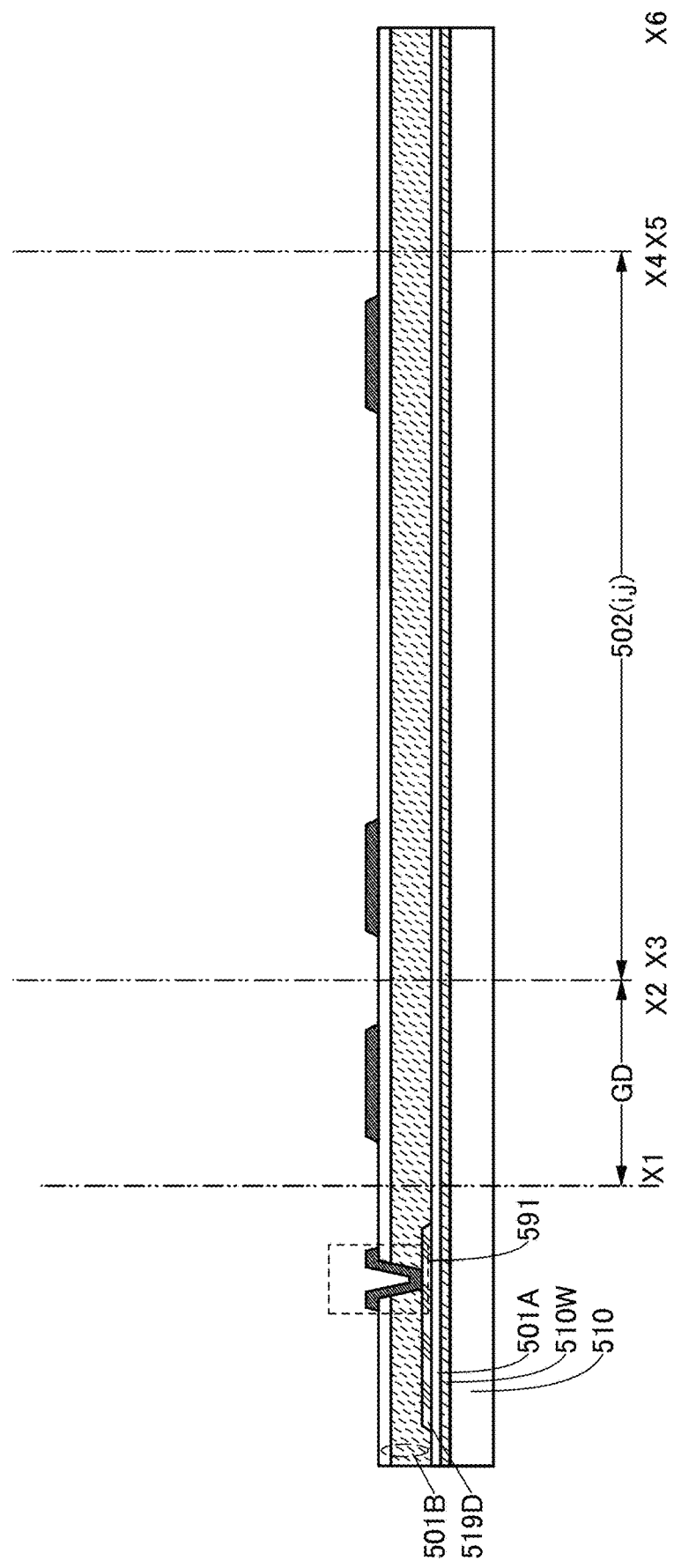
FIG. 9 is a cross-sectional view illustrating a method for manufacturing a semiconductor device according to one embodiment of the present invention.

In the fourth step, the first connection portion 591 penetrating the opening is formed to be electrically connected to the terminal 519D (see V4 in FIG. 8 and FIG. 9).

<<Fifth Step>

Figure 10:
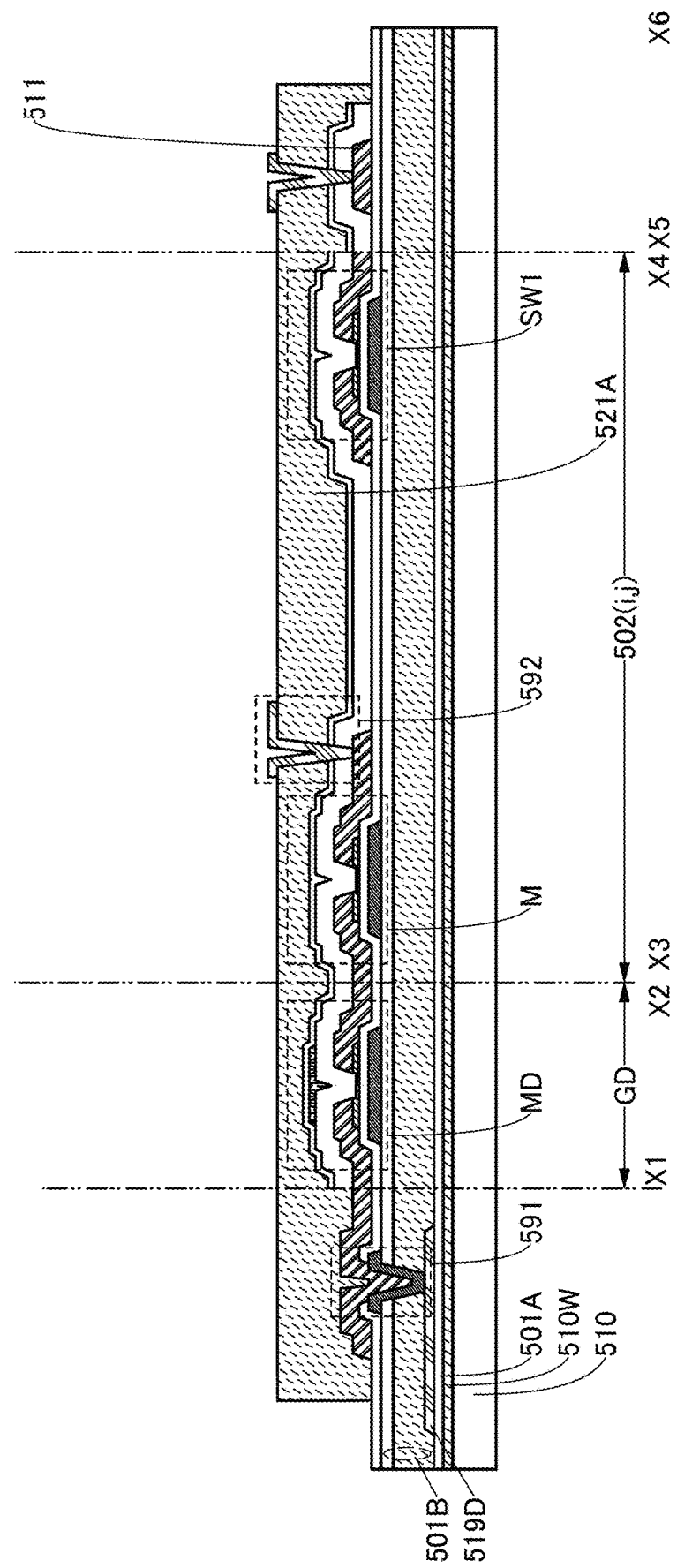
FIG. 10 is a cross-sectional view illustrating a method for manufacturing a semiconductor device according to one embodiment of the present invention.

In the fifth step, the circuit 530(i, j) is formed to be electrically connected to the first connection portion 591 on the opposite surface of the second insulating film 501B (see V5 in FIG. 8 and FIG. 10). The second connection portion 592 which is to be electrically connected to the display element 550 formed in a later step is formed.

For example, the circuit 530(i, j) can include the switch SW1 or the transistor M.

Furthermore, the driver circuit GD can be formed in steps for forming the circuit 530(1, j). For example, the transistor MD can be used in the driver circuit GD.

<<Sixth Step>>

Figure 11:
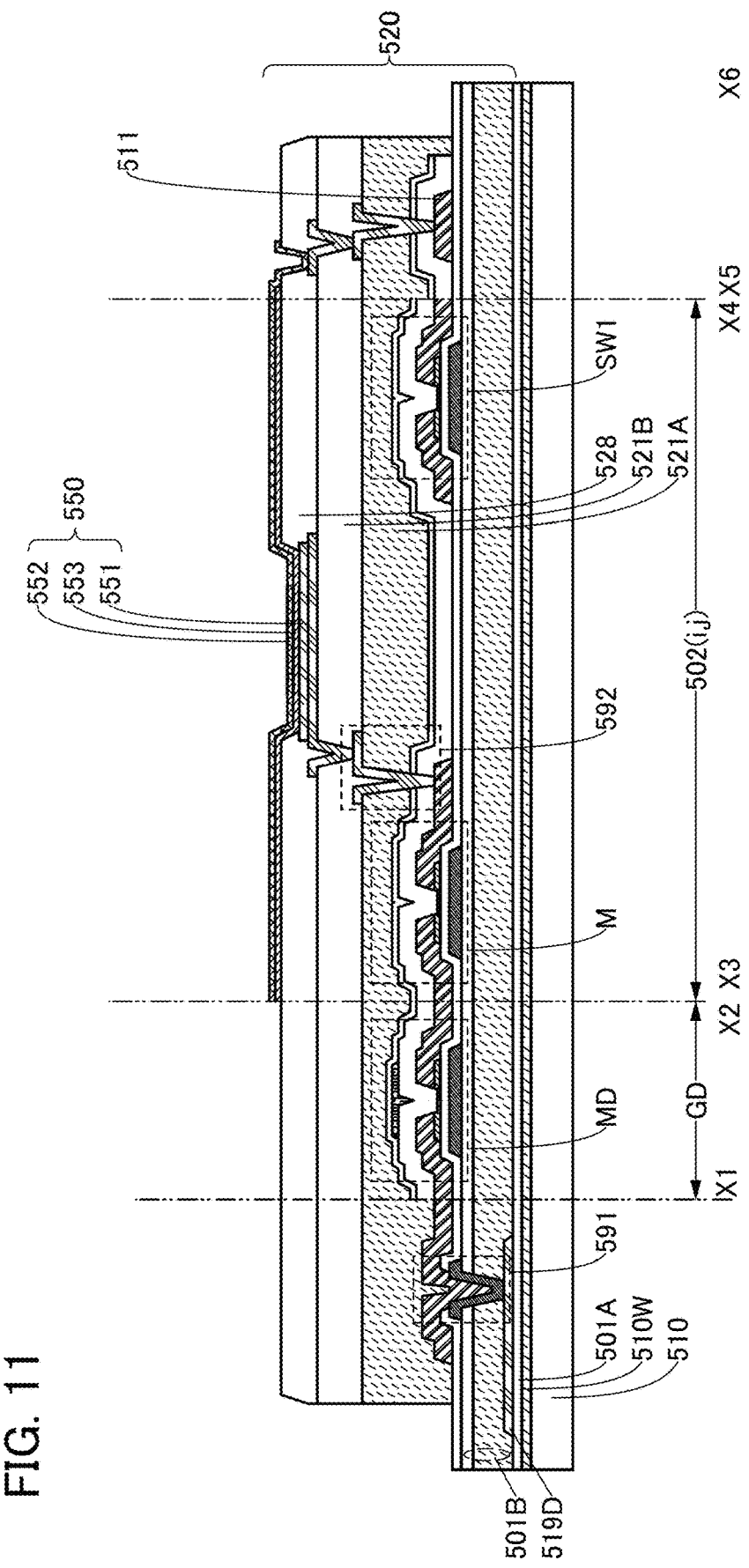
FIG. 11 is a cross-sectional view illustrating a method for manufacturing a semiconductor device according to one embodiment of the present invention.

In the sixth step, the display element 550 is formed to be electrically connected to the circuit 530(i,j) (see V6 in FIG. 8 and FIG. 11). Thus, the functional layer 520 is formed.

Note that the protective film 573 for protecting the functional layer 520 can be formed. For example, a film containing an inorganic material, a film containing an organic material, and a film containing an inorganic material can be used as the protective film 573a, the protective film 573b, and the protective film 573c, respectively. Specifically, the protective film 573 can be formed by an atomic layer deposition method, a chemical vapor deposition method, a sputtering method, a printing method, or the like.

The protective film 573 having less defects such as pinholes and pores can be formed by an atomic layer deposition method.

The protective film 573 is not in contact with the terminal 519D because the protective film 573 is formed in a state where the terminal 519D is covered with the first insulating film 501A and the like. Thus, the terminal 519D can be easily exposed in a later step for removing the first insulating film 501A.

<<Seventh Step>>

Figure 12:
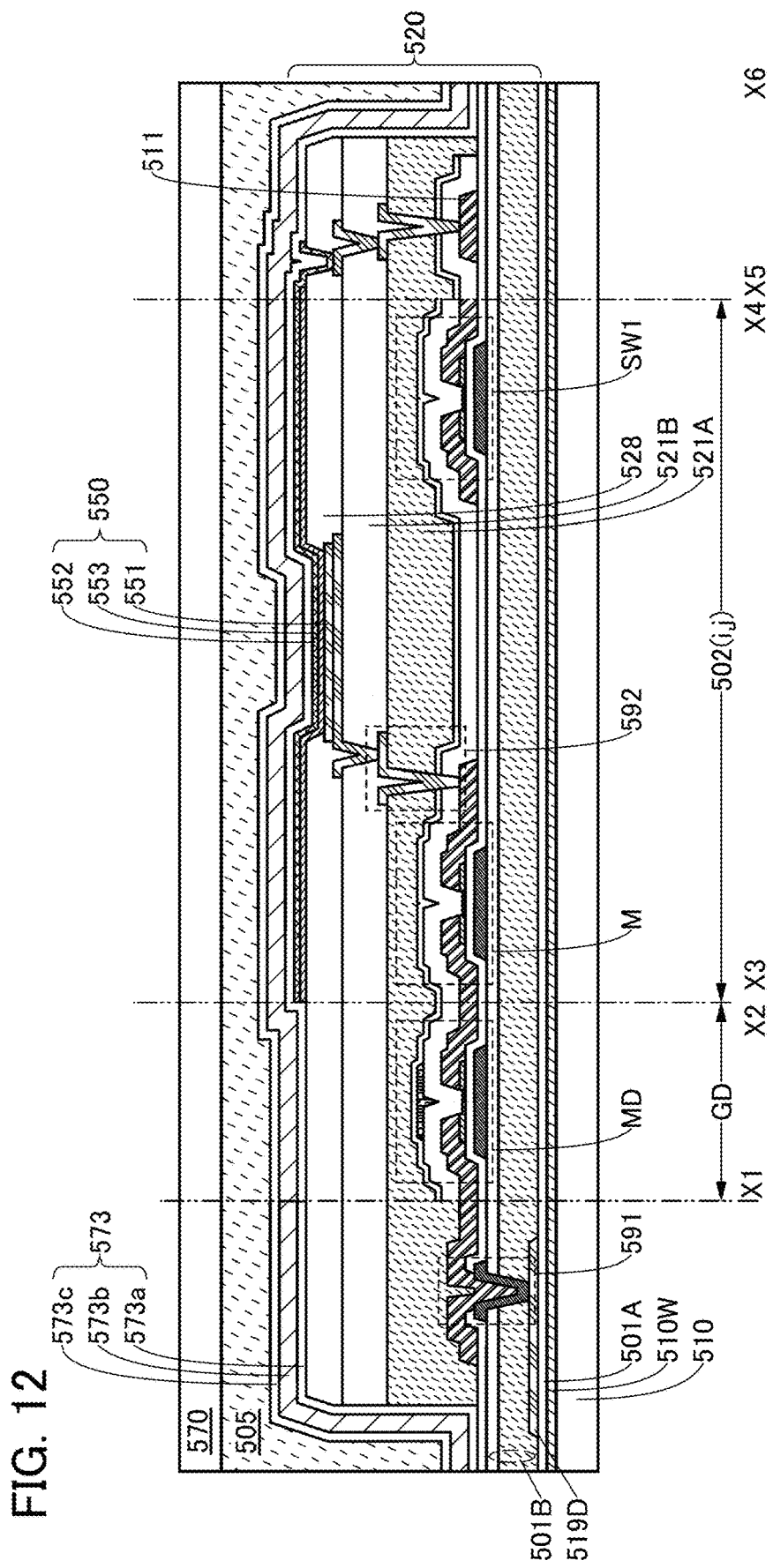
FIG. 12 is a cross-sectional view illustrating a method for manufacturing a semiconductor device according to one embodiment of the present invention.

In the seventh step, the base 570 including the flexible region or the bent region is stacked so that the circuit 530(i, j) is positioned between the second insulating film 501B and the flexible region or between the second insulating film 501B and the bent region (see V7 in FIG. 8 and FIG. 12).

For example, the bonding layer 505 is formed in a state of having fluidity and a flexible film used as the base 570 and the functional layer 520 are bonded together, so that the bonding layer 505 is cured.

<<Eighth Step>>

Figure 13:
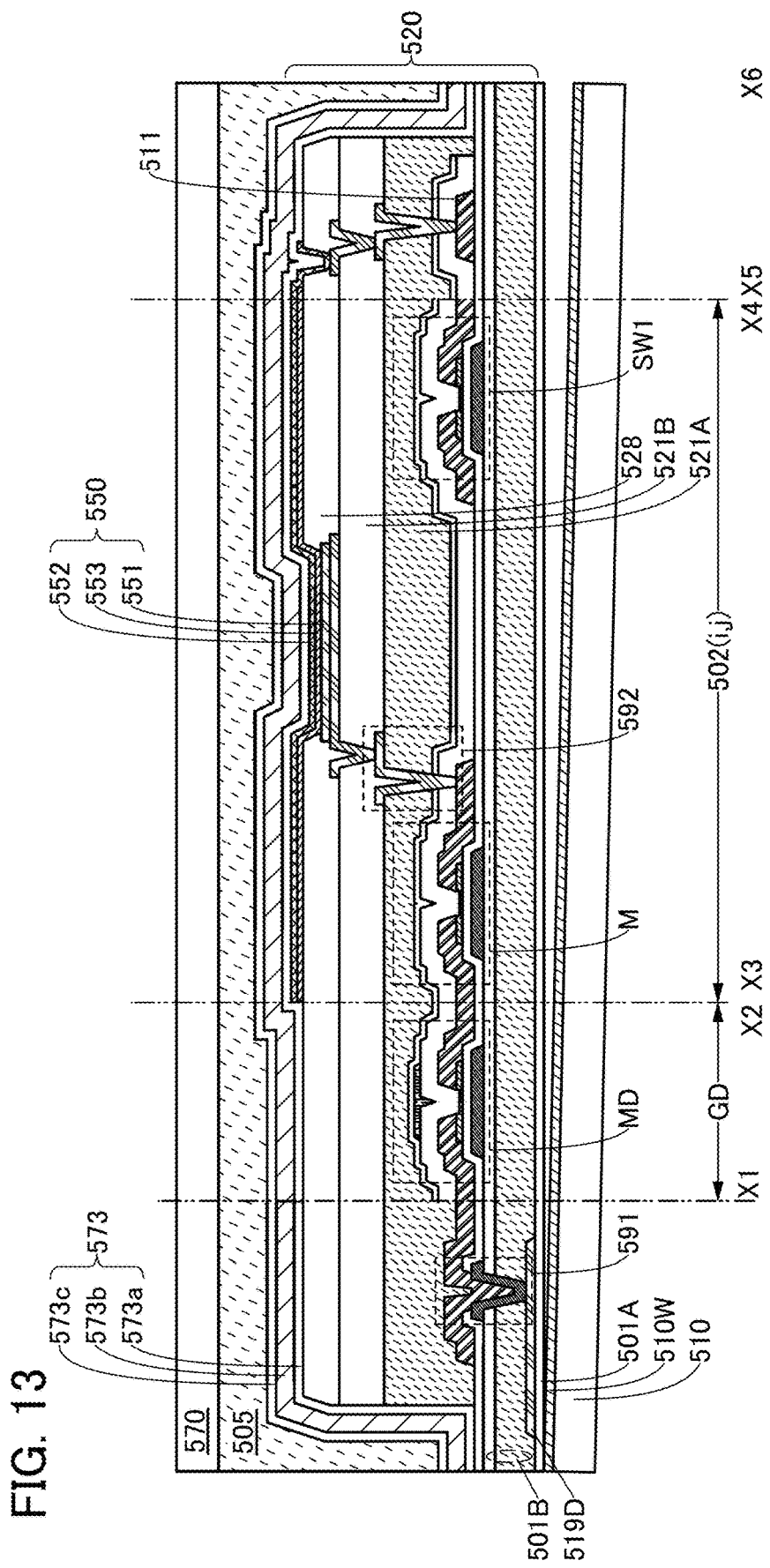
FIG. 13 is a cross-sectional view illustrating a method for manufacturing a semiconductor device according to one embodiment of the present invention.

In the eighth step, the substrate for use in manufacturing processes is separated (V8 in FIG. 8 and FIG. 13).

For example, part of the first insulating film 501A is separated from the substrate 510 by a method for cutting or piercing the first insulating film 501A from the base 570 side with a blade which has a sharp tip or the like or by a method using laser (specifically, a laser ablation method). Thus, a separation starting point can be formed.

Separation of the substrate 510 from the first insulating film 501A is gradually performed from the separation starting point, so that the substrate 510 is separated from the first insulating film 501A.

<<Ninth Step>>

In the ninth step, the first insulating film 501A is removed so that the terminal 519D is exposed (see V9 in FIG. 8 and FIG. 14).

For example, the first insulating film 501A can be removed by etching or chemical mechanical polishing. Specifically, wet etching, dry etching, or the like can be employed.

Through the first to ninth steps, the semiconductor device of one embodiment of the present invention can be manufactured (see FIG. 14). Thus, the circuit including the semiconductor element, the display element electrically connected to the circuit, and the terminal electrically connected to the circuit are formed with the substrate for use in manufacturing processes, and the substrate can be separated from the circuit, the display element, and the terminal so that the terminal is exposed. It is thus possible to provide a method for manufacturing a novel semiconductor device that is highly convenient or reliable.

This embodiment can be combined with any of the other embodiments in this specification as appropriate.

Embodiment 4

In this embodiment, the structure of a transistor which can be used for the semiconductor device of one embodiment of the present invention will be described with reference to FIGS. 15A to 15D.

<Structure Example of Semiconductor Device>

Figure 15A:
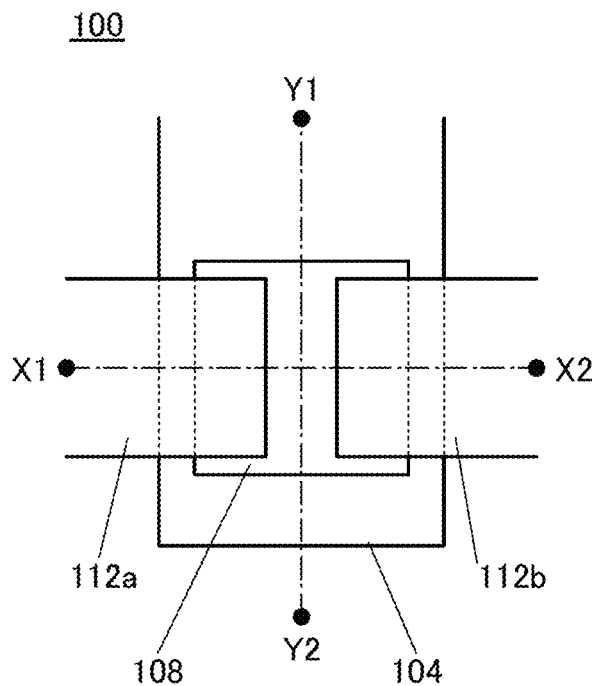
FIGS. 15A to 15D illustrate the structure of a transistor of one embodiment of the present invention.

FIG. 15A is a top view of the transistor 100. FIG. 15C is a cross-sectional view taken along the section line X1-X2 in FIG. 15A, and FIG. 15D is a cross-sectional view taken along the section line Y1-Y2 in FIG. 15A. Note that in FIG.

15A, some components of the transistor 100 (e.g., an insulating film serving as a gate insulating film) are not illustrated to avoid complexity. In some cases, the direction of the section line X1-X2 is referred to as a channel length direction and the direction of the section line Y1-Y2 is referred to as a channel width direction. As in FIG. 15A, some components might not be illustrated in some top views of transistors described below.

Note that the transistor 100 can be used in the semiconductor device described in Embodiment 1.

For example, when the transistor 100 is used as the transistor M, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the insulating film 501C, the conductive film 504, the insulating film 506, the semiconductor film 508, the conductive film 512A, the conductive film 512B, the insulating film 516, and the insulating film 518, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108. Over the transistor 100, specifically, over the conductive films 112a and 112b and the oxide semiconductor film 108, the insulating films 114, 116, and 118 are provided. The insulating films 114, 116, and 118 function as protective insulating films for the transistor 100.

The oxide semiconductor film 108 includes an oxide semiconductor film 108a on the conductive film 104 side and an oxide semiconductor film 108b over the oxide semiconductor film 108a. The conductive film 104 serves as a gate electrode. Furthermore, the insulating films 106 and 107 function as gate insulating films of the transistor 100.

An In-M oxide (M is Ti, Ga, Sn, Y, Zr, La, Ce, Nd, or Hf) or an In-M-Zn oxide can be used for the oxide semiconductor film 108. It is particularly preferable to use an In-M-Zn oxide for the oxide semiconductor film 108.

The oxide semiconductor film 108a includes a first region in which the atomic proportion of In is larger than the atomic proportion of M. The oxide semiconductor film 108b includes a second region in which the atomic proportion of In is smaller than that in the oxide semiconductor film 108a. The second region includes a portion thinner than the first region.

The oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108a including the first region in which the atomic proportion of In is larger than that of M makes it easier to change electrical characteristics of the transistor 100 in light irradiation. However, in the semiconductor device of one embodiment of the present invention, the oxide semiconductor film 108b is formed over the oxide semiconductor film 108a. In addition, the thickness of the portion including the channel region and the vicinity of the channel region in the oxide semiconductor film 108b is smaller than the thickness of the oxide semiconductor film 108a.

Furthermore, the oxide semiconductor film 108b includes the second region in which the atomic proportion of In is smaller than that in the oxide semiconductor film 108a and thus has larger Eg than the oxide semiconductor film 108a. For this reason, the oxide semiconductor film 108 which is a layered structure of the oxide semiconductor film 108a and the oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 15B.

Figure 15B:
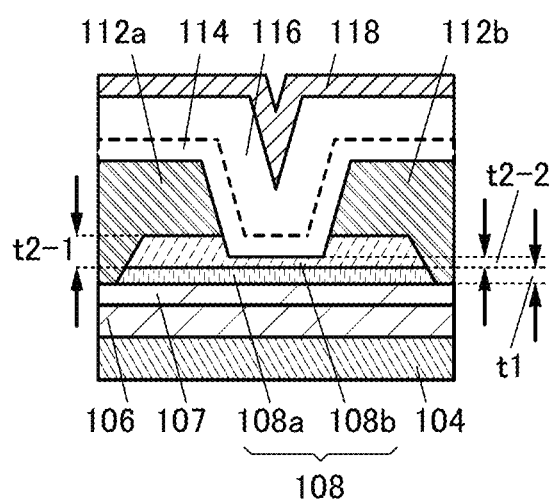
Figure 15C:
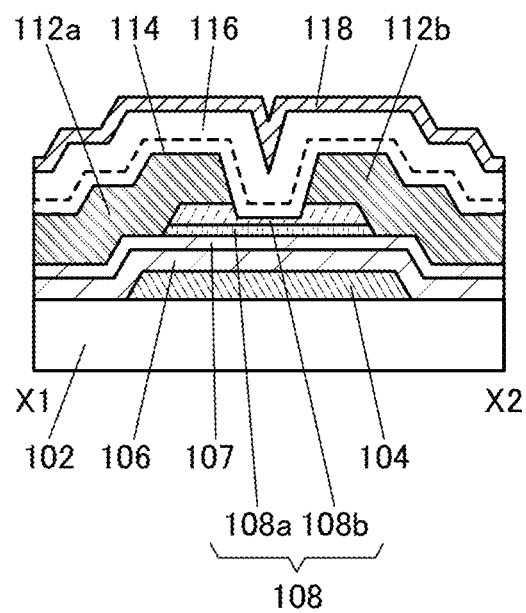
Figure 15D:
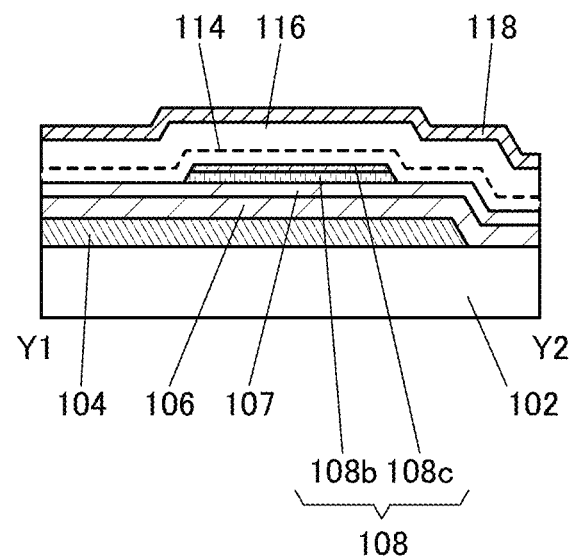

FIG. 15B is a cross-sectional enlarged view of the oxide semiconductor film 108 and the vicinity thereof in the transistor 100 illustrated in FIG. 15C.

In FIG. 15B, t1, t2-1, and t2-2 denote a thickness of the oxide semiconductor film 108a, one thickness of the oxide semiconductor film 108b, and the other thickness of the oxide semiconductor film 108b, respectively. The oxide semiconductor film 108b over the oxide semiconductor film 108a prevents the oxide semiconductor film 108a from being exposed to an etching gas, an etchant, or the like when the conductive films 112a and 112b are formed. This is why the oxide semiconductor film 108a is not or is hardly reduced in thickness. In contrast, in the oxide semiconductor film 108b, a portion not overlapping with the conductive films 112a and 112b is etched by formation of the conductive films 112a and 112b, so that a depression is formed in the etched region. In other words, a thickness of the oxide semiconductor film 108b in a region overlapping with the conductive films 112a and 112b is t2-1, and a thickness of the oxide semiconductor film 108b in a region not overlapping with the conductive films 112a and 112b is t2-2.

As for the relationships between the thicknesses of the oxide semiconductor film 108a and the oxide semiconductor film 108b, t2-1>t1>t2-2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108, particularly oxygen vacancy in the oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108, particularly in the oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the oxide semiconductor film 108a, the thickness of the portion including the channel region and the vicinity of the channel region in the oxide semiconductor film 108b is preferably small, and t2-2<t1 is preferably satisfied. For example, the thickness of the portion including the channel region and the vicinity of the channel region in the oxide semiconductor film 108b is preferably more than or equal to 1 nm and less than or equal to 20 nm, more preferably more than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used as the substrate 102. Alternatively, any of these substrates provided with a semiconductor element may be used as the substrate 102. In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode and Source and Drain Electrodes>>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The oxide semiconductor film 108a can be formed using the sputtering target having an atomic ratio of In:M:Zn=2:1:3, In:M:Zn=3:1:2, or In:M:Zn=4:2:4.1. The oxide semiconductor film 108b can be formed using the sputtering target having an atomic ratio of In:M:Zn=1:1:1 or In:M:Zn=1:1:1.2. Note that the atomic ratio of metal elements in a sputtering target used for forming the oxide semiconductor film 108b does not necessarily satisfy In≥M and Zn≥M and may satisfy In≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108a, and an oxide semiconductor film having an energy gap more than or equal to 2.5 eV and less than or equal to 3.5 eV is preferably used as the oxide semiconductor film 108b. Furthermore, the oxide semiconductor film 108b preferably has a higher energy gap than that of the oxide semiconductor film 108a.

Each thickness of the oxide semiconductor film 108a and the oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm. Note that the above-described thickness relationships between them are preferably satisfied.

An oxide semiconductor film with low carrier density is used as the oxide semiconductor film 108b. For example, the carrier density of the oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108a and the oxide semiconductor film 108b be set to be appropriate.

Note that it is preferable to use, as the oxide semiconductor film 108a and the oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108a preferably includes a region having lower hydrogen concentration than the oxide semiconductor film 108b. When the oxide semiconductor film 108a includes the region having lower hydrogen concentration than the oxide semiconductor film 108b, the semiconductor device can be highly reliable.

When silicon or carbon that is one of elements belonging to Group 14 is included in the oxide semiconductor film 108a, oxygen vacancy is increased in the oxide semiconductor film 108a, and the oxide semiconductor film 108a becomes an n-type film. Thus, the concentration of silicon or carbon (the concentration is measured by SIMS) in the oxide semiconductor film 108a or the concentration of silicon or carbon (the concentration is measured by SIMS) in the vicinity of an interface with the oxide semiconductor film 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108a.

Furthermore, when including nitrogen, the oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

Each of the oxide semiconductor films 108a and 108b may have a non-single-crystal structure, for example. The non-single crystal structure includes a c-axis aligned a-b plane anchored crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film which can transmit oxygen. The insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas.

Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 5

In this embodiment, structures of a transistor that can be used in the semiconductor device of one embodiment of the present invention will be described with reference to FIGS. 16A to 16C.

<Structure Example of Semiconductor Device>

Figure 16A:
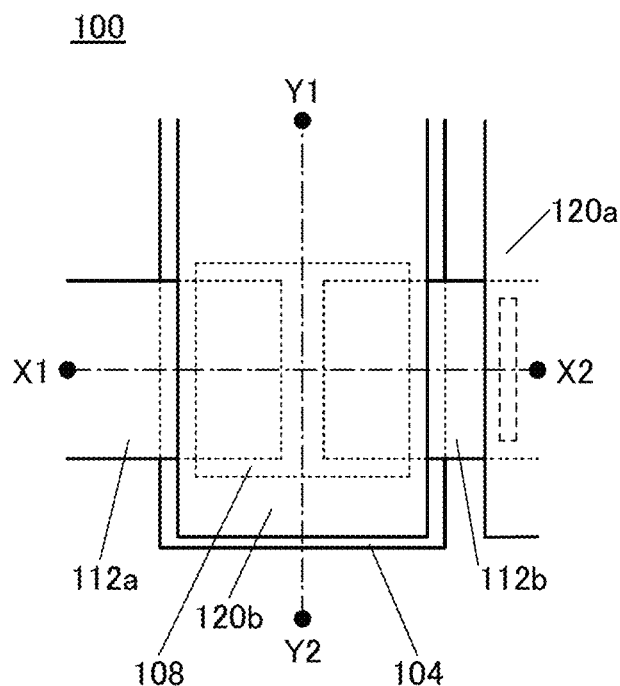
FIGS. 16A to 16C illustrate the structure of a transistor of one embodiment of the present invention.
Figure 16B:
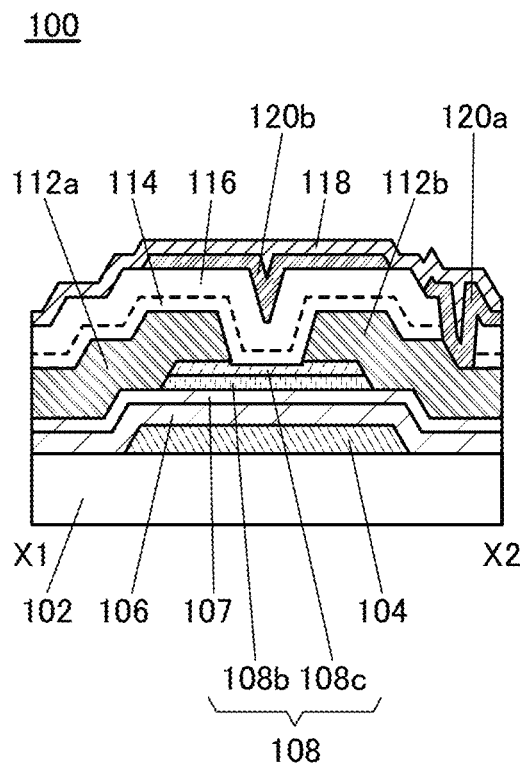
Figure 16C:
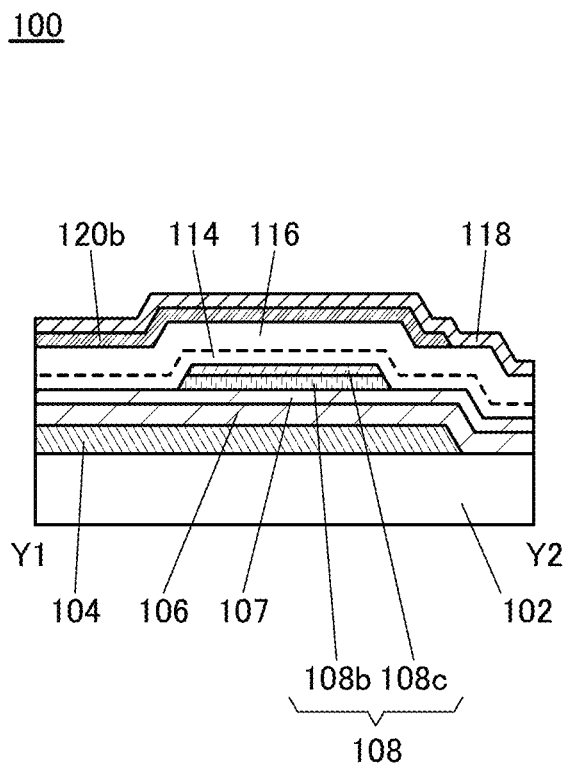

FIG. 16A is a top view of the transistor 100. FIG. 16B is a cross-sectional view taken along the section line X1-X2 in FIG. 16A, and FIG. 16C is a cross-sectional view taken along the section line Y1-Y2 in FIG. 16A. Note that in FIG. 16A, some components of the transistor 100 (e.g., an insulating film serving as a gate insulating film) are not illustrated to avoid complexity. Furthermore, the direction of the section line X1-X2 may be called a channel length direction, and the direction of the section line Y1-Y2 may be called a channel width direction. As in FIG. 16A, some components are not illustrated in some cases in top views of transistors described below.

The transistor 100 can be used for the semiconductor device described in Embodiment 1.

For example, when the transistor 100 is used as the transistor MD, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the insulating film 501C, the conductive film 504, the insulating film 506, the semiconductor film 508, the conductive film 512A, the conductive film 512B, the insulating film 516, the insulating film 518, and the conductive film 524, respectively.

The transistor 100 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100. In this specification and the like, the insulating films 106 and 107 are collectively referred to as a first insulating film, the insulating films 114 and 116 are collectively referred to as a second insulating film, and the insulating film 118 is referred to as a third insulating film in some cases.

The conductive film 120b can be used as a second gate electrode of the transistor 100.

In the case where the transistor 100 is used in a pixel portion of the semiconductor device, the conductive film 120a can be used as an electrode of a display element, or the like.

The oxide semiconductor film 108 includes the oxide semiconductor film 108b (on the conductive film 104 side) that functions as a first gate electrode, and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or μFE) of the transistor 100. Specifically, the field-effect mobility of the transistor 100 can exceed 10 cm²/Vs, preferably exceed 30 cm²/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 which is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the conductive films 120a and 120b become conductors. The conductive films 120a and 120b having become conductors can each be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of the Semiconductor Device>

Components of the semiconductor device of this embodiment will be described below in detail.

As materials described below, materials described in Embodiment 4 can be used.

The material that can be used for the substrate 102 described in Embodiment 4 can be used for the substrate 102 in this embodiment. Furthermore, the materials that can be used for the insulating films 106 and 107 described in Embodiment 4 can be used for the insulating films 106 and 107 in this embodiment.

In addition, the materials that can be used for the conductive films functioning as the gate electrode, the source electrode, and the drain electrode described in Embodiment 4 can be used for the conductive films functioning as the first gate electrode, the source electrode, and the drain electrode in this embodiment.

<<Oxide Semiconductor Film>>

The oxide semiconductor film 108 can be formed using the materials described above.

In the case where the oxide semiconductor film 108b includes In-M-Zn oxide, it is preferable that the atomic ratio of metal elements of a sputtering target used for forming the In-M-Zn oxide satisfy In>M. The atomic ratio between metal elements in such a sputtering target is, for example, In:M:Zn=2:1:3, In:M:Zn=3:1:2, or In:M:Zn=4:2:4.1.

In the case where the oxide semiconductor film 108c is In-M-Zn oxide, it is preferable that the atomic ratio of metal elements of a sputtering target used for forming a film of the In-M-Zn oxide satisfy In The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6.

In the case where the oxide semiconductor films 108b and 108c are formed of In-M-Zn oxide, it is preferable to use a target including polycrystalline In-M-Zn oxide as the sputtering target. The use of the target including polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and further preferably lower than or equal to $1 \times 10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy is increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the oxide semiconductor film 108b, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

The oxide semiconductor film 108b and the oxide semiconductor film 108c may have a non-single-crystal structure, for example. The non-single crystal structure includes CAAC-OS, a polycrystalline structure, a microcrystalline structure, or an amorphous structure, for example.

Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

For example, the insulating films 114 and 116 described in Embodiment 4 can be used as the insulating films 114 and 116 in this embodiment.

<<Oxide Semiconductor Film Functioning as Conductive Film and Oxide Semiconductor Film Functioning as Second Gate Electrode>>

The material of the oxide semiconductor film 108 described above can be used for the conductive film 120a and the conductive film 120b functioning as the second gate electrode.

That is, the conductive film 120a functioning as a conductive film and the conductive film 120b functioning as a second gate electrode contain a metal element which is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a functioning as a conductive film and the conductive film 120b functioning as a second gate electrode are each In-M-Zn oxide, the atomic ratio of metal elements in a sputtering target used for forming the In-M-Zn oxide preferably satisfies In≥M. The atomic ratio of metal elements in such a sputtering target is In:M:Zn=2:1:3, In:M:Zn=3:1:2, In:M:Zn=4:2:4.1, or the like.

The conductive film 120a functioning as a conductive film and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a functioning as a conductive film and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include an MOCVD method and an ALD method. Specifically, the methods described in Embodiment 4 can be used.

This embodiment can be combined with any of the other embodiments in this specification as appropriate.

Embodiment 6

In this embodiment, a structure of an input/output device which is one embodiment of the present invention will be described with reference to FIG. 17.

Figure 17:
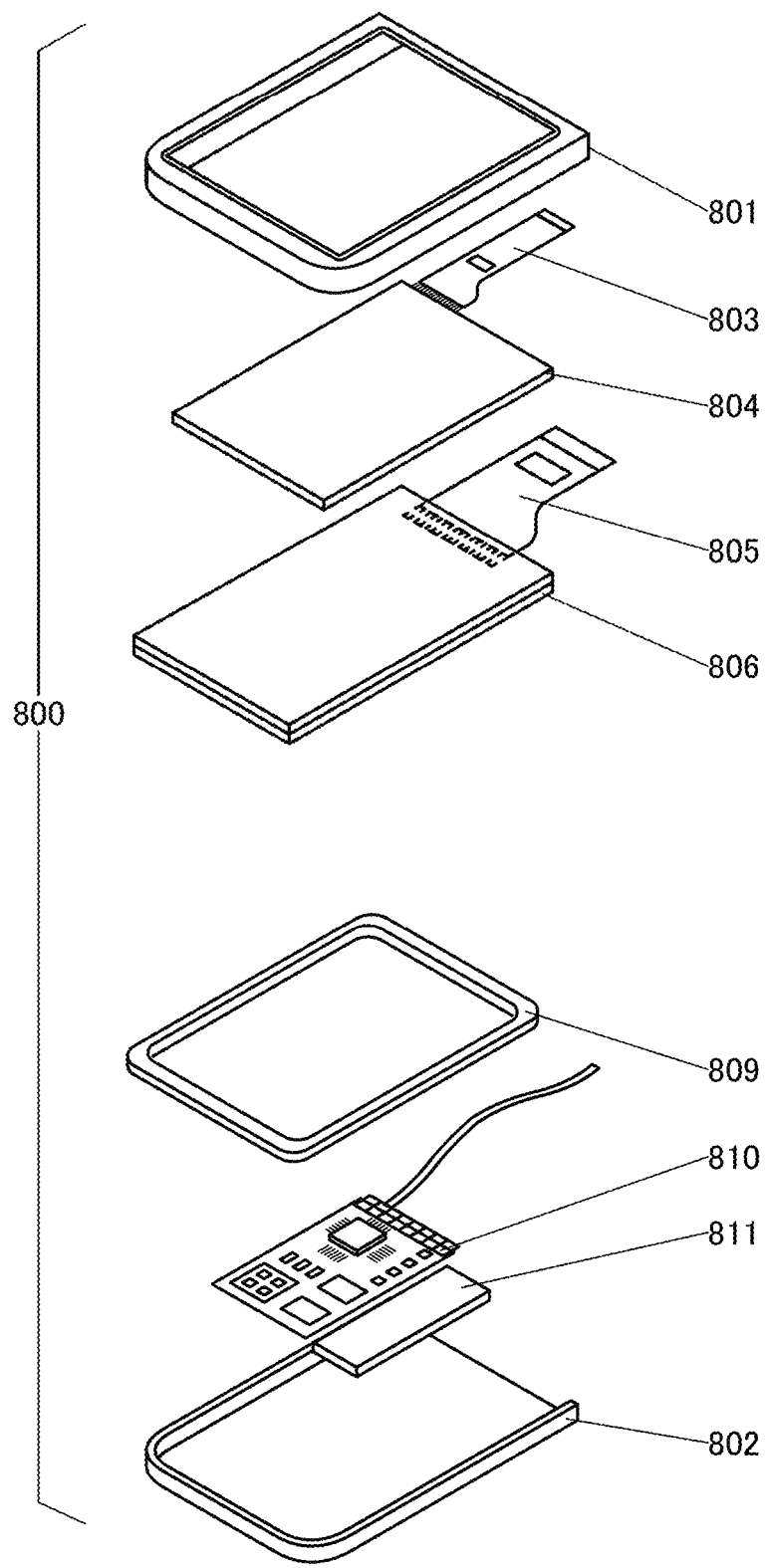
FIG. 17 illustrates the structure of an input/output device according to one embodiment of the present invention.

FIG. 17 is an exploded view of a structure of an input/output device 800.

The input/output device 800 includes a display panel 806 and a touch sensor 804 having a region overlapping with the display panel 806. Note that the input/output device 800 can be referred to as a touch panel.

The input/output device 800 is provided with a driver circuit 810 for driving the touch sensor 804 and the display panel 806, a battery 811 for supplying power to the driver circuit 810, and a housing where the touch sensor 804, the display panel 806, the driver circuit 810, and the battery 811 are stored.

<<Touch Sensor 804>>

The touch sensor 804 includes a region overlapping with the display panel 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display panel 806.

<<Display Panel 806>>

For example, the semiconductor device described in Embodiment 1 can be used as the display panel 806. Note that an FPC 805 is electrically connected to the display panel 806.

<<Driver Circuit 810>>

As the driver circuit 810, a power supply circuit or a signal processing circuit can be used, for example. Power supplied to the battery or an external commercial power supply can be utilized.

The signal processing circuit has a function of outputting a video signal, a clock signal, and the like.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display panel 806, a function of blocking electromagnetic waves generated by the operation of the driver circuit 810, or a function of a radiator plate.

Metal, a resin, an elastomer, or the like can be used for the upper cover 801, the lower cover 802, or the frame 809.

<<Battery 811>>

The battery 811 has a function of supplying power.

Note that a member such as a polarizing plate, a retardation plate, or a prism sheet can be used for the input/output device 800.

This embodiment can be combined with any of the other embodiments in this specification as appropriate.

Embodiment 7

In this embodiment, the structure of an information processing device of one embodiment of the present invention will be described with reference to FIGS. 18A and 18B and FIGS. 19A and 19B.

Figure 18A:
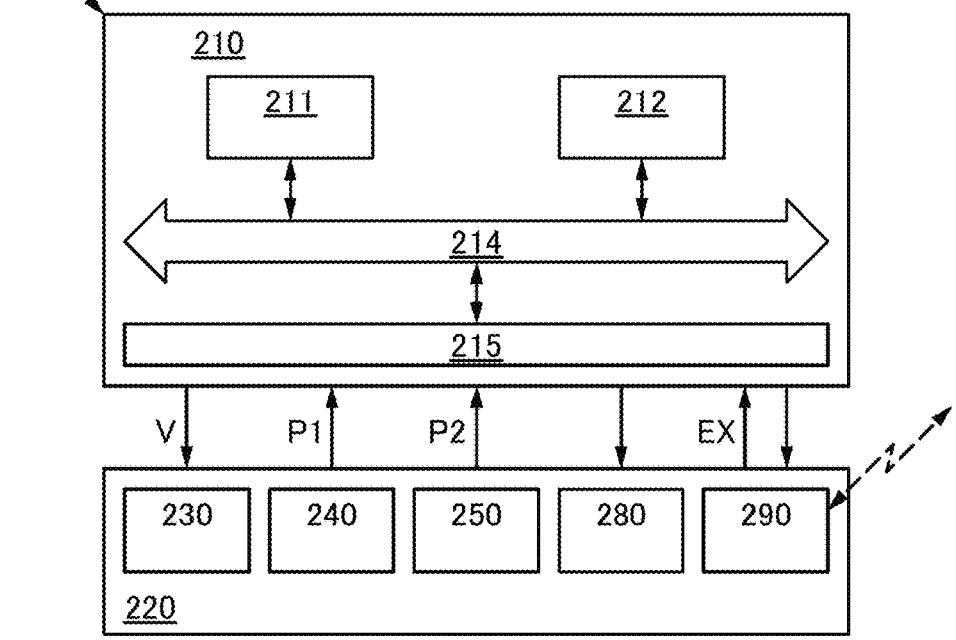
FIG. 18A is a block diagram and FIG. 18B is a projection view each illustrating the structure of an information processing device according to one embodiment of the present invention.
Figure 18B:
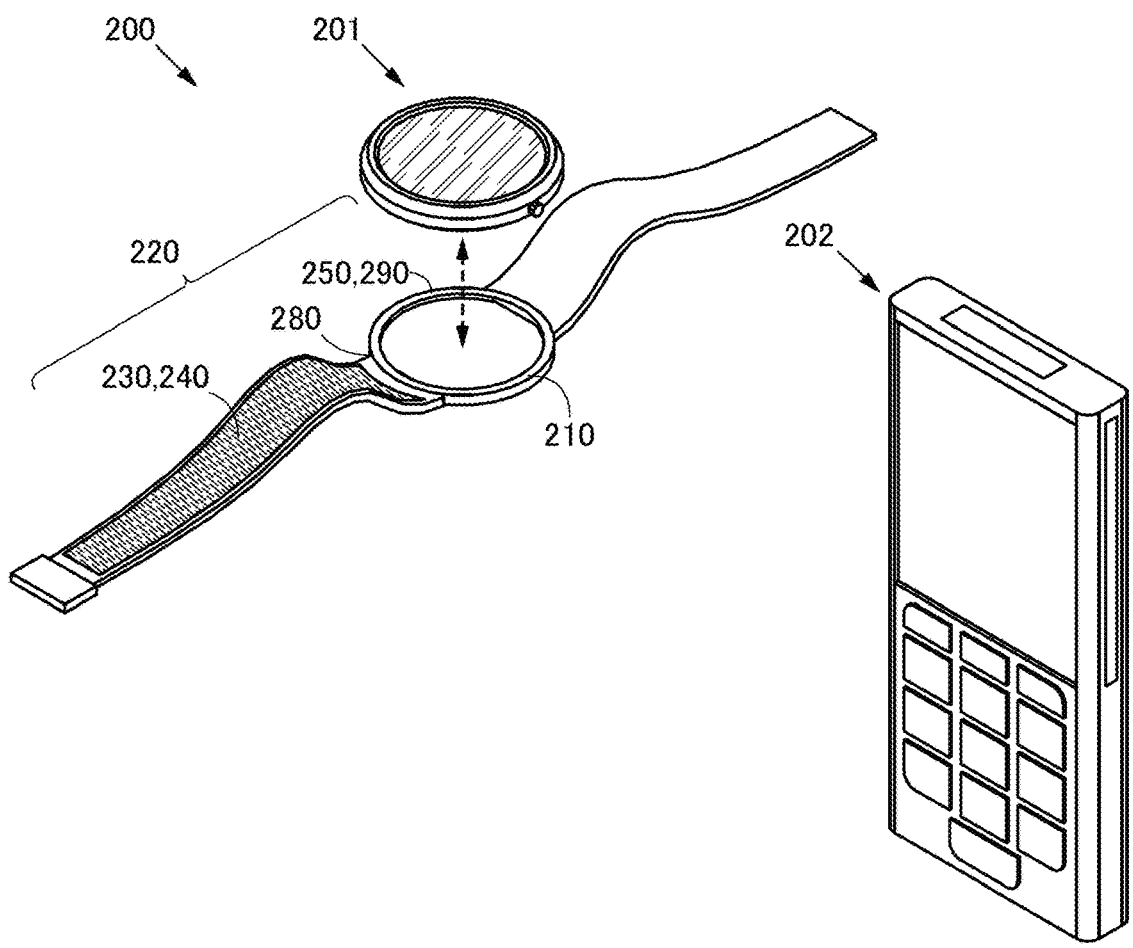

FIG. 18A is a block diagram illustrating the structure of an information processing device 200. FIG. 18B is a projection view illustrating an example of an external view of the information processing device 200 and a clock 201 and a communication device 202 which can be used with the information processing device 200.

Figure 19A:
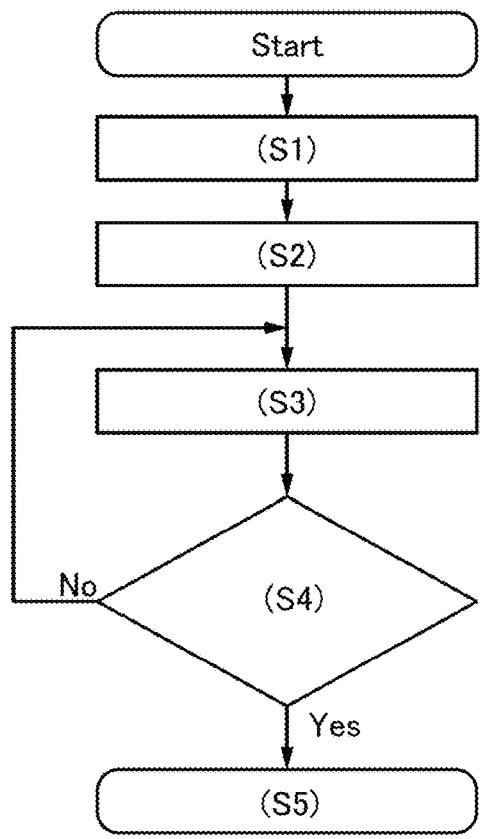
FIGS. 19A and 19B are flow charts showing a program according to one embodiment of the present invention.
Figure 19B:
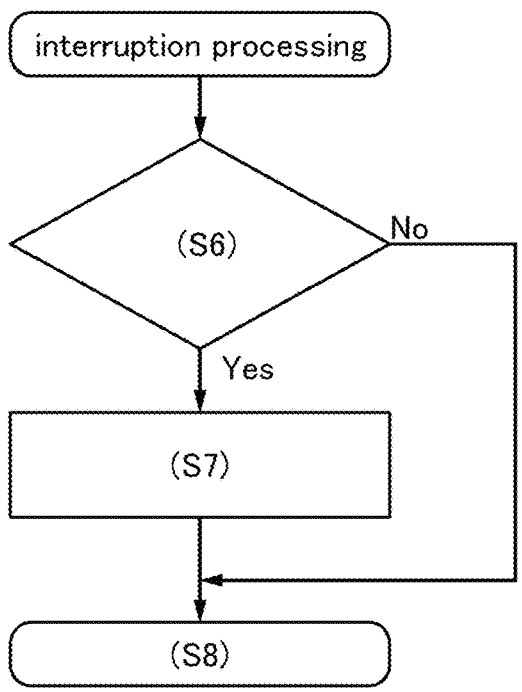

FIG. 19A is a flow chart showing main processing of a program of one embodiment of the present invention, and FIG. 19B is a flow chart showing interruption processing.

<Structure Example of Information Processing Device>

The information processing device 200 described in this embodiment includes an arithmetic device 210 and an input/output device 220 (see FIG. 18A).

The arithmetic device 210 is configured to receive positional information P1 and external information EX and supply image information V and control information. In this specification, text information is included in the image information V.

The input/output device 220 is configured to supply the positional information P1 and the external information EX and receive the image information V and the control information.

The arithmetic device 210 is configured to generate the image information V in accordance with the external information EX and to determine and supply the control information in accordance with the positional information P1.

The input/output device 220 includes a display portion 230 which is configured to display the image information V, an input portion 240 which is configured to supply the positional information P1, and a communication portion 290 which is configured to receive the external information EX and to send the control information.

The display portion 230 includes, for example, the display panel described in Embodiment 1.

Thus, for example, image information is generated in accordance with external information received from an external device and image information can be displayed on the display portion. Furthermore, control information is determined in accordance with the positional information supplied using the input portion and can be sent. Thus, the novel information processing device can be highly convenient or reliable.

<Structure>

The information processing device of one embodiment of the present invention includes the arithmetic device 210, the input/output device 220, and a housing (see FIG. 18A).

<<Arithmetic Device 210>>

The arithmetic device 210 includes an arithmetic portion 211, a memory portion 212, a transmission path 214, or an input/output interface 215.

<<Input/Output Device 220>>

The input/output device 220 includes the display portion 230, the input portion 240, a sensor portion 250, a vibrator 280, or the communication portion 290.

<<Arithmetic Portion 211>>

The arithmetic portion 211 is configured to, for example, execute a program. For example, a CPU described in Embodiment 8 can be used. In that case, power consumption can be sufficiently reduced.

<<Memory Portion 212>>

The memory portion 212 is configured to, for example, store the program executed by the arithmetic portion 211, initial information, setting information, an image, or the like.

Specifically, a hard disk, a flash memory, a memory including a transistor including an oxide semiconductor, or the like can be used for the memory portion 212.

<<Input/Output Interface 215 and Transmission Path 214>>

The input/output interface 215 includes a terminal or a wiring and is configured to supply and receive information. For example, the input/output interface 215 can be electrically connected to the transmission path 214 and the input/output device 220.

The transmission path 214 includes a wiring and is configured to supply and receive information. For example, the transmission path 214 can be electrically connected to the input/output interface 215. In addition, the transmission path 214 can be electrically connected to the arithmetic portion 211 or the memory portion 212.

<<Display Portion 230>>

For example, a display panel can be used as the display portion 230. Specifically, the semiconductor device described in Embodiment 1 can be used.

<<Input Portion 240>>

A variety of human interfaces or the like can be used as the input portion 240 (see FIG. 18A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 250>>

The sensor portion 250 is configured to supply information P2 by sensing the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

<<Vibrator 280>>

The vibrator 280 includes, for example, a vibration generating device, and is configured to vibrate in accordance with the instruction from the arithmetic device 210. Thus, the user of the information processing device 200 can receive information with the vibration.

<<Communication Portion 290>>

The communication portion 290 is configured to supply and acquire information to/from a network or the like. Alternatively, the communication portion 290 is configured to supply and acquire information to/from another communication device or the like.

<<Housing>>

The information processing device 200 includes a housing that stores the arithmetic device 210 and part of the input/output device 220 and a housing that stores the display portion 230.

The housing that stores the arithmetic device 210 and the input/output device 220 includes a fitting portion, and the fitting portion fits the clock 201 and is configured to support the clock 201, for example.

The housing that stores the display portion 230 includes, for example, a sheath-shaped region that stores the display portion 230 and a light-transmitting region overlapping with the display portion 230. Thus, display of the display portion 230 can be visually recognized through the housing.

The housing that stores the display portion 230 serves as a belt or a band, and the information processing device 200 can be fixed by winding it around a wrist or the like.

Accordingly, the user of the information processing device 200 can check image information transmitted from the communication device 202 without taking the communication device or the like out. Furthermore, for example, by utilizing a region winding a wrist or the like that is larger than a dial face of the clock 201, more image information can be displayed. In addition, the user of the information processing device 200 can display image information on a position which is easily recognized by the user but hardly recognized by the others, such as the inside portion of the user's wrist.

<Clock 201>

The clock 201 is configured to display the time and includes a housing that fits the housing of the information processing device 200.

The clock 201 includes, for example, a fitting portion at the bottom or the side. Thus, the clock 201 and the information processing device 200 can be one device or separate devices.

In addition, the information processing device 200 can be used in combination of the clock 201 with a favorite design and the information processing device 200 by a user.

<Communication Device 202>

The communication device 202 is configured to send the external information EX, to receive the control information, and to be connected to a communication network. The communication device 202 is also configured to conduct a certain operation in accordance with the control information.

For example, data communication can be performed between the communication device 202 and the communication network. Specifically, communication of data including audio information and the like is possible.

For example, the communication device 202 can be operated with the information processing device 200. Furthermore, the information processing device 200 can be operated with the communication device 202.

<Program>

A program which can be used for one embodiment of the present invention is described with reference to FIGS. 19A and 19B.

The program of one embodiment of the present invention includes the following steps (see FIG. 19A).

<<First Step>>

In a first step, setting is initialized (see 51 in FIG. 19A).

For instance, predetermined image information and a first mode can be used for the initialization.

<<Second Step>>

In a second step, interrupt processing is allowed (see S2 in FIG. 19A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, the counter may be set at a value other than the initial value, and then the arithmetic device may return to the main processing. Thus, the interrupt processing is ready to be executed after the program is started up.

<<Third Step>>

In a third step, the arithmetic device is operated in a certain mode set in the first step or a certain mode selected in the interrupt processing (see S3 in FIG. 19A).

When the first mode is selected, the image information V is displayed on the display portion 230 in a predetermined period, for example.

When the second mode is selected, the operation of the display portion 230 is stopped, for example.

Thus, when a predetermined event is supplied, the image information V can be displayed on the display portion 230 in the predetermined period. Alternatively, when the predetermined event is not supplied, the operation of the display portion 230 can be stopped.

<<Fourth Step>>

In a fourth step, the next step is determined as follows: a fifth step is selected when a termination instruction has been supplied, whereas the third step is selected when the termination instruction has not been supplied (see S4 in FIG. 19A).

Note that in the interrupt processing, for example, the termination instruction can be supplied.

<<Fifth Step>>

In the fifth step, the program terminates (S5 in FIG. 19A).

<<Interrupt Processing>>

The interrupt processing includes sixth to eighth steps described below (see FIG. 19B).

<<Sixth Step>>

In the sixth step, the processing proceeds to the seventh step when a predetermined event has been supplied, whereas the processing proceeds to the eighth step when the predetermined event has not been supplied (see S6 in FIG. 19B).

For example, whether the predetermined event is supplied in a predetermined period or not can be a branch condition. Specifically, the predetermined period can be longer than 0 seconds and shorter than or equal to 5 seconds, preferably shorter than or equal to 1 second, further preferably shorter than or equal to 0.5 seconds, still further preferably shorter than or equal to 0.1 seconds.

For example, the predetermined event can include an event associated with the termination instruction.

<<Seventh Step>>

In the seventh step, the mode is changed (see S7 in FIG. 19B). Specifically, the mode is changed to the second mode when the first mode has been selected, or the mode is changed to the first mode when the second mode has been selected.

<<Eighth Step>>

In the eighth step, the interrupt processing terminates (see S8 in FIG. 19B).

<<Predetermined Event>>

For example, the following events can be used as the predetermined event: events such as a click and drag supplied using a button or the like of the input portion 240.

Alternatively, as the predetermined event, events such as tap, drag, and swipe can be used in accordance with the positional information P1 supplied using a finger or the like as a pointer from a touch panel or the like of the input portion 240.

Further alternatively, the information P2 that satisfies predetermined conditions, which is supplied from the sensor portion 250, can be used as the predetermined event.

The following instructions can be associated with the predetermined event, for example: "page-turning instruction" for switching displayed image information from one to another and "scroll instruction" for moving the display position of part of image information and displaying another part continuing from that part.

For example, the position of a slide bar pointed by a pointer, the swipe speed, or the drag speed can be used as arguments assigned to an instruction associated with the predetermined event.

Specifically, for example, a parameter that determines the page-turning speed can be used to execute the "page-turning instruction" and a parameter that determines the moving speed of the display position can be used to execute the "scroll instruction."

Image information may be generated based on the pulse or the like of the user of the information processing device, the usage ambience of the information processing device, or the like acquired by the sensor portion 250. For example, a background of image information in accordance with user's preference can be determined by acquiring the ambient brightness or the like. Thus, favorable environment can be provided for the user of the information processing device 200.

This embodiment can be combined with any of the other embodiments in this specification as appropriate.

Embodiment 8

In this embodiment, a semiconductor device (memory device) that can retain stored data even when not powered and that has an unlimited number of write cycles, and a CPU including the semiconductor device will be described. The CPU described in this embodiment can be used for the information processing device described in Embodiment 7, for example.

<Memory Device>

Figure 20A:
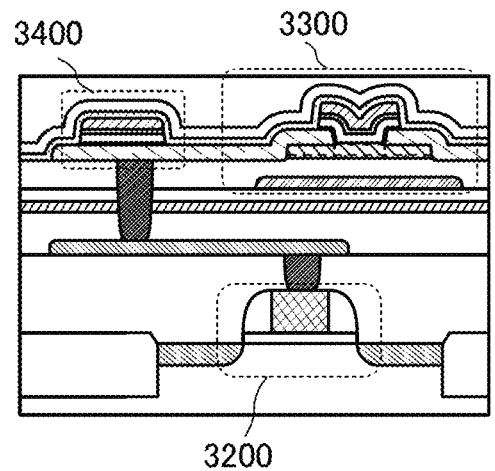
FIGS. 20A to 20C are a cross-sectional view and circuit diagrams illustrating the structures of semiconductor devices according to embodiments of the present invention.
Figure 20B:
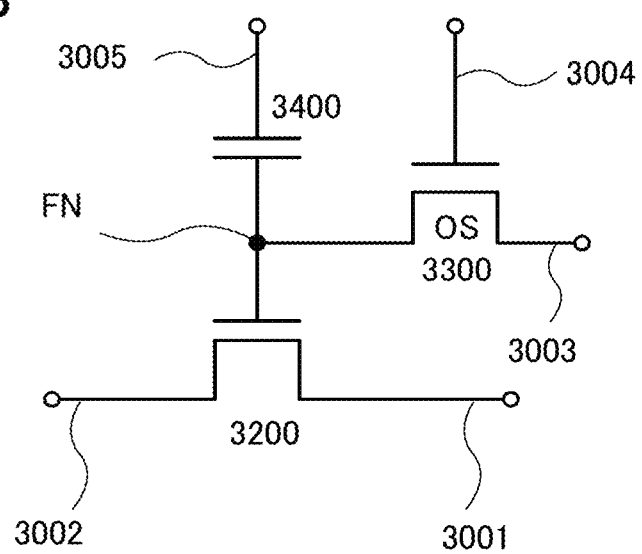
Figure 20C:
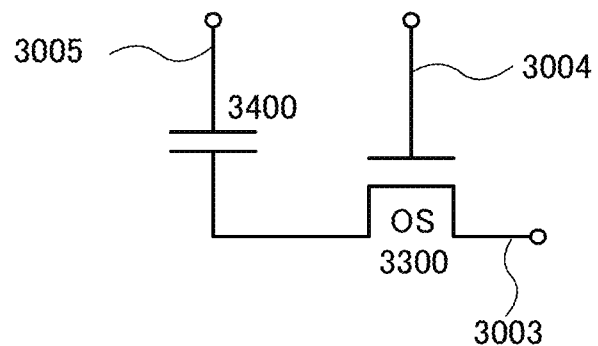

An example of a semiconductor device (memory device) which can retain stored data even when not powered and which has an unlimited number of write cycles is shown in FIGS. 20A to 20C. Note that FIG. 20B is a circuit diagram of the structure in FIG. 20A.

The semiconductor device illustrated in FIGS. 20A and 20B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 20B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 20A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off Thus, the data retained in the gate electrode of the transistor 3200 can be read by determining the potential of the second wiring 3002.

Note that in the case where memory cells are arrayed, it is necessary that data of a desired memory cell is read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 20C is different from the semiconductor device illustrated in FIG. 20A in that the transistor 3200 is not provided. Also in this case, writing and retaining operation of data can be performed in a manner similar to the semiconductor device illustrated in FIG. 20A.

Next, reading of data of the semiconductor device illustrated in FIG. 20C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B \pm C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), in addition to a central processing unit (CPU), and a radio frequency identification (RF-ID) tag, for example.

<CPU>

A CPU including the above memory device is described below.

Figure 21:
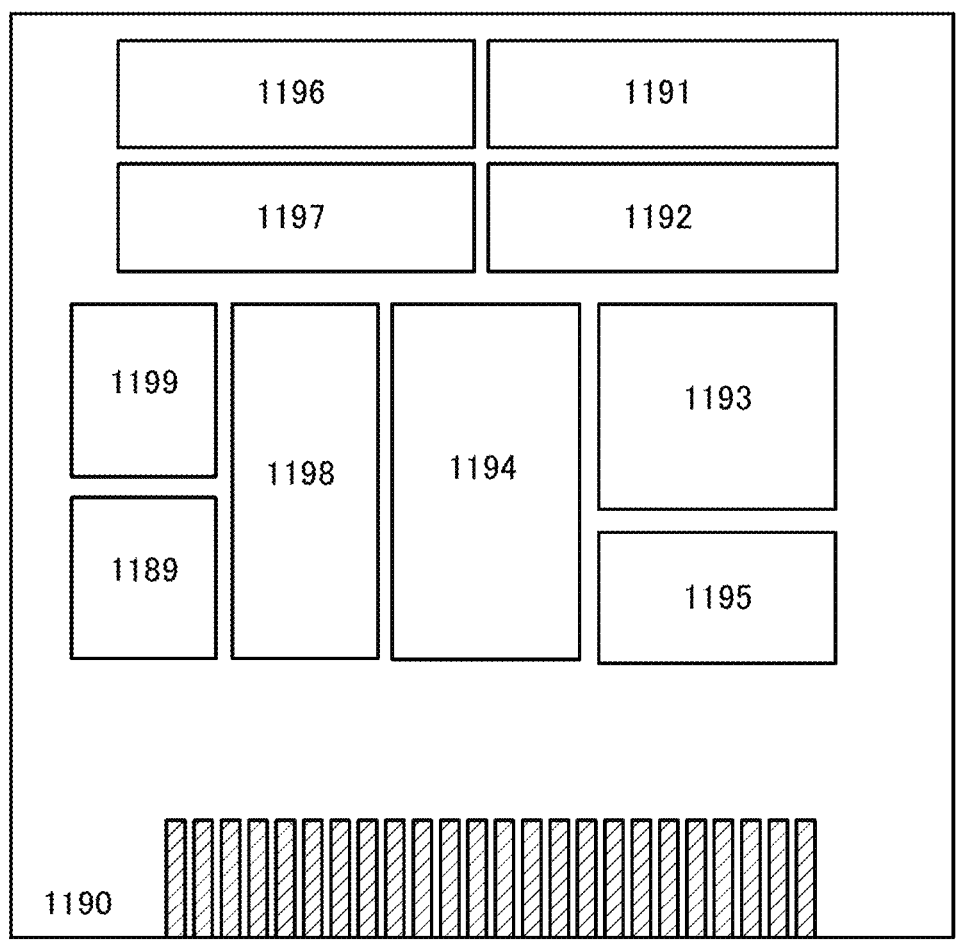
FIG. 21 is a block diagram illustrating the structure of a CPU according to one embodiment of the present invention.

FIG. 21 is a block diagram illustrating a configuration example of the CPU including the above memory device.

The CPU illustrated in FIG. 21 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 21 is just an example in which the configuration is simplified, and an actual CPU may have a variety of configurations depending on the application. For example, the CPU may have the following configuration: a structure including the CPU illustrated in FIG. 21 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 21, a memory cell is provided in the register 1196.

In the CPU illustrated in FIG. 21, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 22:
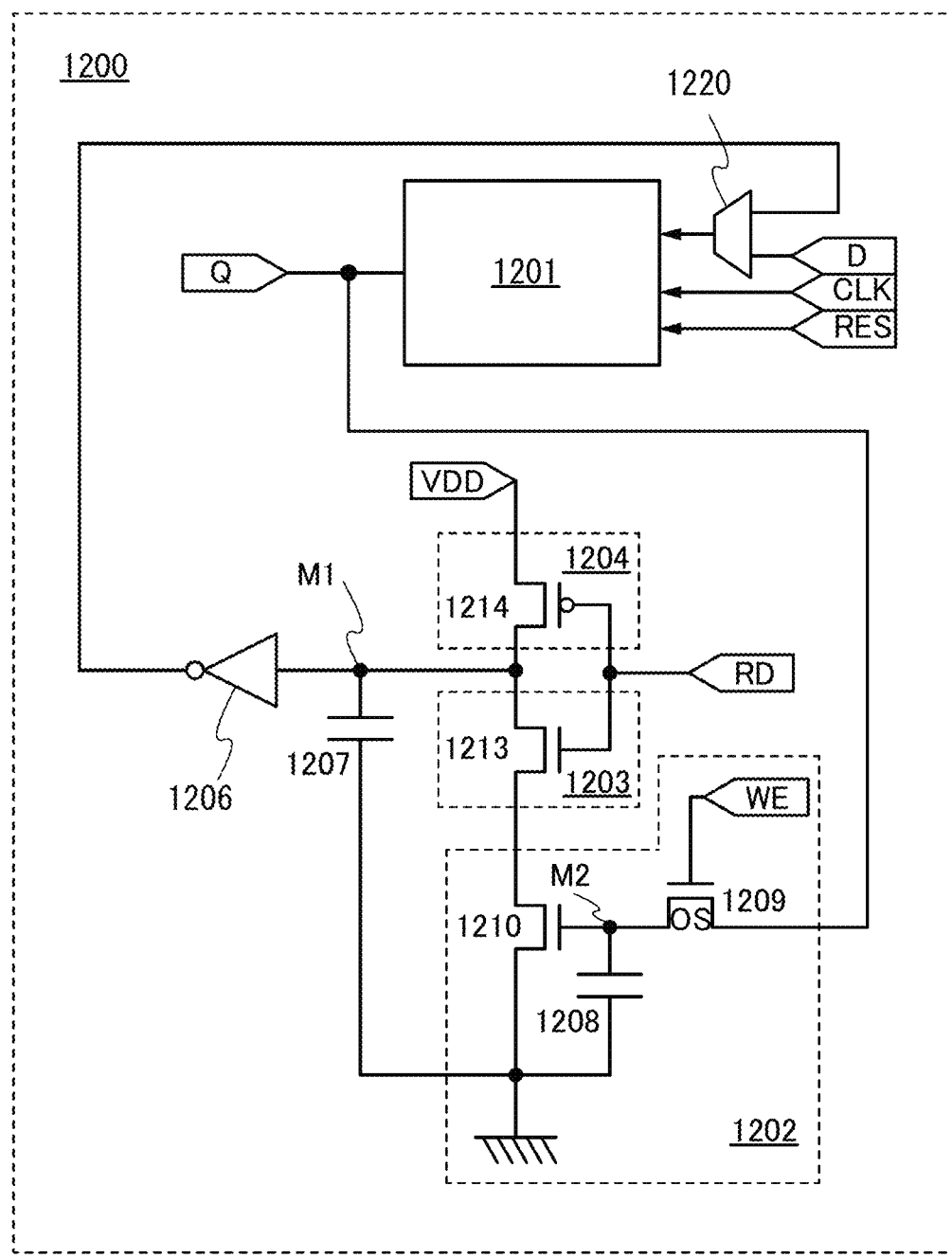
FIG. 22 is a circuit diagram illustrating the structure of a memory element according to one embodiment of the present invention.

FIG. 22 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 22 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 22, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 22, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or the substrate 1190 can be used for the rest of the transistors.

As the circuit 1201 in FIG. 22, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 9

In this embodiment, a display module and electronic devices which include a display panel of one embodiment of the present invention will be described with reference to FIGS. 23A to 23H.

FIGS. 23A to 23G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 23A:
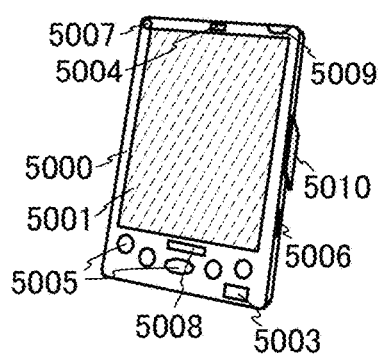
FIGS. 23A to 23H illustrate the structures of electronic devices according to embodiments of the present invention.
Figure 23B:
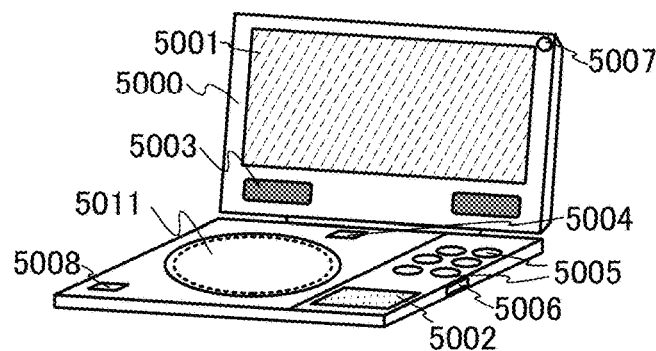
Figure 23C:
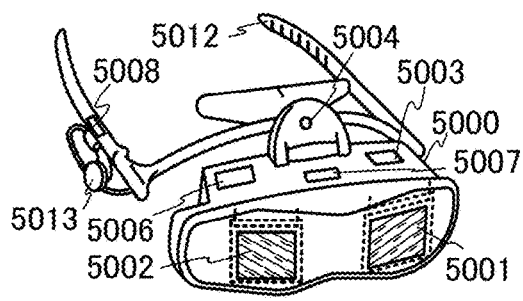
Figure 23D:
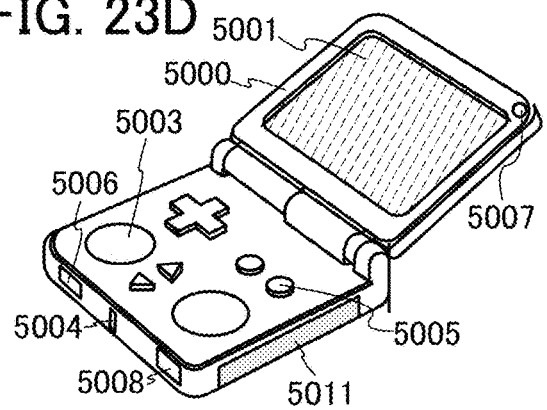
Figure 23E:
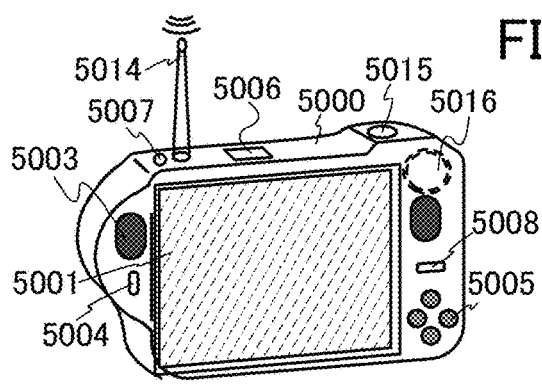
Figure 23F:
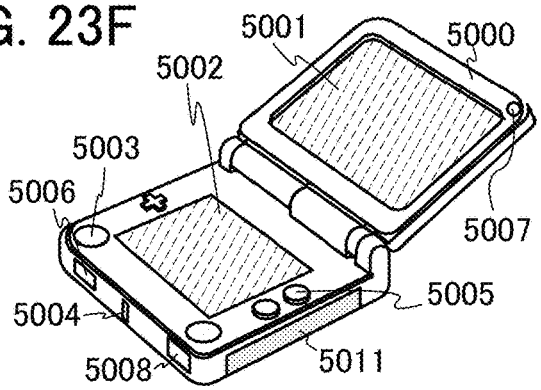
Figure 23G:
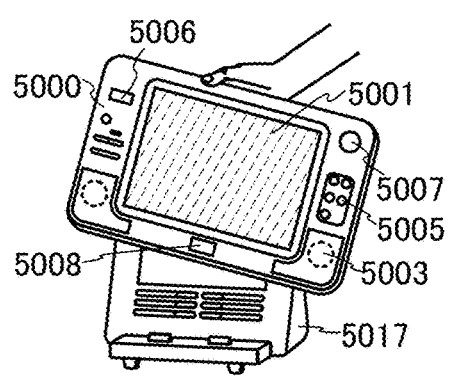

FIG. 23A illustrates a mobile computer which can include a switch 5009, an infrared port 5010, and the like in addition to the above components. FIG. 23B illustrates a portable image reproducing device (e.g., a DVD reproducing device) provided with a recording medium, and the portable image reproducing device can include a second display portion 5002, a recording medium reading portion 5011, and the like in addition to the above components. FIG. 23C illustrates a goggle-type display which can include the second display portion 5002, a support portion 5012, an earphone 5013, and the like in addition to the above components. FIG. 23D illustrates a portable game console which can include the recording medium reading portion 5011 and the like in addition to the above components. FIG. 23E illustrates a digital camera with a television reception function, and the digital camera can include an antenna 5014, a shutter button 5015, an image receiving portion 5016, and the like in addition to the above components. FIG. 23F illustrates a portable game console which can include the second display portion 5002, the recording medium reading portion 5011, and the like in addition to the above components. FIG. 23G illustrates a portable television receiver which can include a charger 5017 capable of transmitting and receiving signals, and the like in addition to the above components.

The electronic devices in FIGS. 23A to 23G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 23A to 23G are not limited thereto, and the electronic devices can have a variety of functions.

Figure 23H:
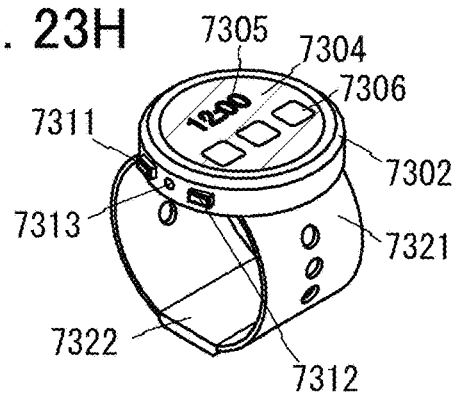

FIG. 23H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 23H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXPLANATION OF REFERENCE

ACF1: conductive material, ANO: wiring, BR(g, h): wiring, C1(g): first electrode, C2(h): second electrode, CL(g): control line, ML(h): signal line, S(j): signal line, VCOM: wiring, FPC1: flexible printed board, GD: driver circuit, SD: driver circuit, C: capacitor, M: transistor, MB: transistor, MD: transistor, MDB: transistor, SW1: switch, M1: node, M2: node, EX: external information, P1: positional information, P2: information, V: image information, V0: potential, V1: potential, VDD: power supply potential, 11: substrate, 12: separation film, 13a: terminal, 13b: insulating film, 13c: connection portion, 13d: circuit, 13e: insulating film, 30: bonding layer, 42: base, 91S: separation starting point, 100: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 118: insulating film, 120a: conductive film, 120b: conductive film, 150: transistor, 200: information processing device, 201: clock, 202: communication device, 210: arithmetic device, 211: arithmetic portion, 212: memory portion, 214: transmission path, 215: input/output interface, 220: input/output device, 230: display portion, 240: input portion, 250: sensor portion, 280: vibrator, 290: communication portion, 500: semiconductor device, 500B: semiconductor device, 500C: semiconductor device, 500D: semiconductor device, 500E: semiconductor device, 500F: semiconductor device, 501A: insulating film, 501B: insulating film, 501C: insulating film, 502: pixel, 504: conductive film, 505: bonding layer, 506: insulating film, 508: semiconductor film, 510: substrate, 510W: separation film, 511: wiring, 512A: conductive film, 512B: conductive film, 516: insulating film, 518: insulating film, 519D: terminal, 520: functional layer, 521A: insulating film, 521B: insulating film, 524: conductive film, 528: insulating film, 530: circuit, 550: display element, 550W: display element, 551: conductive film, 551W: conductive film, 552: conductive film, 552W: conductive film, 553: layer containing luminescent organic compound, 553W: layer containing luminescent organic compound, 560: base, 563: bonding layer, 565: resin layer, 570: base, 570A: insulating film, 570B: base, 570C: resin, 570P: functional film, 571: insulating film, 572: insulating film, 573: protective film, 573a: protective film, 573b: protective film, 573c: protective film, 574: insulating film, 575: proximity sensor, 576: opening, 591: connection portion, 592: connection portion, 800: input/output device, 801: upper cover, 802: lower cover, 803: FPC, 804: touch sensor, 805: FPC, 806: display panel, 809: frame, 810: driver circuit, 811: battery, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, and 7322: clasp.

This application is based on Japanese Patent Application serial no. 2015-146316 filed with Japan Patent Office on Jul. 24, 2015 and Japanese Patent Application serial no. 2016-012007 filed with Japan Patent Office on Jan. 26, 2016, the entire contents of which are hereby incorporated by reference.

The invention claimed is:

1. A method for manufacturing a display panel comprising:
a first step for forming a first insulating film over a substrate for use in manufacturing processes;
a second step for forming a terminal so that the terminal includes a region overlapping with the first insulating film;
a third step for forming a second insulating film comprising a first opening on the terminal;
a fourth step for forming a first connection portion on the first opening so that the first connection portion is electrically connected to the terminal;
a fifth step for forming a circuit on a part of the first connection portion and the second insulating film;
a sixth step for forming a third insulating film which is over the circuit and comprises a second opening;
a seventh step for forming a display element on the third insulating film so that the display element is electrically connected to the circuit;
an eighth step of forming a protective film on the first insulating film, the terminal, the second insulating film, the first connection portion, the circuit, the third insulating film, and the display element;
a ninth step for bonding a base comprising a flexible region to the circuit with a bonding layer;
a tenth step for separating the substrate from the first insulating film for use in manufacturing processes; and
an eleventh step for removing the first insulating film so that the terminal is exposed,
wherein the bonding layer bonds the second insulating film and the base,
wherein the bonding layer is positioned between the protective film and the base after the ninth step, and
wherein one side surface of the third insulating film is in contact with the protective film on an outer side than the circuit and in a vicinity of the terminal.

2. The method for manufacturing a display panel according to claim 1, wherein the first insulating film comprises silicon oxynitride.

3. The method for manufacturing a display panel according to claim 1, wherein the removal of the first insulating film in the eleventh step is conducted by etching or chemical mechanical polishing.

4. A method for manufacturing a display panel comprising:
a first step for forming a first insulating film over a substrate for use in manufacturing processes;
a second step for forming a terminal so that the terminal includes a region overlapping with the first insulating film;
a third step for forming a second insulating film comprising a first opening on the terminal;
a fourth step for forming a first connection portion on the first opening so that the first connection portion is electrically connected to the terminal;
a fifth step for forming a circuit on a part of the first connection portion and the second insulating film;
a sixth step for forming a third insulating film which is over the circuit and comprises a second opening;

a seventh step for forming a display element on the third insulating film so that the display element is electrically connected to the circuit;

an eighth step of forming a protective film on the first insulating film, the terminal, the second insulating film, the first connection portion, the circuit, the third insulating film, and the display element;

a ninth step for separating the substrate from the first insulating film for use in manufacturing processes; and a tenth step for removing the first insulating film so that the terminal is exposed, wherein one side surface of the third insulating film is in contact with the protective film on an outer side than the circuit and in a vicinity of the terminal.

5. The method for manufacturing a display panel according to claim 4, wherein the first insulating film comprises silicon oxynitride.

6. The method for manufacturing a display panel according to claim 4, wherein the removal of the first insulating film in the tenth step is conducted by etching or chemical mechanical polishing.

* * * * *